US012631667B2

(12) United States Patent
Witty et al.

(10) Patent No.: US 12,631,667 B2
(45) Date of Patent: May 19, 2026

(54) ELECTRICITY METER

(71) Applicant: Sensus Spectrum LLC, Morrisville, NC (US)

(72) Inventors: Andrew Witty, Caerphilly (GB); Joseph Adam, Cambridge (GB); Michael Cantor, Cambridge (GB); James Hawkesford, Easton (GB); Vincenzo Piazza, Exning (GB)

(73) Assignee: SENSUS SPECTRUM LLC, Morrisville, NC (US)

( * ) Notice: Subject to any disclaimer, the term of this patent is extended or adjusted under 35 U.S.C. 154(b) by 162 days.

(21) Appl. No.: 18/723,612

(22) PCT Filed: Dec. 20, 2022

(86) PCT No.: PCT/GB2022/053329
§ 371 (c)(1),
(2) Date: Jun. 24, 2024

(87) PCT Pub. No.: WO2023/118856
PCT Pub. Date: Jun. 29, 2023

(65) Prior Publication Data
US 2025/0067775 A1      Feb. 27, 2025

(30) Foreign Application Priority Data
Dec. 24, 2021      (GB) ...................................... 2119016

(51) Int. Cl.
*G01R 1/20*          (2006.01)
*G01R 19/00*         (2006.01)
*G01R 22/06*         (2006.01)
(52) U.S. Cl.
CPC ......... *G01R 1/203* (2013.01); *G01R 19/0092* (2013.01); *G01R 22/06* (2013.01)

(58) Field of Classification Search
CPC ..... G01R 1/203; G01R 19/0092; G01R 22/06
See application file for complete search history.

(56) References Cited

U.S. PATENT DOCUMENTS 11,313,885 B2 *    4/2022    Choi .................. G01R 31/3842
11,726,114 B2 *    8/2023    Gruendler .......... G01R 19/0092
                                                              324/426

(Continued)

FOREIGN PATENT DOCUMENTS

EP          3 527 995 A1      8/2019
GB          2 538 816 A      11/2016

(Continued)

OTHER PUBLICATIONS

International Search Report (ISR), International Application No. PCT/GB2022/053329, mailed Match 17, 2023, 3 pages.

(Continued)

*Primary Examiner* — Reena Aurora
(74) *Attorney, Agent, or Firm* — Francis J. Maguire; WARE FRESSOLA MAGUIRE & BARBER LLP

(57)          ABSTRACT

A DC electrical meter (62) includes or is connected to a current sensor (1). The current sensor includes a busbar connector (2) including a first part (3) connected to a third part (4) via a second part (5). The second part (5) includes a main body (6) integrally formed with first (7a) and second (7b) connecting members, each having a proximal end (8a, 8b) where it meets the main body (6) and a distal end (9a, 9b) electrically coupled to a respective conductive element (10a, 10b) supported on a substrate (11) and coupled to circuitry (12) configured to measure a voltage therebetween. When a first temperature difference ($\delta T_1$) exists between the respective proximal ends (8a, 8b) of the first (7a) and second (7b) connecting members, a second temperature difference (Continued)

($\delta T_2$) between the respective distal ends (9a, 9b) is less than or equal to 50% of the first temperature difference ($\delta T_1$).

20 Claims, 27 Drawing Sheets

(56)                    References Cited

U.S. PATENT DOCUMENTS

| | | | |
|---|---|---|---|
| 2011/0267038 A1 | 11/2011 | Homma et al. | |
| 2013/0328547 A1 | 12/2013 | Marten | |
| 2018/0172737 A1* | 6/2018 | Makinson | G01R 19/32 |
| 2021/0141020 A1 | 5/2021 | Hofer et al. | |
| 2022/0091167 A1 | 3/2022 | Dames et al. | |
| 2022/0334156 A1 | 10/2022 | Balboni et al. | |

FOREIGN PATENT DOCUMENTS

| | | | |
|---|---|---|---|
| WO | 2013/093714 A1 | 6/2013 | |
| WO | 2020/249490 A1 | 12/2020 | |

OTHER PUBLICATIONS

Written Opinion of the International Searching Authority (ISA/EP), International Application No. PCT/GB2022/053329, mailed Mar. 17, 2023, 5 pages.

\* cited by examiner

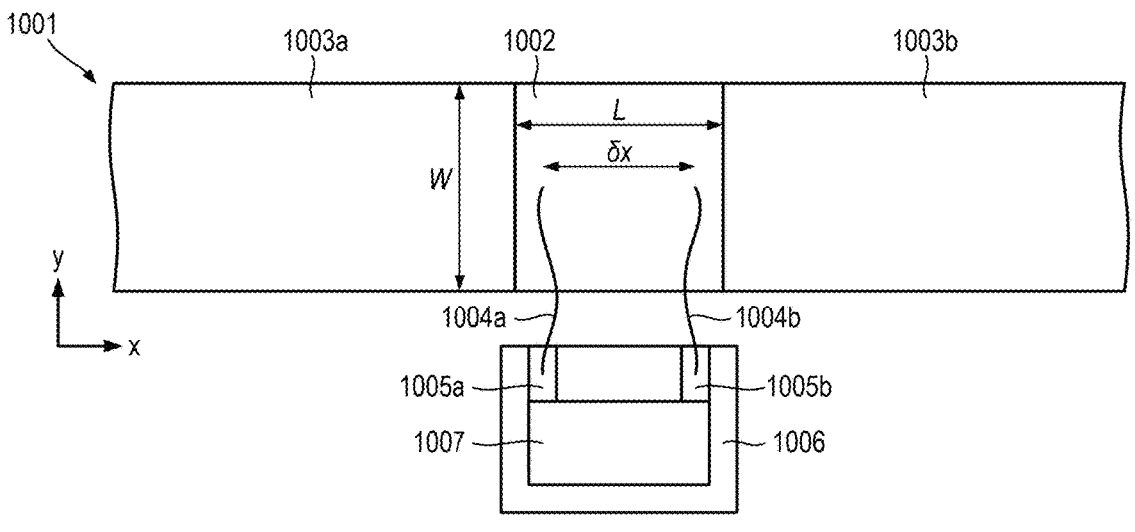
Fig. 1 (Prior Art)
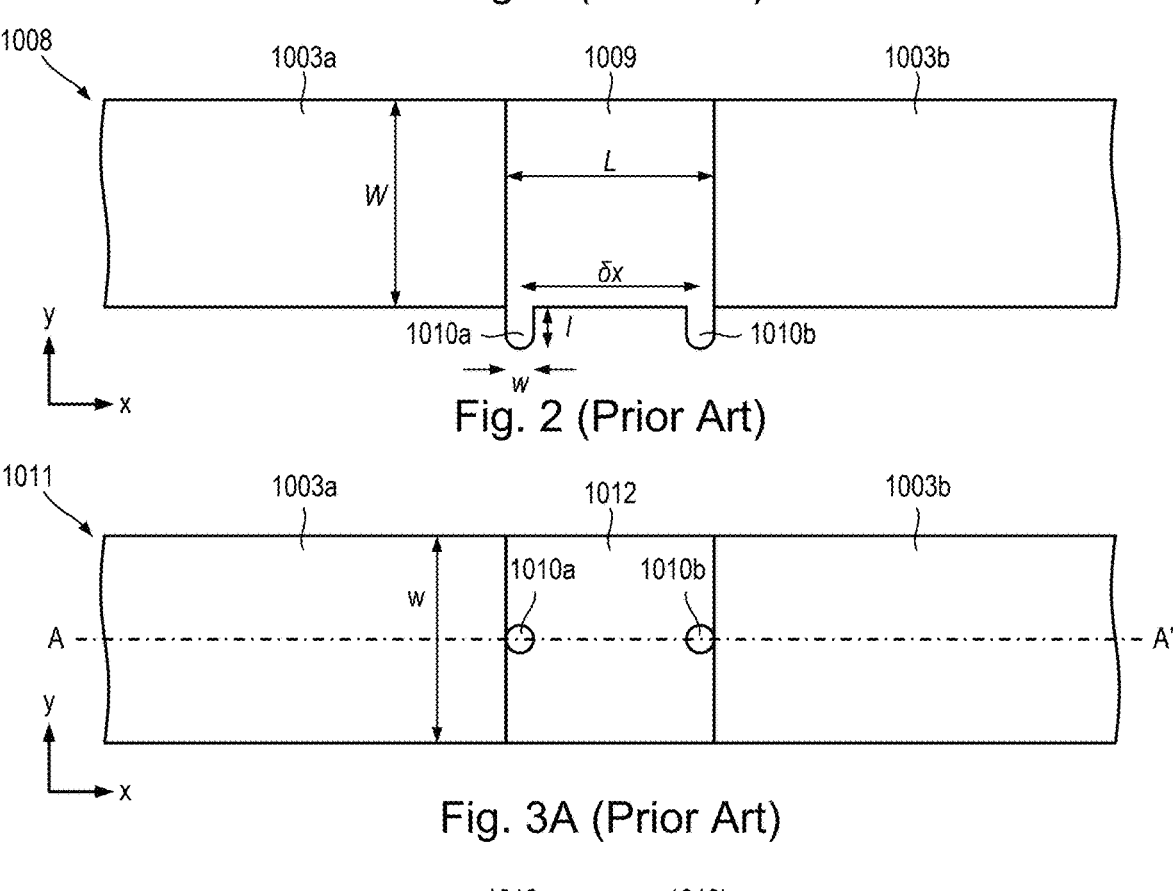
Fig. 2 (Prior Art)
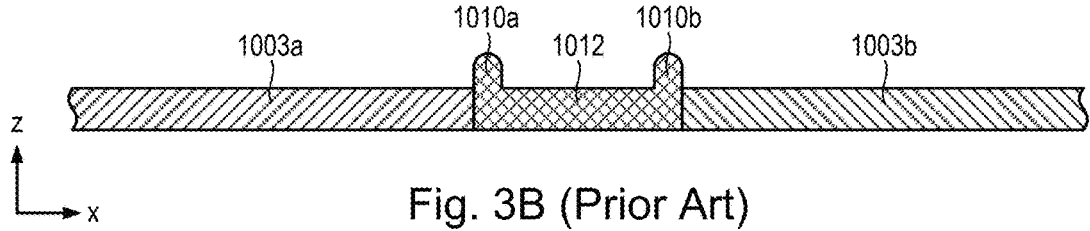
Fig. 3A (Prior Art)
Fig. 3B (Prior Art)

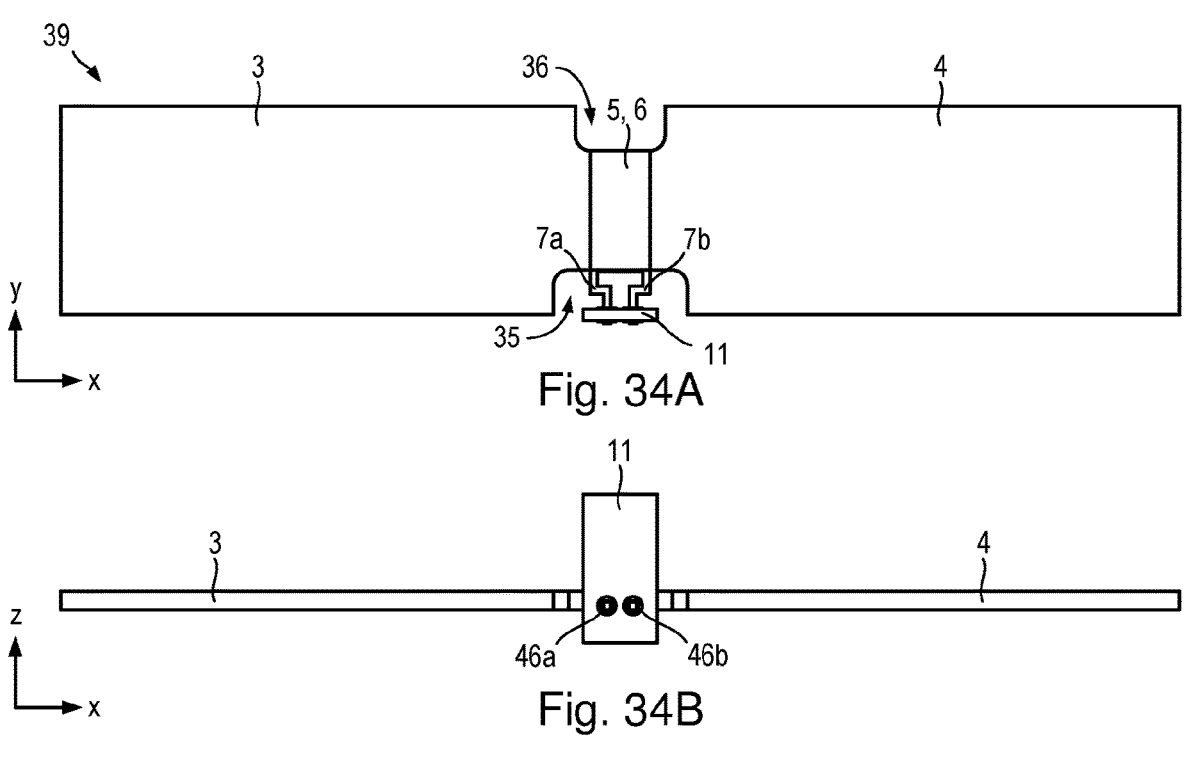
Fig. 34A
Fig. 34B
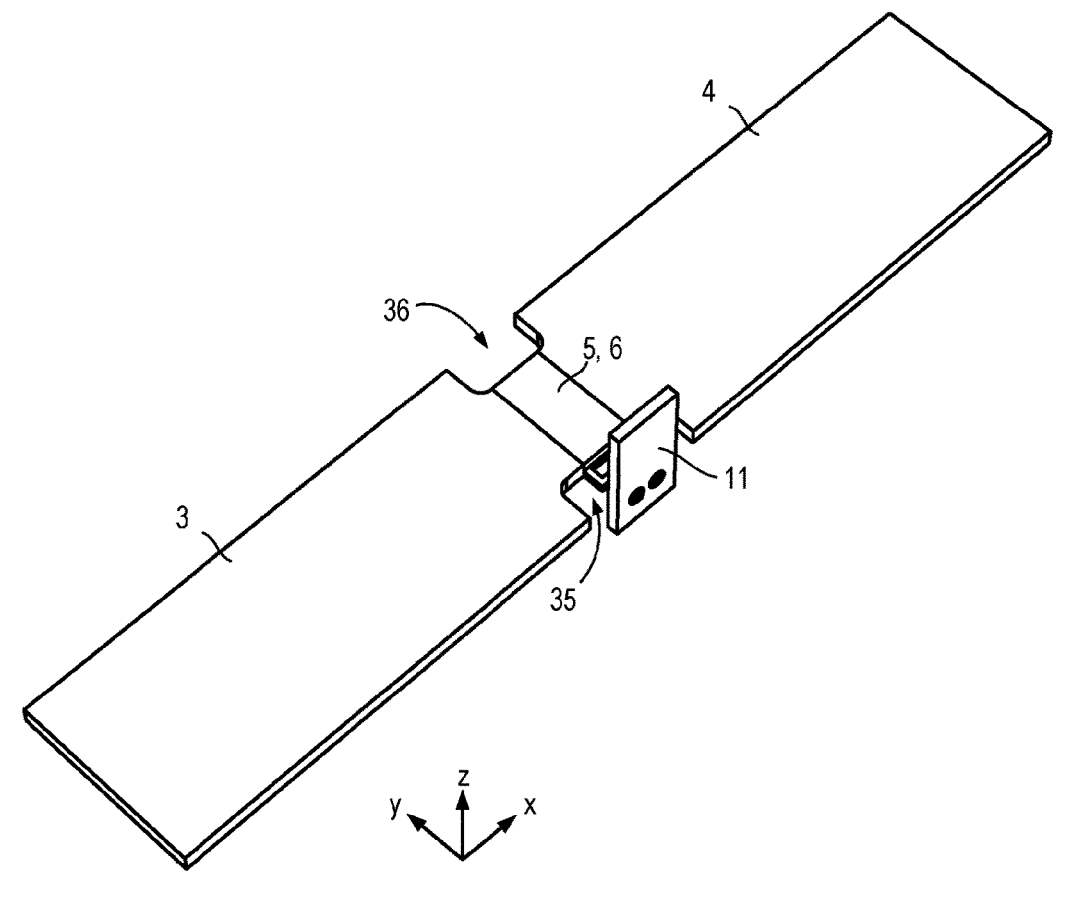
Fig. 34C

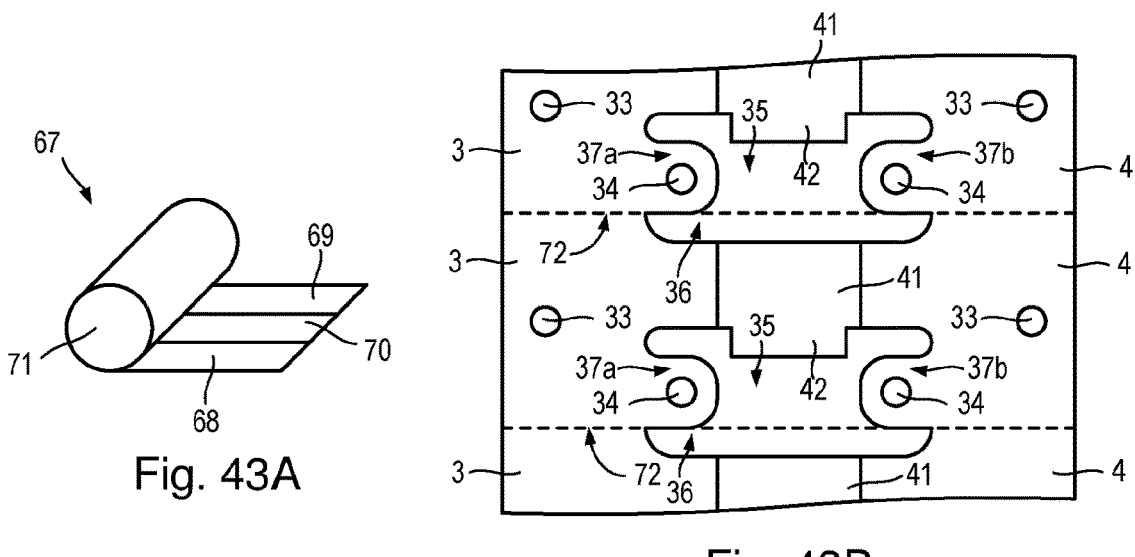
Fig. 43A
Fig. 43B
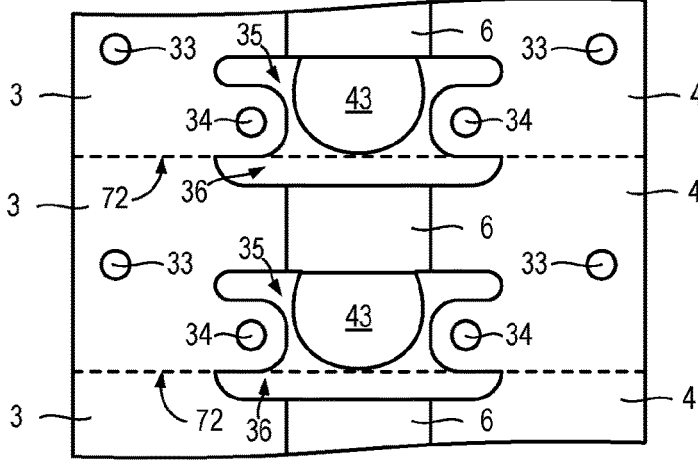
Fig. 43C
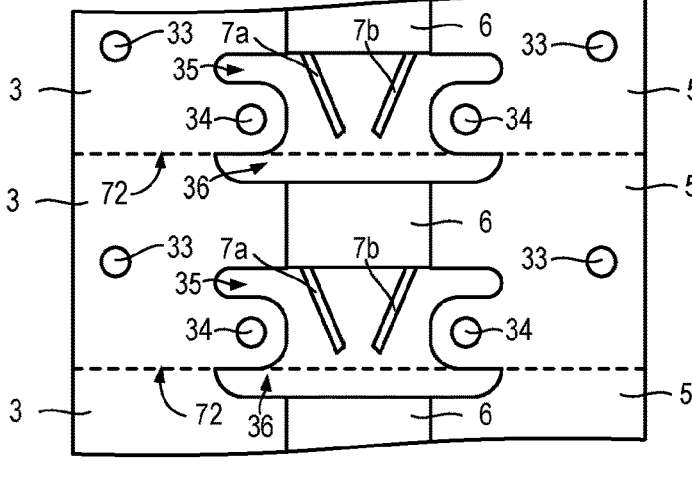
Fig. 43D

ELECTRICITY METER

FIELD

The present invention relates to an electricity meter, in particular to an electricity meter capable of measuring DC power.

BACKGROUND

The importance of electricity meters which can measure direct current (dc) power and as opposed to alternating current (ac) power is increasing as interest in dc power rises. However, dc electricity meter technology capable of widespread deployment is less developed than for ac electricity meters. Furthermore, existing ac electricity meters tend to perform poorly with dc.

Existing DC meters may be susceptible to measurement errors when, as is usually the case in practice, a thermal environment of a current carrying busbar is not uniform or symmetric.

US 2011/0267038 A1 describes configurations for current shunt sensors and current shunt sensor assemblies that can be used in single-phase/split-phase and poly-phase power metering applications. WO 2013/093714 A1 describes methods and circuits for reduction of errors in a current shunt. WO 2020/249490 A1 describes a DC meter for an electrical vehicle charging station.

SUMMARY

According to a first aspect of the present invention there is provided an apparatus including a DC electrical meter. The DC electrical meter includes a current sensor, or the DC electrical meter is connected to the current sensor. The current sensor includes a busbar connector that includes a first part connected to a third part via a second part. A material forming the second part has a temperature coefficient of electrical resistance which is less than a temperature coefficient of electrical resistance of materials forming the first and third parts respectively. The second part includes a main body integrally formed with first and second connecting members. Each connecting member has a proximal end where it meets the main body and a distal end electrically coupled to a respective conductive element supported on a substrate and coupled to circuitry configured to measure a voltage between the first and second connecting members. The current sensor is configured such that when a first temperature difference exists between the respective proximal ends of the first and second connecting members, a second temperature difference between the respective distal ends is less than or equal to 50% of the first temperature difference.

The distal end of the first connecting member may be connected to a first conductive element and the distal end of the second connecting member may be connected to a second conductive element.

The first temperature difference may result from one or more of Joule heating in the busbar connector, a heat flux between the first part and an exterior environment and/or connected part, and a heat flux between the third part and an exterior environment and/or connected part.

The second temperature difference may be less than or equal to 40% of the first temperature difference. The second temperature difference may be less than or equal to 30% of the first temperature difference. The second temperature difference may be less than or equal to 20% of the first temperature difference. The second temperature difference may be less than or equal to 10% of the first temperature difference.

The first connecting member may extend along a first path between the proximal and distal ends, the first path having a first length. A first width of the first connecting member at each point along the first path may be a largest dimension of the first connecting member perpendicular to the first path at that point. The first length may be greater than or equal to three times a maximum of the first width along the first path. The second connecting member may extend along a second path between the proximal and distal ends, the second path having a second length. A second width of the second connecting member at each point along the second path may be a largest dimension of the second connecting member perpendicular to the second path at that point. The second length may be greater than or equal to three times a maximum of the second width along the second path.

In this way, the elongated nature of the connecting members means that the distal ends of the first and second connecting members may be more thermally isolated from the proximal ends, and closer to isothermal with one another due to thermal conduction via the substrate. This will help to reduce any asymmetry in thermal electromotive forces (EMF) generated at the interfaces of the first and second connecting members with the respective conductive elements.

Additionally, the elongation of the first and second members may result in greater surface heat losses along the respective first and second paths, causing the temperatures at the distal ends to be closer to equilibrium with an ambient temperature.

The first path may be straight. The first path may be curved. The first path may include one or more angles. The first path may be serpentine. The second path may be straight. The second path may be curved. The second path may include one or more angles. The second path may be serpentine.

The first/second length may be greater than or equal to six times a maximum width of the first/second connecting member perpendicular to the first/second path. The first/second length may be greater than or equal to six times a maximum width of the first/second connecting member perpendicular to the first/second path. The first/second length may be greater than or equal to seven times a maximum width of the first/second connecting member perpendicular to the first/second path. The first/second length may be greater than or equal to eight times a maximum width of the first/second connecting member perpendicular to the first/second path. The first/second length may be greater than or equal to nine times a maximum width of the first/second connecting member perpendicular to the first/second path. The first/second length may be greater than or equal to ten times a maximum width of the first/second connecting member perpendicular to the first/second path.

The first connecting member and the second connecting member are preferably mirrored (equivalently symmetric) about a midline of the main body between the first and third parts.

The first connecting member may include one or more protrusions, for example fins, spines or other structures suitable for increasing the surface area to volume ratio of the first connecting member. The second connecting member may include one or more protrusions, for example fins, spines or other structures suitable for increasing the surface area to volume ratio of the second connecting member. Such protrusions of the first and/or second connecting members may act to increase heat losses from the respective connecting members and The circuity may include, or take the form of, a suitably programmed microcontroller. The current measurement may be based on a potential difference measured between the first and second connecting members.

The first part and the third part may be formed of different materials. The first part and the third part may be formed of the same material. The first part and the third part may be formed of a copper alloy.

The conductive elements may include, or take the form of, conductive traces. The conductive traces may take the form of copper tracks supported on a substrate taking the form of a printed circuit board (PCB).

A closest spacing between the first and second connecting members may be less than a spacing of the respective proximal ends of the first and second connecting members. The closest spacing may occur at respective points along the first and second connecting members. The closest spacing may occur along respective lengths of the first and second connecting members. The closest spacing may correspond to the respective distal ends and/or respective lengths including the distal ends.

The closest spacing may be less than or equal to 0.75 times the spacing of the respective proximal ends of the first and second connecting members. The closest spacing may be less than or equal to 0.6 times the spacing of the respective proximal ends of the first and second connecting members. The closest spacing may be less than or equal to 0.5 times the spacing of the respective proximal ends of the first and second connecting members. The closest spacing may be less than or equal to 0.4 times the spacing of the respective proximal ends of the first and second connecting members. The closest spacing may be less than or equal to 0.3 times the spacing of the respective proximal ends of the first and second connecting members. The closest spacing may be less than or equal to 0.25 times the spacing of the respective proximal ends of the first and second connecting members.

A thermal bypass path having a bypass thermal conductance may couple a region of the first connecting member to a region of the second connecting member without passing via the second part. A first thermal path having a first thermal conductance may run via the first connecting member between the thermal bypass path and the proximal end of the first connecting member. A second thermal path having a second thermal conductance may run via the second connecting member between the thermal bypass path and the proximal end of the second connecting member. The first, second and thermal bypass paths may be configured such that the thermal bypass path is electrically insulating, the bypass thermal conductance is greater than the first thermal conductance, and the bypass thermal conductance is greater than the second thermal conductance.

The thermal bypass path may preferably correspond to the closest spacing between the first and second connecting members. The thermal bypass path may connect regions of the first and second connecting members extending to the respective distal ends. The thermal bypass path may connect regions of the first and second connecting members which do not extend to the respective distal ends.

The thermal bypass path may include heat flows via the substrate and/or circuitry.

The substrate may take the form of a power electronic substrate or circuit board, such as, for example, a direct bonded copper substrate, an active metal brazed substrate, an insulated metal substrate, and so forth. The circuitry configured to measure the voltage between the first and second connecting members may be supported on the same substrate as the conductive elements. Alternatively, the circuitry configured to measure the voltage between the first and second connecting members may be supported on a further substrate, for example a cheaper circuit board, mounted to (or to which is mounted) the substrate.

The thermal bypass path may include heat flows via a thermal jumper mounted on the substrate to span a gap between the first and second connecting members. The first and second connecting members may be soldered, brazed, welded, or otherwise directly connected to metal terminations on either side of the thermal jumper. Additionally or alternatively, thermal grease, thermal compound (or similar products) may be applied to increase thermal conductance via the thermal jumper.

The apparatus may include a thermal jumper bonded to span between the distal ends of the first and second connecting members. The thermal jumper may be supported on the substrate. The respective distal ends of the first and second connecting members may be sandwiched between the thermal jumper and the substrate.

The thermal jumper may include a first electrically conductive element and a second electrically conductive element electrically insulated from the first electrically conductive element. The distal end of the first connecting member may be electrically coupled to the first electrically conductive element. The distal end of the second connecting member may be electrically coupled to the second electrically conductive element. The circuitry may be coupled between the first and second electrically conductive elements of the thermal jumper.

The first part may be coupled to the second part by a first weld and the second part may be coupled to the third part by a second weld. The proximal end of the first connecting member may be as close as possible to the first part without overlapping a weld zone of the first weld. The proximal end of the second connecting member may be as close as possible to the third part without overlapping a weld zone of the second weld.

Herein, the weld zone associated with a weld refers to a zone either side of the weld within which there are observable differences compared to the respective bulk materials in one or more of: material composition, grain sizes and/or orientations, precipitate sizes density and/or composition, phase fractions.

The second part may include, or take the form of, a material having a temperature coefficient of electrical resistance of between 0 and $10\times10^{-6}$ K$^{-1}$ or 0 and $-10\times10^{-6}$ K$^{-1}$ for a temperature in a range between 20° C. and 50° C. The second part may include, or take the form of, a material having a temperature coefficient of electrical resistance of between 0 and $20\times10^{-6}$ K$^{-1}$ or 0 and $-20\times10^{-6}$ K$^{-1}$ for a temperature in a range between 20° C. and 50° C.

The second part may include, or take the form of, a metal alloy including copper, nickel and manganese. The metal alloy may take the form of Manganin®. The second part may be formed of a metal alloy including copper, manganese and optionally tin. The second part may be formed of a metal alloy including nickel, chromium, and optionally aluminium. The second part may be formed of a metal alloy including copper and zinc. The second part may be formed of a metal alloy including copper and nickel. The second part may be formed of a metal alloy including iron, chromium and aluminium. The second part may be formed of a metal alloy including aluminium, magnesium and optionally chromium.

The main body of the second part may have a length along a first direction between the first and third parts, a width along a second direction, and a thickness along a third direction. The first and second connecting members may have a thickness along the third direction which is less than the thickness of the main body.

The thickness of the first connecting member may mean, for a point along the first path, the dimension parallel to the third direction in a plane perpendicular to the first path at that point. The thickness of the second connecting member may mean, for a point along the second path, the dimension parallel to the third direction in a plane perpendicular to the second path at that point. Thickness of the first/second connecting member may mean the maximum thickness at any point along the first/second path.

The thickness of the first and second connecting members may be 0.75 times the thickness of the main body. The thickness of the first and second connecting members may be 0.6 times the thickness of the main body. The thickness of the first and second connecting members may be 0.5 times the thickness of the main body. The thickness of the first and second connecting members may be 0.4 times the thickness of the main body. The thickness of the first and second connecting members may be 0.3 times the thickness of the main body. The thickness of the first and second connecting members may be 0.2 times the thickness of the main body. The thickness of the first and second connecting members may be 0.1 times the thickness of the main body.

The main body, the first connecting member and the second connecting member may be formed from a single piece of material by compressively deforming a portion of the single piece to form a reduced thickness region, forming the main body of the second part from the un-deformed portion of the singe piece, and forming the first and second connecting members from the reduced thickness region.

The main body, the first connecting member and the second connecting member may be formed from a single piece of material. The main body, the first connecting member and the second connecting member may be formed from a single piece of material by shearing. The shearing may include, or take the form of, a stamping process, a die cutting process, a fine blanking process, and so forth. Alternatively, the main body, the first connecting member and the second connecting member may be formed from a single piece of material by any suitable process, including but not limited to etching, laser cutting, mechanical milling, spark erosion (electrical discharge machining).

The single piece of material may preferably be pre-connected to the first part and/or the third part. For example, strips or rolls providing materials for the first, second and third parts may be welded together and then divided (for example by shearing) to form blanks for further processing into busbar connectors.

The first and second connecting members may each include, or take the form of, at least one section angled relative to the main body. The at one least angled section may make an angle between 90° and 10° to the main body. The at one least angled section may make an angle between 70° and 30° to the main body. The first connecting member may take the form of a single, straight section between the proximal and distal ends. The second connecting member may take the form of a single, straight section between the proximal and distal ends. The first and second connecting members may be angled relative to the main body such that the respective distal ends are closer together than the respective proximal ends.

The first and second connecting members may each include, or take the form of, at least one curved section.

The first and second connecting members may each have a serpentine configuration.

The busbar connector may be U-shaped. The busbar connector may be straight.

The main body of the second part may have a length along a first direction between the first and third parts, a width along a second direction, and a thickness along a third direction. The extension of the first and second connecting members away from the main body may have a component parallel to the second direction. The first and third parts may have a maximum width along the second direction which is large enough that neither of the first and second connecting members projects beyond the width of the first and third parts.

Neither of the first and second connecting members may extend beyond the width of the first and third parts when the busbar is projected onto a plane perpendicular to the third direction (parallel to thicknesses. In this way, the extended width of the first and third parts provides physical protection to the more delicate first and second connecting members during fabrication, handling and/or assembly processes.

The first part and the third part may include respective full width sections away from the second part, and respective reduced width sections coupled to the second part. Each reduced width section may be flush with the corresponding full width sections on one side of the respective first and/or third part. In other words, the reduced width sections may be formed by cut-outs from one side (parallel to the first direction) of the first and/or third parts. Alternatively, the reduced width sections may not be flush with the full width sections on one side of the first and/or third parts. In other words, the reduced width sections may be formed by cut-outs from both sides (parallel to the first direction) of the first and/or third parts.

The transition between reduced width and full width sections of the first and/or third parts may have a step profile. The transition between reduced width and full width sections of the first and/or third parts may have an angled profile. The transition between reduced width and full width sections of the first and/or third parts may have a curved profile.

The full width section of the first and/or second parts may include a protrusion extending in the first direction and separated from the reduced width section by a gap in the second direction. The protrusion of the full width section is not coupled to the second part, and is configured such that minimal current density will flow in the protrusion when a current is passed between first and third parts. The protrusions of the first and/or second parts may include through-holes used to mechanically secure the busbar connector relative to the substrate.

The lengths of the respective reduced width sections of the first and third parts along the first direction may be configured to minimize sensitivity variations of the current sensor with temperature.

The length of reduced width sections which minimizes sensitivity variations of the current sensor with temperature may be determined by increasing the length of the reduced width sections until the percentage change in sensitivity across the temperature range from 280 K to 340 K is less than or equal to a threshold sensitivity variation. The threshold sensitivity variation may be 0.05%. The threshold sensitivity variation may be 0.04%. The threshold sensitivity variation may be 0.03%. The threshold sensitivity variation may be 0.02%. The threshold sensitivity variation may be 0.01%.

Sensitivity is expressed in units of potential difference (in volts V) per unit current (in amps A) passing through the busbar connector. The determination of the length of reduced width sections which minimizes sensitivity variations of the current sensor with temperature may be determined by extrapolating or interpolating experimental results obtained using of reduced width sections having a range of lengths. Preferably, the determination of the length of reduced width sections which minimises sensitivity variations of the current sensor with temperature may be determined using finite element analysis (FEA) modelling of current flows in the busbar connector.

The first part may include one or more through holes used for mechanically securing the busbar connector relative to the substrate. Additionally or alternatively, the third part may include one or more through holes used for mechanically securing the busbar connector relative to the substrate. The sizes and locations of any through holes may be arranged to minimize sensitivity variations of the current sensor with temperature.

The sizes and locations of through holes may be considered to be minimising sensitivity variations if the percentage change in sensitivity across the temperature range from 280 K to 340 K is less than or equal to the threshold sensitivity variation.

The substrate (and/or a further substrate supporting the substrate) may be coupled to the busbar connector using one or more of the through holes. When the first and second parts include full width sections which include protrusions, through holes for connection to the substrate (and/or a further substrate supporting the substrate) may be positioned within the protrusions.

The apparatus may also include one or more temperature sensors. The circuity may be configured to perform temperature dependent sensitivity corrections to measured currents based on temperatures measured by the one or more temperature sensors. The temperature dependent sensitivity corrections may be implemented in firmware, for example, when the circuitry takes the form of a microcontroller or similar.

The one or more temperature sensors may include a first temperature sensor arranged to measure a temperature of the first part. The one or more temperature sensors may include a second temperature sensor may be arranged to measure a temperature of the second part. The first and/or second temperature sensors may include, or take the form of, thermocouples. The first and/or second temperature sensors may include, or take the form of, thermistors.

As an alternative, instead of the circuitry implementing temperature dependent sensitivity corrections, these may be implemented by a controller of the DC electrical meter including, or connected to, the apparatus.

The apparatus may also include one or more further busbar connectors. Each further busbar connector may be electrically connected in parallel with the busbar connector, and may include a first part, a second part and a third part. A material forming the second part may have a temperature coefficient of electrical resistance which is less than materials forming the first and third parts respectively. The second part of each further busbar connector may include a main body having the same dimensions as the main body of the busbar connector.

In this way, the total current capacity of the DC current sensor may be increased. Alternatively, sensitivity of a DC current sensor may be increased by increasing the resistance of the second part, without decreasing the total current capacity of the DC current sensor.

The first part of the busbar connector and the first part of a further busbar connector may be provided by a single piece folded back on itself. Additionally and/or alternatively, the second part of the busbar connector and the second part of a further busbar connector may be provided by the single piece folded back on itself.

The one or more further busbar connectors may be stacked in parallel with the busbar connector.

The second part of at least one of the one or more further busbar connectors may include first and second connecting members integrally formed with the respective main body and configured the same as the first and second connecting members of the busbar connector. Every further busbar connector of the one or more further busbar connectors may include first and second connecting members configured the same as the first and second connecting members of the busbar connector.

A maximum current carrying capacity of the busbar connector may be at least 20 amps. The maximum current carrying capacity of the busbar connector may be at least 50amps. The maximum current carrying capacity of the busbar connector may be at least 100 amps. The maximum current carrying capacity of the busbar connector may be at least 200 amps. The maximum current carrying capacity of the busbar connector may be at least 600 amps. The maximum current carrying capacity of the busbar connector may be at least 1000 amps.

The current sensor may be included in the DC electrical meter. The DC electrical meter may also include one or more further current sensors, each further current sensor being the same as the current sensor. The DC electrical meter may also include a controller connected to the current sensor and each of the further current sensors and configured to record a respective energy consumption corresponding to each current sensor.

The controller and the one or more current sensors may be supported within a single package providing the DC electrical meter. Herein, the language "single package" may mean single casing, or similar.

The DC electrical meter may be connected to the current sensor, and the apparatus may further include one or more further current sensors. Each further current sensor may be the same as the current sensor. The DC electrical meter may be connected to the current sensor and each of the one or more further current sensors via a respective wired or wireless link. The DC electrical meter may be configured to record a respective energy consumption corresponding to each current sensor.

The DC electrical meter may be a separate device to the current sensor and/or the one or more further current sensors. Each of the current sensor and/or the one or more further current sensors may take the form of a single device/single package. Additionally or alternatively, two or more current sensors may be packaged as a single device which is separate from the DC electrical meter.

According to a second aspect of the invention, there is provided an assembly including a first part, a second part and a third part. A material forming the second part has a temperature coefficient of electrical resistance which is less than materials forming the first and third parts respectively. The second part includes a main body integrally formed with first and second connecting members. Each connecting member has a proximal end where it meets the main body and a distal end. The connecting members are configured such that, when a first temperature difference exists between the respective proximal ends of the first and second connecting members, a second temperature difference between the respective distal ends is less than or equal to 50% of the first temperature difference.

The assembly may take the form of a busbar connector.

The assembly of the second aspect may include features corresponding to any features of busbar connectors included in current sensors included in the apparatus according to the first aspect. Definitions applicable to busbar connectors included in current sensors of the first aspect (or features thereof) may be equally applicable to the assembly of the second aspect.

A closest spacing between the first and second connecting members may be less than a spacing of the respective proximal ends of the first and second connecting members. The closest spacing may occur at respective points along the first and second connecting members. The closest spacing may occur along respective lengths of the first and second connecting members. The closest spacing may correspond to the respective distal ends of the first and second connecting members.

The closest spacing may be less than or equal to 0.75 times the spacing of the respective proximal ends of the first and second connecting members. The closest spacing may be less than or equal to 0.6 times the spacing of the respective proximal ends of the first and second connecting members. The closest spacing may be less than or equal to 0.5 times the spacing of the respective proximal ends of the first and second connecting members. The closest spacing may be less than or equal to 0.4 times the spacing of the respective proximal ends of the first and second connecting members. The closest spacing may be less than or equal to 0.3 times the spacing of the respective proximal ends of the first and second connecting members. The closest spacing may be less than or equal to 0.25 times the spacing of the respective proximal ends of the first and second connecting members.

The first connecting member may extend along a first path between the proximal and distal ends. The first path may have a first length. A first width of the first connecting member at each point along the first path may be a largest dimension of the first connecting member perpendicular to the first path at that point. The first length may be greater than or equal to three times a maximum of the first width along the first path. The second connecting member may extend along a second path between the proximal and distal ends. The second path may have a second length. A second width of the second connecting member at each point along the second path may be a largest dimension of the second connecting member perpendicular to the second path at that point. The second length may be greater than or equal to three times a maximum of the second width along the second path.

The first path may be straight. The first path may be curved. The first path may include one or more angles. The first path may be serpentine. The second path may be straight. The second path may be curved. The second path may include one or more angles. The second path may be serpentine.

The first/second length may be greater than or equal to six times a maximum width of the first/second connecting member perpendicular to the first/second path. The first/second length may be greater than or equal to six times a maximum width of the first/second connecting member perpendicular to the first/second path. The first/second length may be greater than or equal to seven times a maximum width of the first/second connecting member perpendicular to the first/second path. The first/second length may be greater than or equal to eight times a maximum width of the first/second connecting member perpendicular to the first/second path. The first/second length may be greater than or equal to nine times a maximum width of the first/second connecting member perpendicular to the first/second path. The first/second length may be greater than or equal to ten times a maximum width of the first/second connecting member perpendicular to the first/second path.

According to a third aspect of the invention, there is provided use of the apparatus according to the first aspect to record energy consumption corresponding to one or more loads.

According to a fourth aspect of the invention, there is provided a method of fabricating a busbar connector. The method includes receiving a feedstock including, or taking the form of, a first region connected to a third region via a second region. A material forming the second region has a temperature coefficient of electrical resistance which is less than a temperature coefficient of electrical resistance of materials forming the first and third regions respectively. The method also includes removing material from the feedstock to produce a busbar connector including a first part formed from the first region; a second part formed from the second region and comprising a main body integrally formed with first and second connecting members, each connecting member having a proximal end where it meets the main body and a distal end projected away from the main body; and a third part formed from the third region. The first and second connecting members are configured such that when a first temperature difference exists between the respective proximal ends of the first and second connecting members, a second temperature difference between the respective distal ends is less than or equal to 50% of the first temperature difference.

The method of the fourth aspect may include features corresponding to any features of busbar connectors included in current sensors included in the apparatus according to the first aspect. Definitions applicable to busbar connectors included in current sensors of the first aspect (or features thereof) may be equally applicable to the method of the fourth aspect.

The first connecting member may extend along a first path between the proximal and distal ends. The first path may have a first length. A first width of the first connecting member at each point along the first path may be a largest dimension of the first connecting member perpendicular to the first path at that point. The first length may be greater than or equal to three times a maximum of the first width along the first path. The second connecting member may extend along a second path between the proximal and distal ends. The second path may have a second length. A second width of the second connecting member at each point along the second path may be a largest dimension of the second connecting member perpendicular to the second path at that point. The second length may be greater than or equal to three times a maximum of the second width along the second path.

Material may be removed from the feedstock by a shearing process. The shearing process may include, or take the form of, one or more of stamping, die-cutting and fine blanking.

Additionally and/or alternatively, material may be removed from the blank by one or more of a laser cutting process, a mechanical milling process, and a spark erosion (electrical discharge machining) process.

Removing material from the feedstock to produce the second part may include compressively deforming a portion of the second region to form a reduced thickness region, forming the main body of the second part from the undeformed portion of the singe piece, and forming the first and second connecting members from the reduced thickness region.

The first region may be welded to the second region and the second region may be welded to the third region.

Removing material from the feedstock to produce a busbar connector may include, or be performed at, a sequence of stations. At each station material may be removed from the feedstock to form one or more features of the busbar connecter.

The feedstock may take the form of a roll.

An objective of the present specification is to provide a meter with a shunt (second part) built inside the meter, or with a shunt (second part) that is remote to the meter According to a fifth aspect of the invention, there is provided an electricity meter including an input for receiving an output from a current sensor including a current shunt. The current shunt including, or formed at least partially of, a material that has a low rate of change of resistivity with respect to temperature. The current shunt also includes legs (connecting members) that are formed as part of the shunt and made from the material that has a low rate of change of resistivity with respect to temperature. The legs have a length or shape and/or cross section that provides a thermal resistance.

A PCB may be electrically connected to the two legs (connecting members). The distance between the 2 legs (connecting members) at the PCB may be less than 6 mm, or less than 4 mm, or less than 1 mm.

Legs (connecting members) may be arranged to provide a thermal resistance between the shunt and the PCB. Legs (connecting members) may be thinner than parent material to provide thermal resistance. Legs (connecting members) may be less than 1 mm thick. Additionally or alternatively, a ratio of full thickness T to pressed thickness PT may be, for example, 2.5 mm/0.75 mm. Legs (connecting members) may be less than 1.6 mm thick. Legs (connecting members) may be narrower than 2.5 mm wide. Legs (connecting members) may be narrower than 1.6 mm wide. Legs may be >2 mm long, >4 mm long. Legs (connecting members) may have a ratio of legs which are dimension x apart at the shunt and a dimension y apart at the PCB, wherein y/x is <1, <0.75, or <0.5. Legs (connecting members) at the PCB end may be electrically isolated and thermally shorted using a FR4 PCB, and/or copper track layers, or thermal jumper, or thermal tape.

The electricity meter may include the current sensor. A current modulator or chopper (circuitry) may be mounted directly to a PCB (printed circuit board).

The design of the PCB is preferably such that the differential signal path is symmetrical (thermally) so that all potential EMF's cancel out. This may involve one or more of:

Symmetric track (conductive element) layout for positive and negative signals (The positive and negative signals provided to the current modulator (or other type of circuitry) may have some protection devices for example: protection of a modulator from surge currents through the shunt using series resistors. In addition anti-alias capacitors may be incorporated. The impact of the thermal EMFs generated across all these devices and their connections may be reduced by symmetry and reducing the distances between components.

Use of large ground islands symmetrically under the circuits.

Addition of thermally conductive material mounted above the circuit to reduce temperature differences due to convection currents in the air The resultant error source may be purely due to temperature difference between the two connections points (electrically conductive elements) of the PCB. Connection lugs (connecting members) may be extended to increase the thermal impedance of connection lugs (connecting members). An isothermal block (thermal jumper) may be connected across the connection points (connecting members) to minimize temperature differential here. This block (thermal jumper) needs to be thermally shorting, but not electrically connected to the lugs (connecting members).

An insulated metal substrate (IMS) PCB technology may be used. This may provide an electrical contact, with a thin (typically ~ 100 μm) insulating layer. It may also provide an isothermal island for the circuitry to sit on. This may reduce the number of separate components in the design, which may reduce cost and assembly time. Using IMS technology may allow to work around the limited connection area available to the connection lugs (connecting members).

Typically the limiting factor in a normal isothermal connection is the insulating layer between the two tabs, and the tab size is relatively small. The IMS board may have a large copper plane electrically to spread the heat flow across the insulating layer. The thermal resistance of the isothermal block (and insulating layer) may be significantly less than the thermal resistance of the Manganin® tabs (connecting members). Tabs may be of reasonable length, for example due to relatively high thermal resistivity of Manganin®.

Connection tabs (connecting members) may be 3 mm long, 1×1 mm cross section. Connection tabs (connecting members) may have a thermal impedance of 137 $K \cdot W^{-1}$ or less. Connection tabs (connecting members) soldered onto an IMS may have a thermal resistance of <10 $K \cdot W^{-1}$ due to insulation layer, and <0.01 $K \cdot W^{-1}$ due to aluminium baseplate. The IMS may have a 100 μm thick insulation layer and a 1.6 mm thick aluminium layer. This may reduce a temperature difference at the material interface by a factor of more than ten.

The connections between the shunt and the PCB may use lugs (connecting members) in the main plane of the busbar and/or bosses perpendicular to the main plane of the busbar. The shunt lugs may be thermally connected together at or near the PCB using a thermal jumper.

BRIEF DESCRIPTION OF THE DRAWINGS

Certain embodiments of the present invention will now be described, by way of example, with reference to the accompanying drawings, in which:

FIG. 1 illustrates a prior art current sensor including a first prior art busbar;

FIG. 2 illustrates a second prior art busbar;

FIGS. 3A and 3B illustrates a third prior art busbar;

FIG. 34A is a schematic plan view of a second through-hole mounting method, FIG. 34B is a side view, and FIG. 34C is a projection view;

FIGS. 43A, 43B, 43C and 43D schematically illustrate a fabrication method for a busbar connector.

DETAILED DESCRIPTION OF CERTAIN EMBODIMENTS

Figure 4:
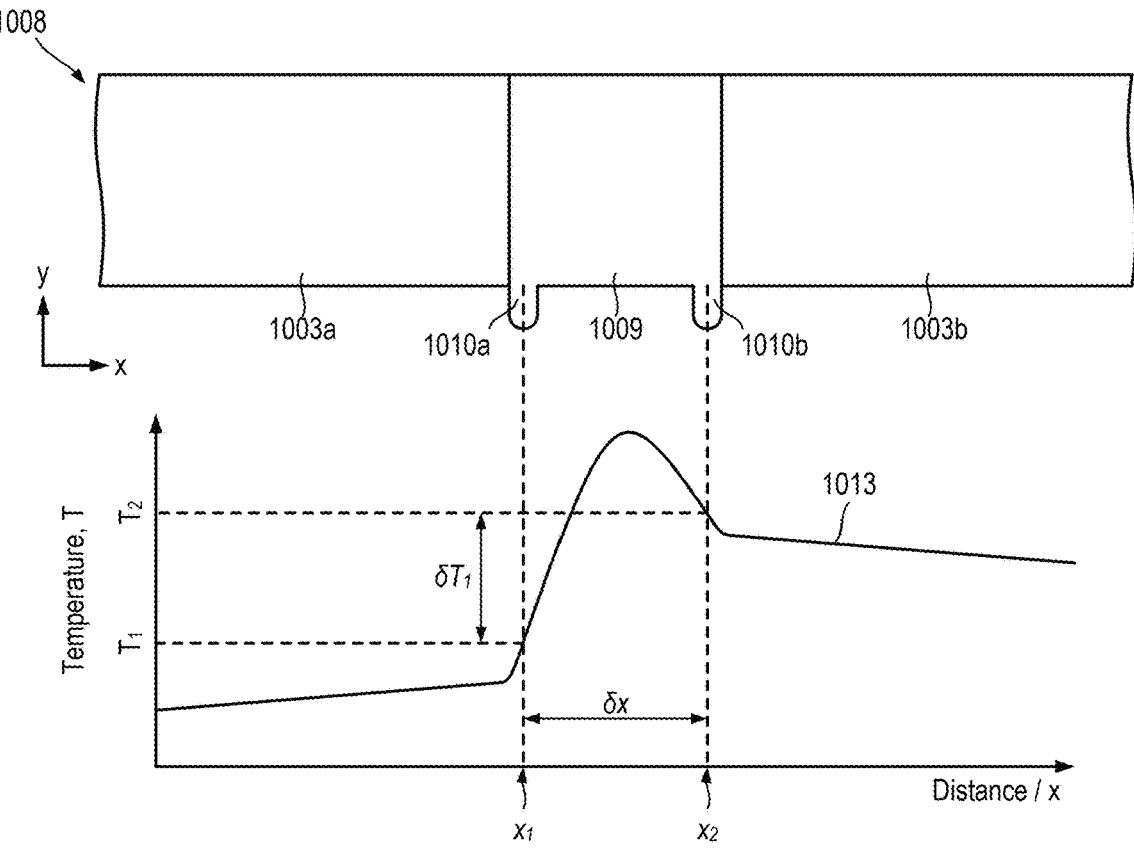
FIG. 4 illustrates a schematic temperature distribution in the second prior art busbar.

The present invention is based on the insight that connectors used to measure a potential difference across a measurement region of a current shunt used in DC electric meters may be configured for reduced sensitivity to temperature differences which may be sustained across the current shunt in use.

In the following, like parts are denoted with like reference numerals.

The typical prior art arrangement involves running a set of wires from connection tabs on a shunt of a current busbar to a remote set of electronics. This involves multiple sets of thermocouple junctions (2 x shunt to wires, 2 x wires to measurement electronics, PCB tracks to components—described further in relation to FIG. 5). The aforementioned arrangement may give rise to an offset voltage under real world conditions, which appears in series with the shunt measurement voltage (discussed further in relation to FIG. 5), thus degrading the accuracy of the measurement particularly at the low end of the current measurement range.

An example would be an ANSI C12.32 meter with $I_{max}$=200 A (maximum rated current), $I_{tr}$=3 A (Transition current)

100 μΩ shunt

Class D accuracy

Shunts for current busbars are often made from Manganin® due to its stable resistance with temperature (<20 ppm/K) and its low thermal EMF versus copper. This material would generate a dissipation of 4 W in the shunt (which could cause a temperature rise of up to 40 K). To maintain a 0.2% accuracy at the transition current, $I_{tr}$, an offset voltage must be below 600 nV.

Isabellenhutte quotes the thermal EMF of Manganin® to copper as 1 μV·K$^{-1}$. Thus the two Manganin to copper junctions must be within 0.6 K to prevent the thermal EMF from (by itself) exceeding the error budget.

Additional challenges may be encountered in practical circumstances:

The thermal environment of a current busbar may not be symmetric. An example would be a busbar connected on one side to a length of correctly sized cables (low heat generation), but immediately next to a DC contactor, which will generate heat flow along the busbar due to the additional resistance and heating of the contactor. This may give rise to a temperature difference between sampled points (discussed further in relation to FIG. 4).

This situation could also arise if one side of a meter is connected to a common busbar, which will have different thermal characteristics to a single connecting cable, resulting in a temperature difference.

This could also arise if one side of a meter is connected close to an inline fuse, which under normal operation at the rated current dissipates heat resistively.

Figure 6:
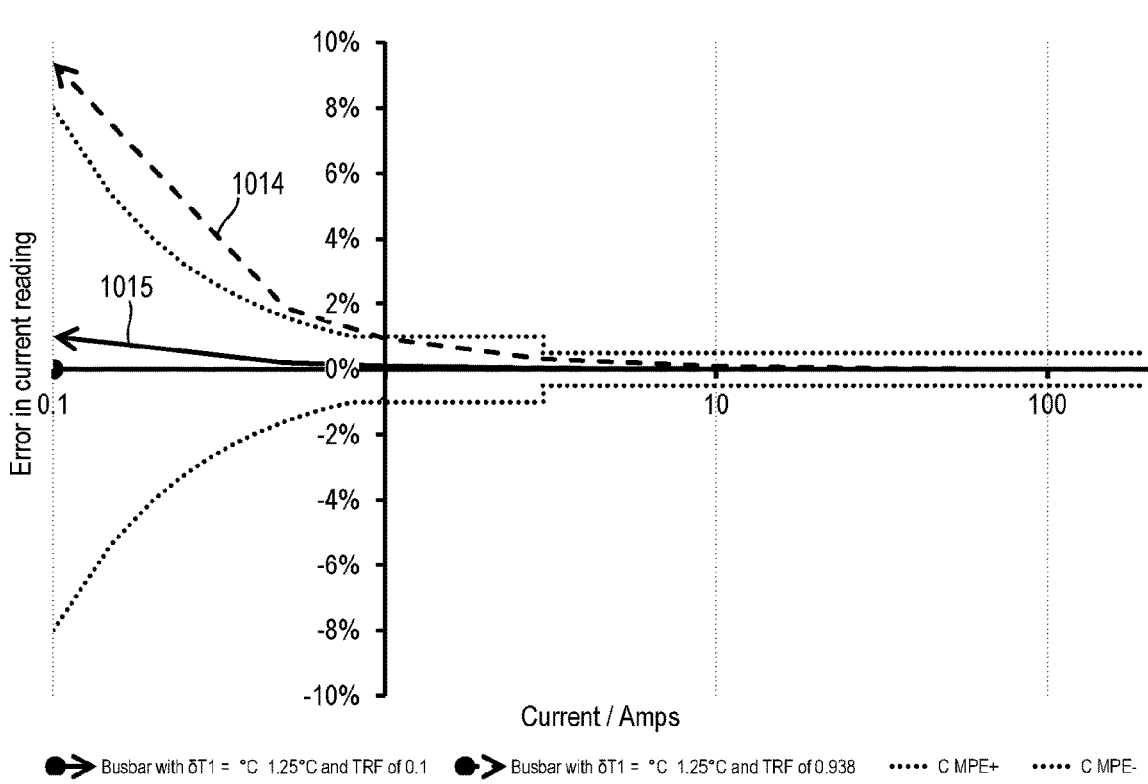
FIG. 6 plots simulated results of electrical meter compliance testing.

A meter qualification tests include the requirement to measure a maximum current (which generates heat in the shunt) followed by a minimum current (which is sensitive to offset) directly after one another (discussed further in relation to FIG. 6).

Previously, it has been suggested to address these issues by:

Increasing the resistance of the shunt, so that the offset voltage is small compared to the requirements. However, this involves a large increase in heat dissipation, which means the shunt becomes physically large and expensive.

Use of Manganin® wire to connect to the shunt. In theory, this should mean there are no dissimilar junctions in the region of the heat generation and gradients. However the Manganin (RTM) wire must be joined to the shunt, which can introduce other uncertainties. For example, the Manganin® wire may be a different grade of Manganin® to that in the shunt (as it will have been processed differently to sheet material, and so may have a different Seebeck co-efficient. Small changes in material composition can have significant effects on the Seebeck coefficient.

Examples proposed in the present specification do not use wires, and consequently the precise position of the conductors may be controlled reliably. Moreover, examples described herein do not need to use welding to attach a busbar to sensing circuitry. Instead, the connection may be made by soldering of a substrate (such as a PCB) using pre-screen printed solder, or an alternative soldering process.

Referring to FIG. 1, a prior art current sensor is shown.

The prior art current sensor includes a first prior art busbar 1001 for transferring DC current to a load. The first prior art busbar 1001 includes a first prior art shunt 1002 connecting between first and second copper bars 1003a, 1003b. The first prior art shunt 1002 is typically formed from an alloy having relatively higher resistivity and relatively lower temperature coefficient of electrical resistance compared to the first and second copper bars 1003a, 1003b. For example, a copper-manganese-nickel alloy such as Manganin® (typically ~84.2% copper, ~12.1% manganese, and balance nickel) or other resistance alloys. Shunts 1002 are often made from Manganin® due to its stable resistance with temperature at typical operational temperatures (<20ppm/K) and their low thermal EMF to common conductors such as copper.

When a current $I_{load}$ is passed through the first prior art busbar 1001, a potential difference $\Delta V$ is developed across the first prior art shunt 1002:

$$\Delta V = I_{load} R_{shunt} \qquad (1)$$

In which $R_{shunt}$ is the resistance of the first prior art shunt 1002, given by:

$$R_{shunt} = \frac{\rho L}{W \cdot t} \qquad (2)$$

In which $\rho$ is resistivity of the material forming the first prior art shunt 1002, L is the length of the first prior art shunt 1002 (parallel to the x-axis as illustrated), W is the width of the first prior art shunt 1002 (parallel to the y-axis as illustrated), and t is the thickness of the first prior art shunt 1002 (parallel to the z-axis running perpendicular to the illustration).

Measurement of the full potential difference $\Delta V$ is difficult to achieve without interference from contact resistances at the joins (typically welded) between first and second copper bars 1003a, 1003b and the first prior art shunt 1002. Thus, often first and second wires 1004a, 1004b are connected, for example welded, soldered, brazed etc, to the first prior art shunt 1002 a distance $\delta x$ <L apart, which under ideal circumstance may be used to probe a potential difference $\delta V$:

$$\delta V = \frac{I_{load} \cdot \rho \cdot \delta x}{W \cdot t} \qquad (3)$$

The other ends of the first and second wires 1004a, 1004b are connected, for example soldered, to respective first and second conductive traces 1005a, 1005b supported on a PCB 1006. A sensor module 1007 is connected across the first and second conductive traces 1005a, 1005b. For example, in the form of a microcontroller, microchip, field programmable gate array, application specific integrated circuit and so forth. The sensor module 1007 is configured to sense the potential difference $\delta V$ to allow inferring the current $I_{load}$ passing through the first prior art busbar 1001. From which the current $I_{load}$ may be inferred. Coupled with measurement of a voltage $V_{load}$ across the load, power and energy delivered to the load may be calculated.

In practice, additional thermal electromotive forces (EMFs) may arise between the first prior art shunt 1002 and the wires 1004a, 1004b, and/or between the wires 1004a, 1004b and the conductive traces 1005a, 1005b.

It has been proposed to use wires 1004a, 1004b which have the same composition of material as the first prior art shunt 1002 so as to avoid thermal EMFs at the wire-shunt junctions (see for example WO 2014/093714 A1). However, plate stock and wire stock of the same notional composition may not be identical, and thermal EMFs may still be generated. Even if the composition were identical, differences in microstructure due to extrusion of the wire, heat affected zones at a welded join etc, may still give rise to unwanted thermal EMFs.

For example, in an American National Standards Institute Class D ANSI C12.32 meter having a maximum load current $I_{load} = I_{max} = 200$ A, with a transition current of $I_{tr} = 3$ A, and a 100 Ohm shunt 1002. This material would generate a dissipation of 4 W in the shunt 1002. Such power dissipation could cause a temperature rise of up to 40 K. In order to maintain 0.2% accuracy at the transition current $I_{tr}$ an offset voltage from thermal EMFs, i.e. an error in potential difference $\delta V$, should be below 600 nV. Assuming that wires 1004a, 1004b are formed of Manganin®, taking the Seebeck coefficient for Manganin® to Copper as equal to 1 $\mu V \cdot K^{-1}$, the two Manganin® to copper junctions (between the wires 1004a, 1004b and the conductive traces 1005a, 1005b) need to be within 0.6 K to prevent the thermal EMFs from exceeding the error budget. This issue is further discussed in relation to FIGS. 4 and 5 hereinafter.

Referring also to FIG. 2, a second prior art busbar 1008 is shown.

The second prior art busbar 1008 is substantially the same as the first prior art busbar 1001, except that a second prior art shunt 1009 is used instead of the first prior art shunt 1002. Instead of connecting to the conductive traces 1005a, 1005b (not shown in FIG. 2 for brevity) using wires 1004a, 1004b, first and second protrusions 1010a, 1010b extend from for the second prior art shunt 1009, and may be connected (for example soldered) to the conductive traces 1005a, 1005b. The centers of first and second protrusions 1010a, 1010b are spaced apart by a distance $\delta x$, and each has a width w (parallel to the x-axis as illustrated) and length l (parallel to the y-axis as illustrated) defining a relatively low aspect ratio, for example $l/w \leq 2$.

The integral nature of the first and second protrusions 1010a, 1010b may remove a pair of thermal EMFs. However, the inventors have realized that the relatively high thermal conductance of the first and second protrusions 1010a, 1010b may allow a temperature difference to be transmitted to the connections of first and second protrusions 1010a, 1010b to respective conductive traces 1005a, 1005b. In effect, this simply moves the thermal EMF issue to the connections to the conductive traces 1005a, 1005b. This is discussed further in relation to FIGS. 4 and 5.

Referring also to FIGS. 3A and 3B, a third prior art busbar 1011 is shown. FIG. 3A shows a plan view, and FIG. 3B shows a cross-section along the line labelled A-A' in FIG. 3A.

The third prior art busbar 1011 is substantially the same as the second prior art busbar 1008, except that the second prior art shunt 1009 is replaced with a third prior art shunt 1012 which is the same except for the first and second protrusions 1010a, 1010b extending parallel to the thickness direction (parallel to the z-axis as illustrated).

While the first and second protrusions 1010a, 1010b in FIG. 3B are shown as extending from a full thickness of the third prior art shunt 1012, this may depend on the formation mechanism used. For example, is the first and second protrusions 1010a, 1010b were punched out by a partial shearing process, then the underlying third prior art shunt 1012 would be deformed (e.g. hollow) due to displacement of the material forming the first and second protrusions 1010a, 1010b.

Referring also to FIG. 4, the origin of unwanted thermal EMFs is illustrated in relation to the second prior art busbar 1008.

When a load current $I_{load}$ is supplied, Joule heating occurs in the second prior art busbar 1009. The resistance $R_{Cu}$ of the copper bars 1003a, 1003b is relatively less than the resistance $R_{shunt}$ of the second prior art shunt 1009 (due to higher resistivity of the material). If the environment and boundary conditions of the copper bars 1003a, 1003b were identical, then temperatures at the protrusions 1010a, 1010b would be symmetric, and any thermal EMFs at the connections to the respective conductive traces 1005a, 1005b would be symmetric and cancel one another out.

However, in practice the environment and boundary conditions of the copper bars 1003a, 1003b will not be identical. For example, one may connect to an exterior power cable while the other is connected to an interior connection, leading to a higher temperature on one side. Additionally or alternatively, contact resistances of the copper bars 1003a, 1003b to further connections (such as power cables, DC contactors etc) will generally not be identical, again leading to asymmetric heat fluxes.

Asymmetry in the environment and boundary conditions of the copper bars 1003a, 1003b may lead to a temperature profile 1013 as illustrated schematically in FIG. 4 (note that the relative magnitude of heating in the shunt 1009 is greatly exaggerated for visualisation). The result is that a first temperature difference $\delta T_1$ may be sustained between the ends of the protrusions 1010a, 1010b connected to the second prior art shunt 1009. The low aspect ratio and high thermal conductance of the protrusions 1010a, 1010b means that a second temperature difference $\delta T_2$ between the free ends of the protrusions 1010a, 1010b is essentially the same as the first temperature difference $\delta T_1 \approx \delta T_2$.

Figure 5:
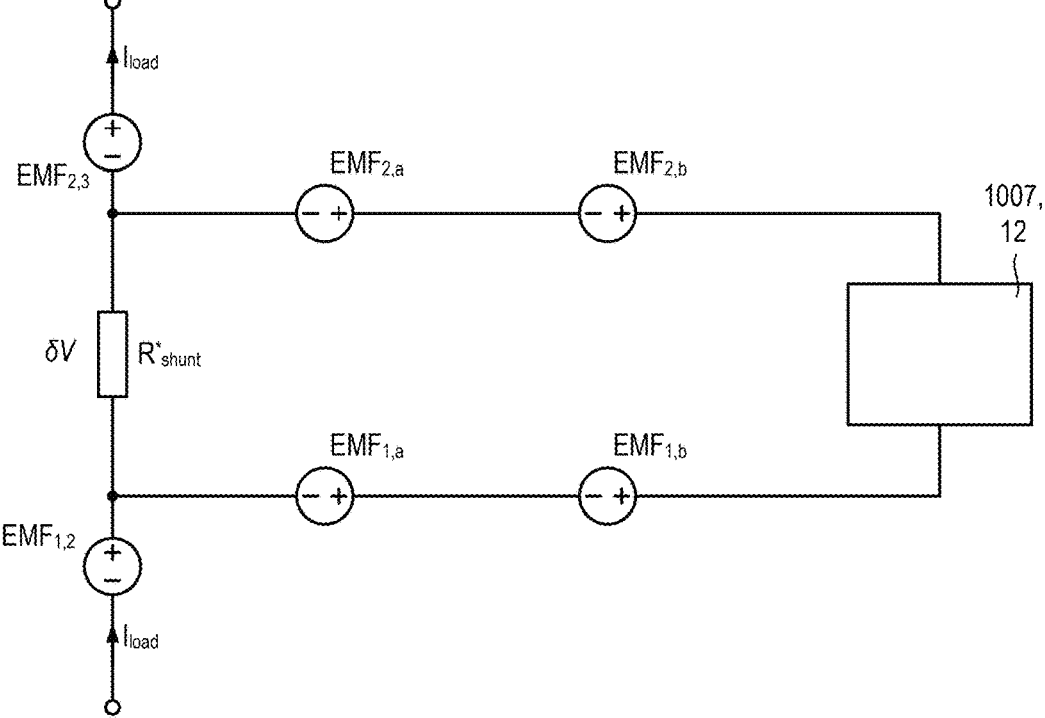
FIG. 5 is an equivalent circuit for a current sensor measurement.

Referring also to FIG. 5, an equivalent circuit diagram is shown which is relevant to prior art busbars 1001, 1008, 10011 and also to the present invention.

A thermal $EMF_{1,2}$ exists between the first copper bar 1003a and the shunt 1002, 1009, 1012, and another thermal $EMF_{2,3}$ exists between the shunt 1002, 1009, 1012 and the second copper bar 1003b. However, $EMF_{1,2}$ and $EMF_{2,3}$ are outside the measurement, and will not introduce error even when there is a first temperature difference $\delta T_1$. The measurement of potential difference $\delta V$ is made across resistance between the wires 1004a, 1004b or protrusions 1010a, 1010b, and is denoted $R^*_{shunt}$ to indicate that it is less than the total shunt resistance $R_{shunt}$ (as $\delta x < L$).

$EMF_{1,a}$ arises at the junction between the shunt 1002, 1009, 1012 and the first wire 1004a or first protrusion 1010a. $EMF_{1,a}$ may be negligible in the case of the first protrusion 1010a. $EMF_{1,b}$ arises at the junction between the first wire 1004a or first protrusions 1010a and the first conductive trace 1005a.

Similarly, $EMF_{2,a}$ arises at the junction between the shunt 1002, 1009, 1012 and the second wire 1004b or second protrusion 1010b. $EMF_{2,a}$ may be negligible in the case of the second protrusion 1010b. $EMF_{2,b}$ arises at the junction between the second wire 1004b or second protrusions 1010b and the second conductive trace 1005b.

A sensor module 1007 then measures $\delta V + EMF_{1,a} + EMF_{1,b} - EMF_{2,b} - EMF_{2,a}$, such that the thermal EMFs cancel out when there are no temperature asymmetries along the x axis. In practice this situation does not commonly arise, and there will be a first error component $ERR_1 = EMF_{1,a} - EMF_{2,a}$ which varies with the magnitude of the first temperature difference $\delta T_1$, and a second error component $ERR_2 = EMF_{1,b} - EMF_{2,b}$ which varies with the magnitude of the second temperature difference $\delta T_2$. As mentioned herein, the first error component $ERR_1$ may be minimized (to the point of being negligible) when the protrusions 1010a, 1010b are used. However, the inventors have realized that the second error component $ERR_2$ may remain significant enough to affect current sensing accuracy, due to high thermal conductance of the protrusions 1010a, 1010b.

As an example, for the second prior art busbar 1008, with a Manganin® second prior art shunt 1009, and parameters w=3.8 mm, l=3.6 mm, t=2.5 mm, $\delta x$ =22 mm (considered typical values), and assuming that the PCB 1006 was a PCB having a top two 35 μm copper layers separated by a 0.1 mm thick fiberglass (FR4) layer, the second temperature difference would be $\delta T_2 \approx 0.94 \delta T_1$.

Referring also to FIG. 6, the impact of unbalanced thermal EMF error $ERR_2$ on a current sensor is illustrated.

Meter qualification tests include requirements to measure a maximum current $I_{load} = I_{max}$, which generates heat in the busbar 1001, 1008, 1011, mainly in the shunt 1002, 1009, 1012, followed shortly thereafter by measuring a minimum current $I_{load} = I_{min}$. Temperature differences $\delta T_1$, $\delta T_2$ lead to measurement errors which, while relatively small at a maximum rated current $I_{max}$, are significant relative to the minimum current $I_{min}$ it is needed to measure.

The plot shown in FIG. 6 has a logarithmic current $I_{load}$ axis, and shows synthetic data for a current sweep starting at $I_{load} = 0.1$ A, ramping up in steps to $I_{load} = 200$ A, and then stepping back down to $I_{load} = 0.1$ A. The error bars represent Class C (0.5%) maximum permissible error (MPE) bars, in accordance with American National Standards Institute standard ANSI C12.32 in force as of December 2021. A leading circle and trailing arrow on each series indicates the sweep direction. A first profile 1014 (dashed line) corresponding to a 75 μOhm busbar 1008, simulating a material with a thermal EMF coefficient vs the copper of conductive traces 1005a, 1005b of 0.6 μV/K, for a first temperature difference of $\delta T_1 = 1.25°$ C. and $\delta T_2 \approx 1.17 \delta T_1$ for a thermal reduction factor (TRF) of 0.938. A second profile 1015 (solid line) shows the same profile, if the second temperature difference $\delta T_2$ could be reduced to $\delta T_2 = 0.1 \delta T_1$.

It may be observed that the first profile 1014 exceeds the desired error margins for low currents in the presence of a first temperature difference $\delta T_1$, whereas if the second temperature difference $\delta T_2$ can be relatively reduced when a first temperature difference $\delta T_1$ exists, the error may be reduced to acceptable levels.

The present specification outlines approaches which the inventors have found, alone or in combination, to provide reduced errors in the presence of temperature differences between measurement positions of a current busbar including a shunt for current measurements.

Improved Current Sensor for a DC Electric Meter

Current sensors according to the present invention are arranged to minimize thermal EMF errors incurred. Wires 1004a, 1004b are not used. Instead, the inventors realized that by making protrusions 1010 significantly longer and thinner, any temperature difference between the ends may be reduced more easily. The longer, thinner protrusions may also be routed to terminate closer to one another such that a thermal conductance between the ends may be increased more easily, or even thermally "shorted" using a thermal jumper. Other improvements shall be apparent from the descriptions of examples hereinafter.

Figure 7:
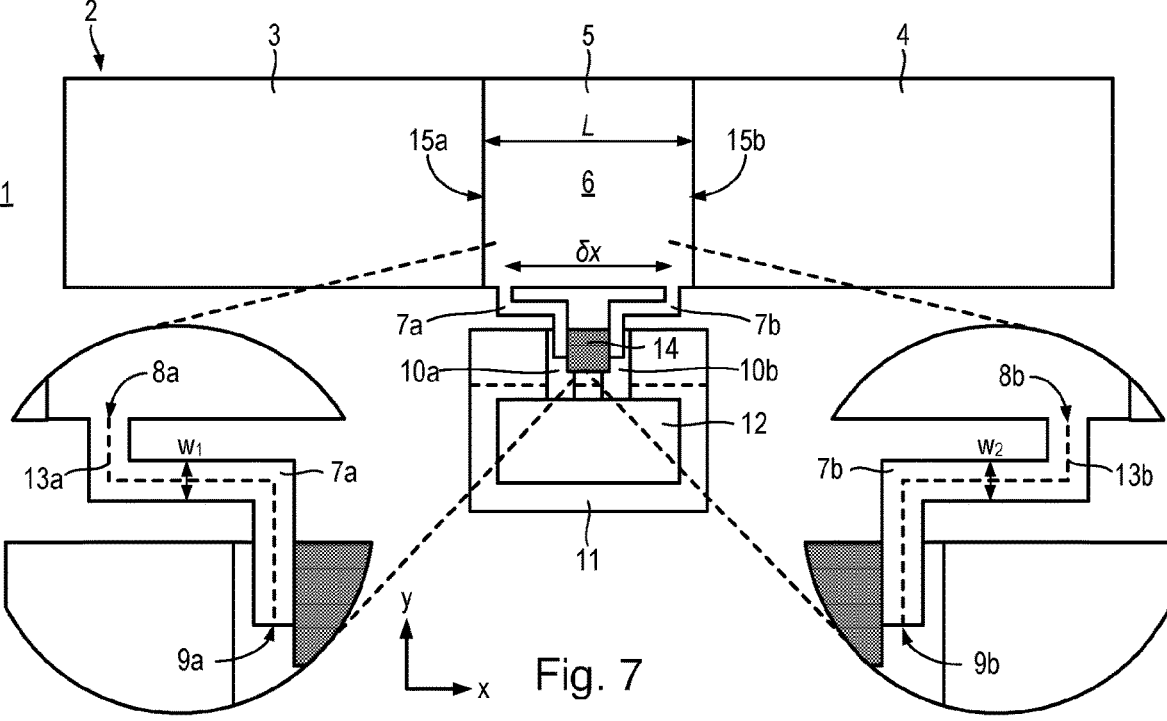
FIG. 7 is a schematic plan view of a current sensor for a DC electrical meter.

Referring also to FIG. 7, a current sensor 1 for a DC electrical meter is shown.

Figure 42:
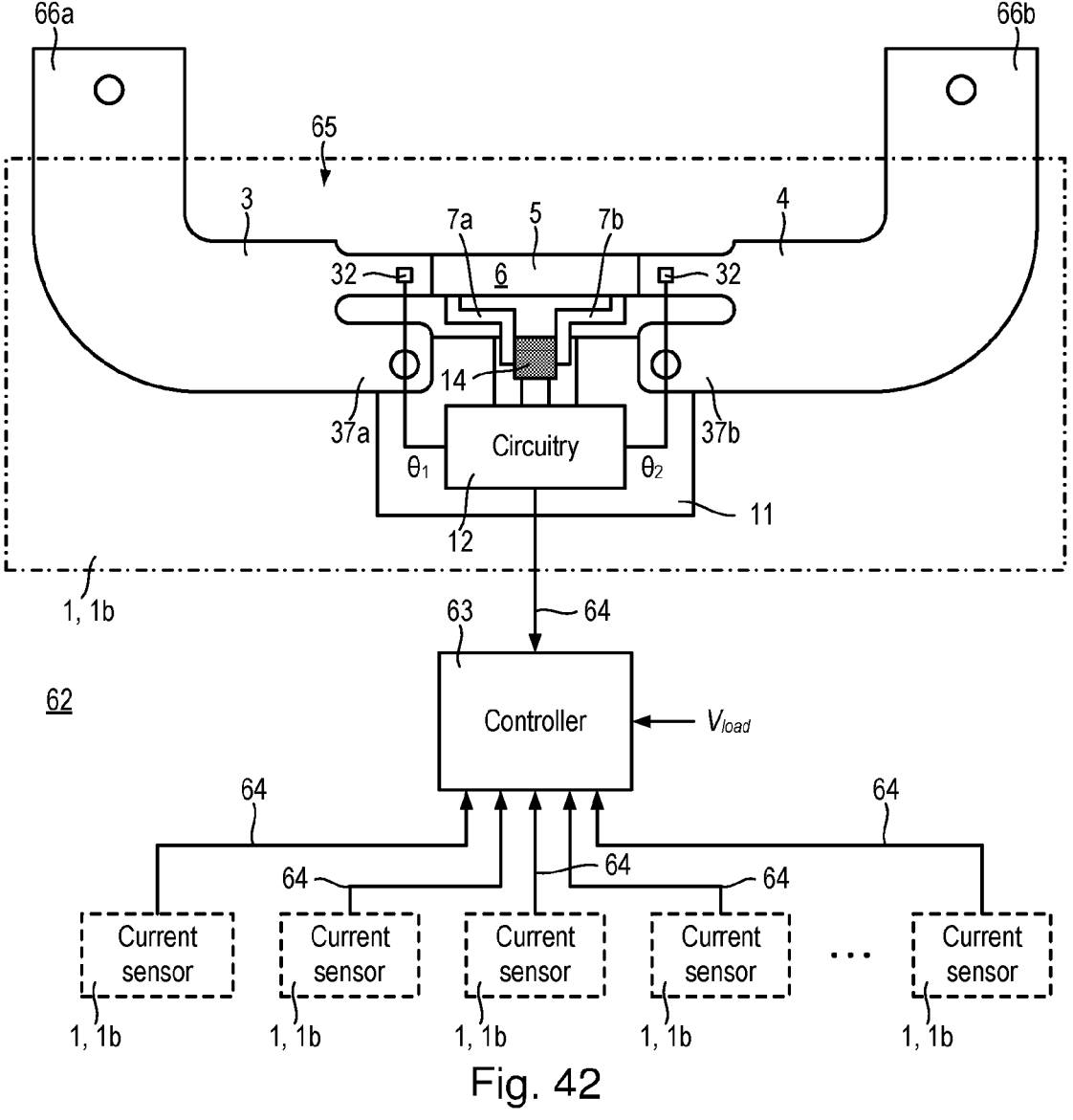
FIG. 42 is a schematic block diagram of a DC electrical meter.

The current sensor 1 may be integral to a DC electrical meter 62 (FIG. 42). In other words, the DC electrical meter 62 (FIG. 42) and current sensor 1 are contained in a single package. Alternatively, the DC electrical meter may be separate from the current sensor 1, and coupled to it via one or more wired or wireless links (not shown in FIG. 7).

The current sensor 1 includes a busbar connector 2 in the form of first part 3 connected to a third part 4 via a second part 5 (or "shunt"). A material forming the second part 5 has a temperature coefficient of electrical resistance which is less than a temperature coefficient of electrical resistance of materials forming the first 3 and third 4 parts respectively. For example, the second part 5 may be formed of a material having a temperature coefficient of electrical resistance of:
between 0 and $10 \times 10^{-6}$ K$^{-1}$ or 0 and $-10 \times 10^{-6}$ K$^{-1}$; or
between 0 and $20 \times 10^{-6}$ K$^{-1}$ or 0 and $-20 \times 10^{-6}$ K$^{-1}$;
for a temperature in a range between 20° C. and 50° C. Suitable materials for the second part 2 include metal alloys incorporating copper, nickel and manganese, for example Manganin®.

The second part 5 includes a main body 6 integrally formed with first 7a and second 7b connecting members. The main body 6 may be integrally formed with the first 7a and second 7b connecting members by, for example, cutting, etching, stamping or milling them from a single region of material (see also FIG. 43 for discussions of fabrication approaches). Each connecting member 7a, 7b has a respective proximal end 8a, 8b where it meets the main body 6, and a distal end 9a, 9b. Each of the distal ends 9a, 9b is electrically coupled to a respective conductive element 10a, 10b supported on a substrate 11 and coupled to circuitry 12 configured to measure a voltage $\delta V$ between the first and second connecting members 7a, 7b. In the example shown in FIG. 7, the conductive elements 10a, 10b take the form of conductive copper traces supported on a thermally conductive PCB substrate 11 (copper electrical traces on a thin insulating layer over a thermally conductive metal layer), though in general any conductive elements 10a, 10b and substrate 11 capable of providing mechanically stable connection to circuity 12 may be used.

The current carrying capacity of the busbar 2 is typically, but not exclusively, between 20 and 200 or more amps. For example, a maximum current carrying capacity of the busbar connector 2 may be at least 20 amps, preferably at least 50 amps, and more preferably at least 100 amps. The current carrying capacity of the busbar connector 2 may be 200 amps or greater. In some cases, the current carrying capacity of the busbar connector 2 may be 600 amps or greater. In some cases, the current carrying capacity of the busbar connector 2 may be 1000 amps or greater.

The current sensor 1, in particular the first and second connecting members 7a, 7b and their connections to the conductive elements 10a, 10b supported on the substrate 11, are configured such that when a first temperature difference $\delta T_1$ exists between the respective proximal ends 8a, 8b of the first and second connecting members 7a, 7b, a second temperature difference $\delta T_2$ between the respective distal ends 9a, 9b is less than or equal to 50% of the first temperature difference $\delta T_1$. Preferably, the second temperature difference $\delta T_2$ is as small a fraction as possible of the first temperature difference $\delta T_1$, ideally less than 10 to 20%. In other words, the distal ends 9a, 9b are arranged to be as isothermal as possible.

As explained hereinbefore, the first temperature difference $\delta T_1$ may result from a variety of sources such as, for example, Joule heating in the busbar connector 2 (and in particular the second part/shunt 5), heat fluxes between the first 3 and/or third part 4 and an exterior environment and/or connected part, and so forth.

One component which contributes to reducing the second temperature difference $\delta T_2$ compared to the first temperature difference $\delta T_1$ is that the connecting members 7a, 7b are made long and slender (high aspect ratio). In particular, the first connecting member 7a extends along a first path 13a between the proximal 8a and distal 9a ends. The first path 13a has a first length $s_1$, and at each point along the first path 13a, a first width $w_1$ of the first connecting member 7a is a largest perpendicular dimension of the first connecting member 7a at that point. The slender, high aspect ratio is provided, even for complex non-straight paths 13a, by configuring the total length $s_1$ to be greater than or equal to three times a maximum $\max(w_1)$ of the first width $w_1$ which occurs along the first path 13a. Similarly, the second connecting member 7b extends along a second path 13b between the proximal 8b and distal 9b ends, with a second length of $s_2$. At each point along the second path 13b, a second width $w_2$ of the second connecting member 7b is the largest perpendicular dimension of the second connecting member 7b at that point. The second connecting member 7b is configured so that the second length $s_2$ is greater than or equal to three times a maximum $\max(w_2)$ of the second width $w_2$ which occurs along the second path 13b. The first connecting member 7a, the second connecting member 7b and the main body 6 are preferably mirrored (symmetric) about a midline of the main body 6 parallel to the y-axis as illustrated (roughly perpendicular to current $I_{load}$ flow).

The long, elongated nature of the connecting members 7a, 7b means that the distal ends 9a, 9b of the first and second connecting members 7a, 7b are more thermally isolated from the proximal ends 8a, 8b (due to higher thermal resistance along the paths 13a, 13b). When thermal conductance between the first and second connecting members 7a, 7b via the substrate 11 is taken into account, this allows the distal ends 9a, 9b to be closer to isothermal with one another. Referring again to FIG. 5, this in turn reduces any asymmetry between corresponding EMFs $EMF_{1,b}$, $EMF_{2,b}$ at the interfaces of the first and second connecting members 7a, 7b with the respective conductive elements 10a, 10b. As a consequence, errors in the current $I_{load}$ calculated by the circuitry 12 are reduced.

The elongation of the first and second members 7a, 7b also provides relatively increased surface heat losses along the respective first and second paths 13a, 13b. Even without heat conduction via the substrate 11, such surface heat losses would cause the temperatures at the distal ends 9a, 9b to be closer to equilibrium with an ambient temperature (and hence closer to equilibrium with one another).

The elongation of the connecting members 7a, 7b does not introduce significant IR errors since the circuitry 12 has high electrical impedance, and the voltage difference $\delta V$ is relatively small, meaning that current I flow along the connecting members 7a, 7b is negligible.

In general, the first and second paths 13a, 13b may be straight or curved, or may include more complex shapes which are combinations of two or more straight/curved portions (see FIGS. 9 to 12 for some non-exhaustive examples). In the example shown in FIG. 7, the first and second paths 13a, 13b are shaped so that a distance between the distal ends 9a, 9b (parallel to the x-axis as illustrated) is less than the distance $\delta x$ between the proximal ends 8a, 8b (which is the length used for the measurement of $\delta V$). Specifically, each of the first and second paths 13a, 13b in the example of FIG. 7 includes a straight section extending from the main body 6 parallel to the y-axis as illustrated, connecting at a 90° bend to a straight section extending parallel to the x-axis as illustrated, before a second 90° bend to a final straight section extending from the main body 6 parallel to the y-axis as illustrated and terminating at the respective distal end 9a, 9b.

The circuitry 12 may include, or take the form of, a suitably programmed microcontroller, a field programmable gate array, an application specific integrated circuit, or any similar circuitry 12 configured to infer a current $I_{load}$ passing through the busbar connector 2 based on a potential difference $\delta V$ between the first and second connecting members 7a, 7b. In some examples, the circuitry 12 may all be localized and supported on the substrate 11, as shown in FIG. 7. Alternatively, the circuity 12 may be distributed, with only the elements needed to measure the potential difference $\delta V$ being supported directly on the substrate 11. One example of suitable circuitry is described in WO 2020/157477 A1 (US 2022/0091167 A1), for example as shown in FIGS. 1 and/or 6 of that document.

The DC electrical meter 62 (FIG. 42) may be mounted on the ground part of a monitored/metered load. For example, one end of the busbar connector 2 may be connected to ground, i.e. at o volts potential. Alternatively, the DC electrical meter 62 (FIG. 42) may be connected on the high voltage side of the monitored/metered load, and the voltages may be 200 VDC, 600 VDC, 1,000 VDC, 1,500 VDC, or greater. The DC electrical meter 62 (FIG. 42) will additionally measure the voltage difference which is combined with the current $I_{load}$ measurements discussed herein to calculate power. The measurement of a voltage $V_{load}$ across the monitored/metered load is not substantially modified in the present specification, and for reasons of brevity the details thereof will not be discussed extensively.

The first part 3 and the third part 4 may be formed of different materials, but are preferably formed of the same material. The material for the first and third parts 3, 4 should prioritize electrical conductivity, for example any copper alloy known for use as an electrical conductor.

Equivalent Thermal Circuit

An alternative way to view the invention is that the first and second connecting members 7a, 7b, in combination with the substrate 11, are configured so that thermal conductance between the distal ends 9a, 9b (not via the main body 6) is comparable to, or preferably higher, than the thermal conductance between each distal end 9a, 9b and the respective proximal end 8a, 8b. In this way, while the first temperature difference $\delta T_1$ may be maintained by heat generation in the main body 6 and/or heat fluxes into/out of the first and third parts 3, 4, the associated second temperature difference $\delta T_2$ will be relatively reduced by a significant fraction.

Figures 8, 9, 10, 11, 12:
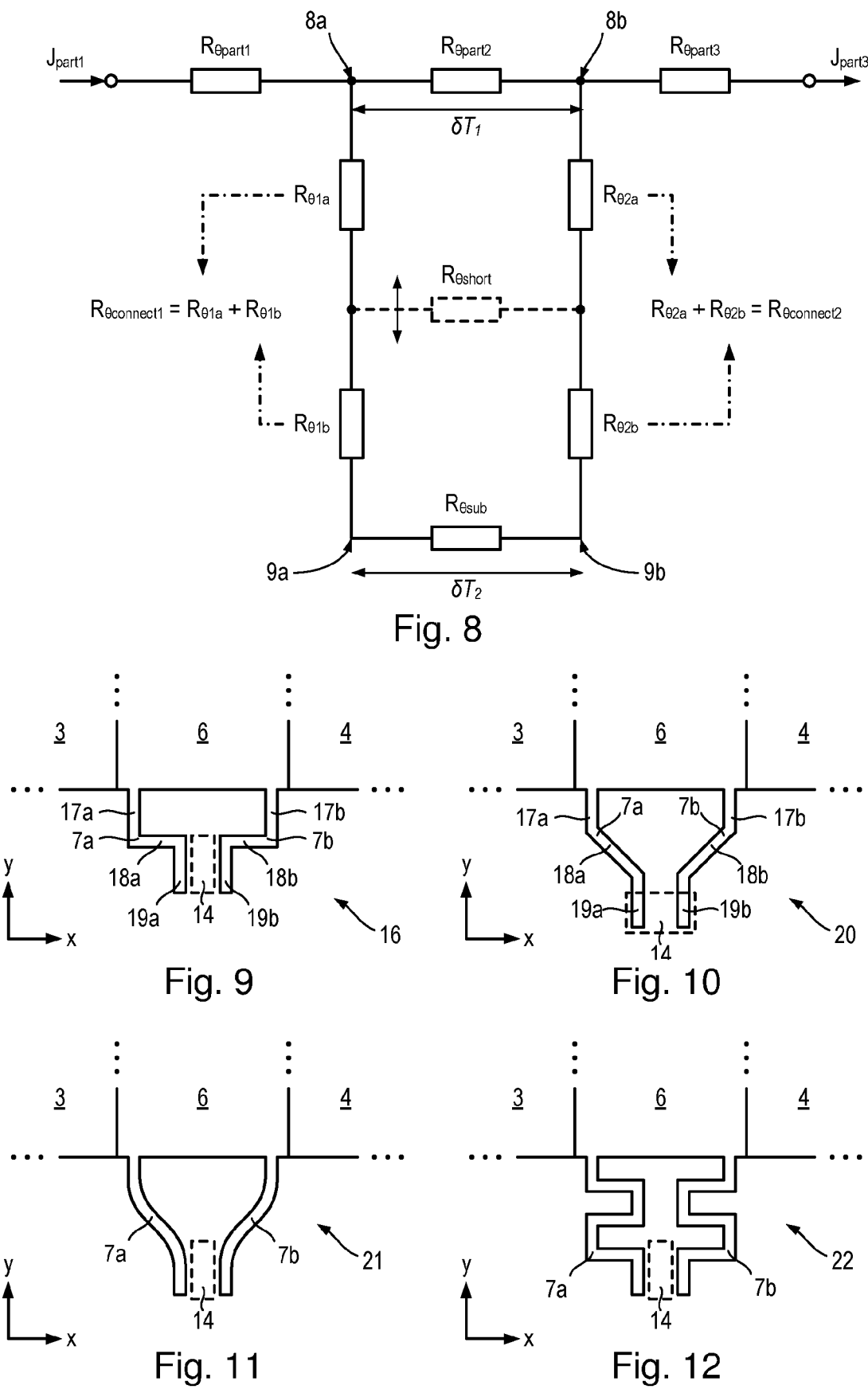
FIG. 8 is a simplified thermal equivalent circuit of a portion of the current sensor shown in FIG. 7.
FIG. 9 illustrates a first example configuration of connecting members of a current busbar.
FIG. 10 illustrates a second example configuration of connecting members of a current busbar.
FIG. 11 illustrates a third example configuration of connecting members of a current busbar.
FIG. 12 illustrates a fourth example configuration of connecting members of a current busbar.

Referring also to FIG. 8, a thermal equivalent circuit for the relevant portion of the current sensor 1 is shown.

The thermal resistances of the first, second and third parts 3, 5, 4 are respectively $R_{\theta part1}$, $R_{\theta part2}$ and $R_{\theta part3}$, and together with heat fluxes $J_{part1}$, $J_{part3}$ and Joule heating (primarily, but not exclusively, in the main body 6 ($I_{load}$)$^2R_{shunt}$), these determine (in the ideal case) the first temperature difference $\delta T_1$.

Ignoring for the purposes of this discussion surface losses from the connecting members 7a, 7b (and noting that such will only ever decrease the second temperature difference $\delta T_2$), denote a thermal resistance between the proximal 8a and distal 9a ends of the first connecting member 7a as $R_{\theta connect1}$, and denote a thermal resistance between the proximal 8b and distal 9b ends of the second connecting member 7b as $R_{\theta connect2}$.

Denoting the thermal resistance between the distal ends of connecting members 7a, 7b via the conductive elements 10a, 10b and substrate 11 as $R_{\theta sub}$, we can approximate the second temperature difference as a constant thermal reduction factor, TRF, times the first temperature difference $\delta T_1$:

$$\delta T_2 = \frac{R_{\theta sub}}{R_{\theta connect1} + R_{\theta sub} + R_{\theta connect2}} \delta T_1 = TRF \times \delta T_1 \qquad (4)$$

From which it is apparent that if the thermal resistances of connecting members 7a, 7b are equal (as is preferable) $R_{\theta connect1} = R_{\theta connect2}$, then $\delta T_2 = 0.5 \delta T_1$ when the thermal resistance through the substrate $R_{\theta sub}$ is approximately $\frac{2}{3}$ the value of the thermal resistance $R_{\theta connect1} = R_{\theta connect2}$ along either connecting members 7a, 7b. The thermal resistance $R_{\theta sub}$ via the substrate 11 may be reduced by using a power electronic substrate or circuit board, such as, for example, a direct bonded copper substrate, an active metal brazed substrate, an insulated metal substrate (IMS), and so forth. The thermal resistance $R_{\theta sub}$ via the substrate 11 may be further reduced by shortening the path length via the substrate 11, for example by bringing the distal ends 9a, 9b closer together.

The thermal resistance $R_{\theta sub}$ via the substrate 11 may also be reduced, though by a relatively smaller amount, by increasing a contact area between the connecting members 7a, 7b and the conductive elements 10a, 10b and/or by enlarging the areas of conductive elements 10a, 10b. The effects of the insulation and its thickness tend to dominate, and are not readily controllable.

Finally, the ratio of thermal resistance $R_{\theta sub}$ via the substrate 11 to thermal resistance $R_{\theta connect1} = R_{\theta connect2}$ along either connecting members 7a, 7b may also be readily controlled by making the connecting members 7a, 7b longer and/or reducing their cross-sectional area (i.e. the long, thin shapes as shown herein).

Thermal Jumper

Shortening the path length via the substrate 11 also makes it easier to couple a thermal jumper 14 between the first and second connecting members 7a, 7b. The thermal jumper 14 provides a "short circuit" thermal resistance $R_{\theta short}$ in parallel with the thermal resistance $R_{\theta sub}$ via the substrate 11, and typically may be one or more orders of magnitude lower than the thermal resistance $R_{\theta sub}$ via the substrate 11.

A thermal jumper 14 is a component which is electrically insulating, yet which has high thermal conductance. For example, a block of aluminum nitride or comparable material. Thermal jumpers 14 typically (though not essentially) have metallized end regions to allow connection to circuit elements, in this case conductive elements 10a, 10b, by soldering, brazing, welding and so forth. This may help to minimize contact thermal resistances. Additionally or alternatively, thermal grease, thermal compound (or similar products) may be applied to increase thermal conductance between the connecting members 7a, 7b via a thermal jumper 14.

The low thermal resistance $R_{\theta short}$ and finite size of a thermal jumper 14 means that only a fraction of the thermal resistances $R_{\theta connect1}$, $R_{\theta connect2}$ along either connecting members 7a, 7b are not shorted by the thermal jumper 14. For example, as illustrated in FIG. 8, a fraction $R_{\theta 1a}$, of $R_{\theta connect1}$ connects the proximal end 8a to the start of the thermal jumper 14, and similarly on the second connecting member 7b. The net thermal resistance is then dominated by the thermal jumper 14, i.e. thermal resistance $R_{\theta short}$ is connected in parallel with the sum of residual thermal resistances $R_{\theta 1b}$, $R_{\theta 2b}$, and the thermal resistance $R_{\theta sub}$ via the substrate 11.

The thermal jumper 14 does not need to be positioned at or close to the distal ends 9a, 9b to be effective, provided the thermal resistance $R_{\theta short}$ is comparatively low. The thermal jumper 14 may be connected at any point along the first and second connecting members 7a, 7b.

The general case may be approximated in terms of a thermal bypass path $R_{\theta bypass}$ which couples a region of the first connecting member 7a to a region of the second connecting member 7b, without passing via the second part 5.

In the simplified thermal circuit of FIG. 8, the thermal bypass path $R_{\theta bypass}$ would be the thermal resistance $R_{\theta sub}$ via the substrate 11 when there is no thermal jumper 14, and when a thermal jumper 14 is included:

$$\frac{1}{R_{\theta bypass}} = \frac{1}{R_{\theta short}} + \frac{1}{R_{\theta 1b} + R_{\theta sub} + R_{\theta 2b}} \tag{5}$$

Thus, the thermal bypass path $R_{\theta bypass}$ includes at least heat flows via the substrate 11 (and potentially also via the circuitry 12), and when included, heat flows via the thermal jumper 14.

A first thermal path having a first thermal resistance $R_{\theta 1a}$ runs via the first connecting member 7a between the thermal bypass path $R_{\theta bypass}$ and the proximal end 8a of the first connecting member 7a. Similarly, a second thermal path having a second thermal resistance $R_{\theta 2a}$ runs via the second connecting member 7b between the thermal bypass path $R_{\theta bypass}$ and the proximal end 8b of the second connecting member 7b. The thermal bypass path $R_{\theta bypass}$ is electrically insulating. The bypass thermal resistance $R_{\theta bypass}$ should be is less than either of the first and second thermal resistances $R_{\theta 1a}$, $R_{\theta 2a}$. The second temperature difference $\delta T_2$ may then be approximated as:

$$\delta T_2 = \frac{R_{\theta bypass}}{R_{\theta 1a} + R_{\theta bypass} + R_{\theta 2a}} \delta T_1 \tag{6}$$

The thermal bypass path $R_{\theta bypass}$ preferably corresponds to the closest spacing between the first and second connecting members 7a, 7b. The thermal bypass path $R_{\theta bypass}$ may connect regions of the first and second connecting members 7a, 7b extending to the respective distal ends, as shown in FIG. 7. Alternatively, the thermal bypass path $R_{\theta bypass}$ may connect regions of the first and second connecting members 7a, 7b which do not extend to the respective distal ends 9a, 9b (see also FIG. 13). The thermal resistance $R_{\theta short}$ is typically the smallest component such that it dominates the thermal bypass path $R_{\theta bypass}$.

For the example shown in FIG. 7, with a Manganin® second part 5, with the connecting members 7a, 7b having a constant cross section of $w_1 = w_2 = 0.8$ mm, $t = 0.5$ mm, $s_1 = s_2 = 9$ mm, and the distal ends 9a, 9b brought to a spacing of 1.7 mm (center-center), and assuming that the substrate 11 is a thermal PCB having copper clad with 0.1 mm thick fiberglass, the second temperature difference would be $\delta T_2 \approx 0.23 \delta T_1$ (23%) Adding a thermal jumper 14 with value $R_{\theta short} = 19$ K/W would reduce the second temperature difference still further, to $\delta T_2 \approx 0.013 \delta T_1$ (1.3%).

Configuration of the Thermal Jumper

When included, the thermal jumper 14 may be arranged relative to the connecting members 7a, 7b and substrate 11 in any way which allows efficient thermal contact.

For example, the thermal jumper 14 may be placed between (co-planar) the first and second connecting members 7a, 7b as illustrated in FIG. 7.

Alternatively, the respective distal ends 9a, 9b of the first and second connecting members 7a, 7b may be sandwiched between (in the thickness direction z) the thermal jumper 14 and the substrate 11. In other words, the thermal jumper 14 may rest on top surfaces of the first and second connecting members 7a, 7b.

In other examples, metallizations of the ends of the thermal jumper 14 may provide the conductive elements 10a, 10b to which the first and second connecting members 7a, 7b are attached, and may be additionally coupled to conductive traces on the substrate 11. In other words, the thermal jumper 14 may be sandwiched between (in the thickness direction z) the first and second connecting members 7a, 7b and the substrate 11.

Avoidance of Weld Affected Zones

Referring again to FIG. 7, in busbar connector 2, the first part 3 will typically be coupled to the second part 5 by a first weld 15a and the second part 5 will typically be coupled to the third part 4 by a second weld 15b. The welds may have a width of approximately 0.3 mm, or approximately 0.5 mm or approximately 1 mm. If welds 15a, 15b are not used, then other processes involving raised temperatures are likely. In any event, there will be a zone either side of the weld (or other joint) which is affected by the welding process. Herein, the affected zone associated with, for example a weld 15a, 15b, refers to a zone either side of the weld 15a, 15b within which there are observable differences compared to the respective bulk material in one or more of: material composition, porosity, inclusions, grain sizes and/or orientations, precipitate sizes and/or density, phase fractions versus the untreated Manganin® alloy.

The proximal end 8a of the first connecting member 7a should preferably be as close as possible to the first part 3 without overlapping an affected zone of the first weld 15a. Similarly, the proximal end 8b of the second connecting member 7a should preferably be as close as possible to the third part 4 without overlapping an affected zone of the second weld 15b. This allows maximizing $\delta x/L$.

In general, the shapes of paths 13a, 13b for the connecting members 7a, 7b are not particularly restricted.

First Example Configuration of Connecting Members

Referring also FIG. 9 a first example configuration 16 of connecting members 7a, 7b is shown (hereinafter the "first configuration").

The first configuration 16 is useable in the busbar connector 2 and is broadly the same as that shown in FIG. 7 except for the relative lengths of the straight sections.

Each of the first and second connecting members 7a, 7b (and associated paths 13a, 13b) includes a first straight section 17a, 17b extending from the main body 6 parallel to the y-axis as illustrated, connecting at a 90° bend to a second straight section 18a, 18b extending parallel to the x-axis as illustrated, before a second 90° bend to a third straight section 19a, 19b extending from the main body 6 parallel to the y-axis as illustrated and terminating at the respective distal end 9a, 9b.

In the general case, the relative lengths of the first 17a, 17b, second 18a, 18b, and third 19a, 19b sections need not be particularly restricted, subject to the hereinbefore described considerations to cause the overall lengths $s_1$, $s_2$ to correspond to sufficiently large thermal resistances $R_{\theta 1a}$ and $R_{\theta 2a}$.

Optionally, a thermal jumper 14 may be included, in any of the relative positions described herein.

Second Example Configuration of Connecting Members

Referring also FIG. 10 a second example configuration 20 of connecting members 7a, 7b is shown (hereinafter the "second configuration").

The second configuration 20 is useable in the busbar connector 2 and is the same as first configuration 16 except that the second sections 18a, 18b are not angled at 90° to the first 17a, 17b and third 19a, 19b sections.

In a modification of the second configuration, the first 17a, 17b sections and/or the third 19a, 19b sections may be omitted. In other words, each connecting member 7a, 7b may take the form of a single, angled straight section between the proximal 8a, 8b and distal 9a, 9b ends. The single, straight section may make any angle up to 90° with edge of the main body 6 from which it extends. Angles less than 90° may be preferable to reduce the length of a thermal path via the substrate 11 and/or to make it easier to thermally short the connecting members 7a, 7b using a thermal jumper 14.

Optionally, a thermal jumper 14 may be included, in any of the relative positions described herein.

Third Example Configuration of Connecting Members

Referring also FIG. 11 a third example configuration 21 of connecting members 7a, 7b is shown (hereinafter the "third configuration").

The third configuration 21 is useable in the busbar connector 2, and is the same as third configuration 20, except that instead having well-defined sections, each connecting member 7a, 7b is formed a single, continuous sigmoid-shaped curve. Modifications to use other types of curves would not be expected to affect the functions as described herein.

Optionally, a thermal jumper 14 may be included, in any of the relative positions described herein.

Fourth Example Configuration of Connecting Members

Referring also FIG. 12 a fourth example configuration 22 of connecting members 7a, 7b is shown (hereinafter the "fourth configuration").

The fourth configuration 22 is useable in the busbar connector 2 and is similar to the first to third configurations 16, 20, 21 except for the shape of connecting members 7a, 7b. In the fourth configuration, each connecting member 7a, 7b has a serpentine configuration. Although a serpentine configuration composed of multiple straight sections is illustrated in FIG. 12, in other examples a serpentine configuration may be take the form of a single, continuous curve (for example sinusoidal or similar).

The first to fourth configurations 16, 20, 21, 22 represent non-exhaustive examples, and many further specific configurations of connecting members 7a, 7b are possible which are also consistent with the principles described herein for reducing the relative magnitude of the second temperature difference $\delta T_2$. For example, straight connecting members 7a, 7b extending at a 90° angle may be used, in combination with a sufficiently low thermal resistance jumper 14.

Optionally, a thermal jumper 14 may be included, in any of the relative positions described herein.

Thermal Jumper Part-Way Along Connecting Members

As mentioned hereinbefore, when a thermal jumper 14 is included, it need not be positioned to couple between distal ends 9a, 9b of the connecting members 7a, 7b.

Figure 13:
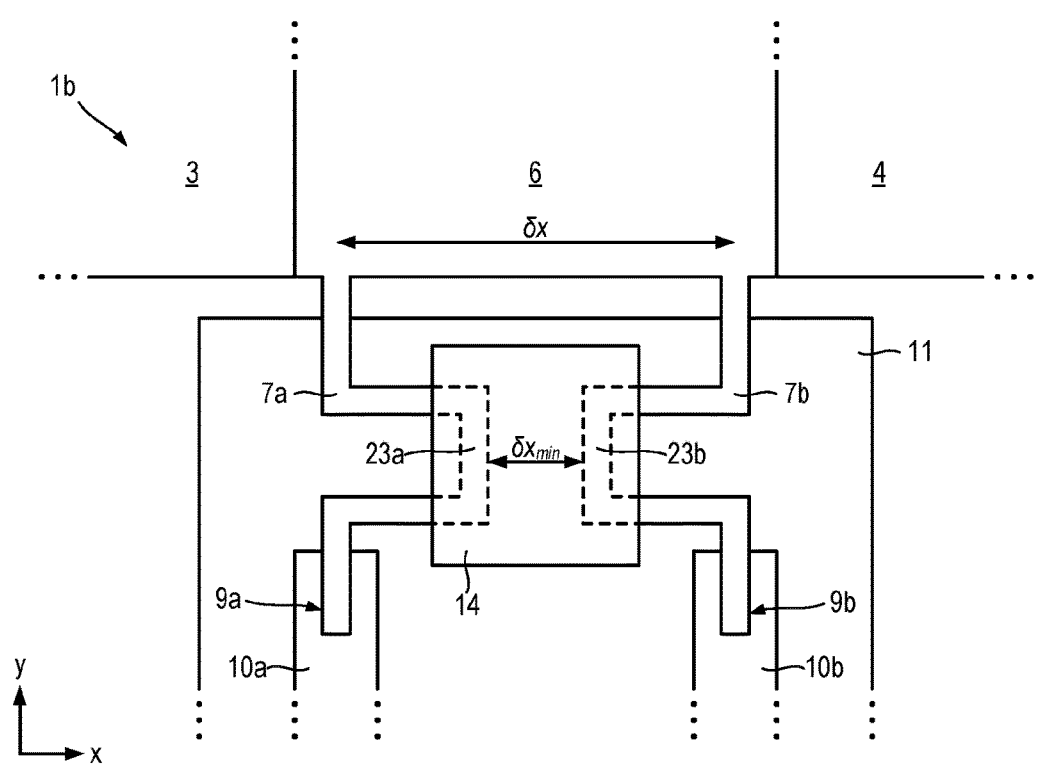
FIG. 13 is a schematic plan view of a portion of a modified current sensor for a DC electrical meter.

For exampling, referring also to FIG. 13, a portion of a modified current sensor 1b is shown, focussing on the coupling of the connecting members 7a, 7b to the conductive elements 10a, 10b.

The modified current sensor 1b implements the fourth, serpentine, configuration 22 type. While the proximal 8a, 8b and distal ends 9a, 9b are equally spaced a distance $\delta x$ apart, respective loop segments 23a, 23b of the serpentine connecting members 7a, 7b come to a closest approach of $\delta x_{min}$ partway along the respective paths 13a, 13b. A thermal jumper 14 is placed over, and bonded to, the loop segments 23a, 23b, providing the thermal bypass path $R_{\theta bypass}$ (at least, substantially dominating it).

In this way, the distal ends 9a, 9b are substantially isolated from the first temperature difference $\delta t_1$, while also being widely spaced to provide more space to implement the connections to the respective conductive elements 10a, 10b.

Physical Protection of the Connecting Members

As described herein, the connecting members 7a, 7b according to the present specification serve to reduce thermal EMF errors in a current sensor. However, the long, thin connecting members 7a, 7b used may also be more susceptible to inadvertent mechanical deformation during production, handling and/or installation of the current busbar connector 2.

Figure 14:
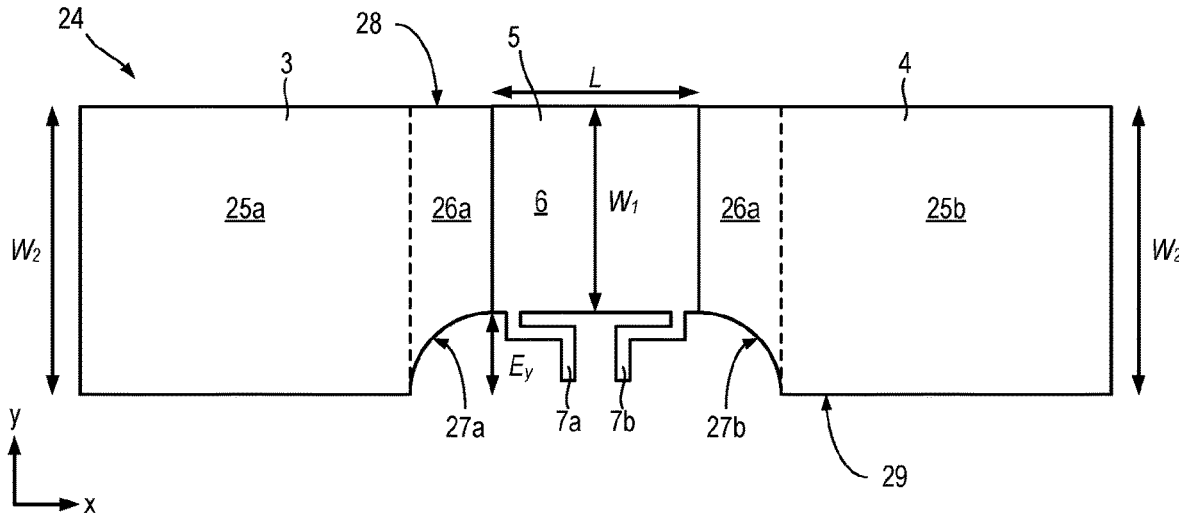
FIG. 14 is a schematic plan view of a second busbar connector.

Referring also to FIG. 14, a second busbar connector 24 is shown.

The second busbar connector 24 differs from the first busbar connector 2 only in the shapes of the first and third parts 3, 4.

As before, the main body 6 of the second part 5 has a length L along a first direction (x-axis as illustrated) between the first and third parts 3, 4, a width $W_1$ along a second direction (y-axis as illustrated), and a thickness t along a third direction (z-axis out of the plane of the illustration. The first and second connecting members 7a, 7b extend away from the main body 6 with a component parallel to the second direction (y-axis as illustrated). The component parallel to the width $W_1$ is labelled $E_y$ in FIG. 14.

To protect the first and second connecting members 7a, 7b from inadvertent mechanical deformation, the first and third parts 3, 4 each have a maximum width $W_2$ along the second direction (y-axis as illustrated) which is large enough that neither of the first and second connecting members 7a, 7b projects beyond the width $W_2$ of the first and third parts 3, 4. In other words, $W_1 + E_y \le W_2$.

In this way, the extended widths $W_2$ of the first and third parts 3, 4 provide physical protection to the more delicate first and second connecting members 7a, 7b during fabrication, handling and/or assembly processes. In effect, the connecting members 7a, 7b are defined within a cut-out of the second busbar connector 24.

The first part 3 and the third part 4 include respective full width sections 25a, 25b away from the second part 5, and respective reduced width sections 26a, 26b coupled to the second part 5. The transition between reduced width 26a, 26b and full width 25a, 25b sections of the first and/or third parts 3, 4 may have a gradual, curving profile 27a, 27b as shown in FIG. 14.

Alternatively, the transition between reduced width 26a, 26b and full width 25a, 25b sections of the first and/or third parts 3, 4 may have a step profile, an angled profile, and so forth.

As illustrated in FIG. 14, the reduced width sections 26a, 26b may be flush with the full width sections 25a, 25b along a first side 28 of the first and/or third parts 3, 4. In other words, the reduced width sections take the form of a cut-out from the opposite, second side 29 of the first and/or third parts 3, 4.

Alternatively, the reduced width sections 26a, 26b need not be flush with the full width sections 25a, 25b on either side 28, 29 of the first and/or third parts 3, 4. In other words, the reduced width sections 26a, 26b may take the form of cut-outs from both sides 28, 29 of the first and/or third parts 3, 4.

Figure 15:
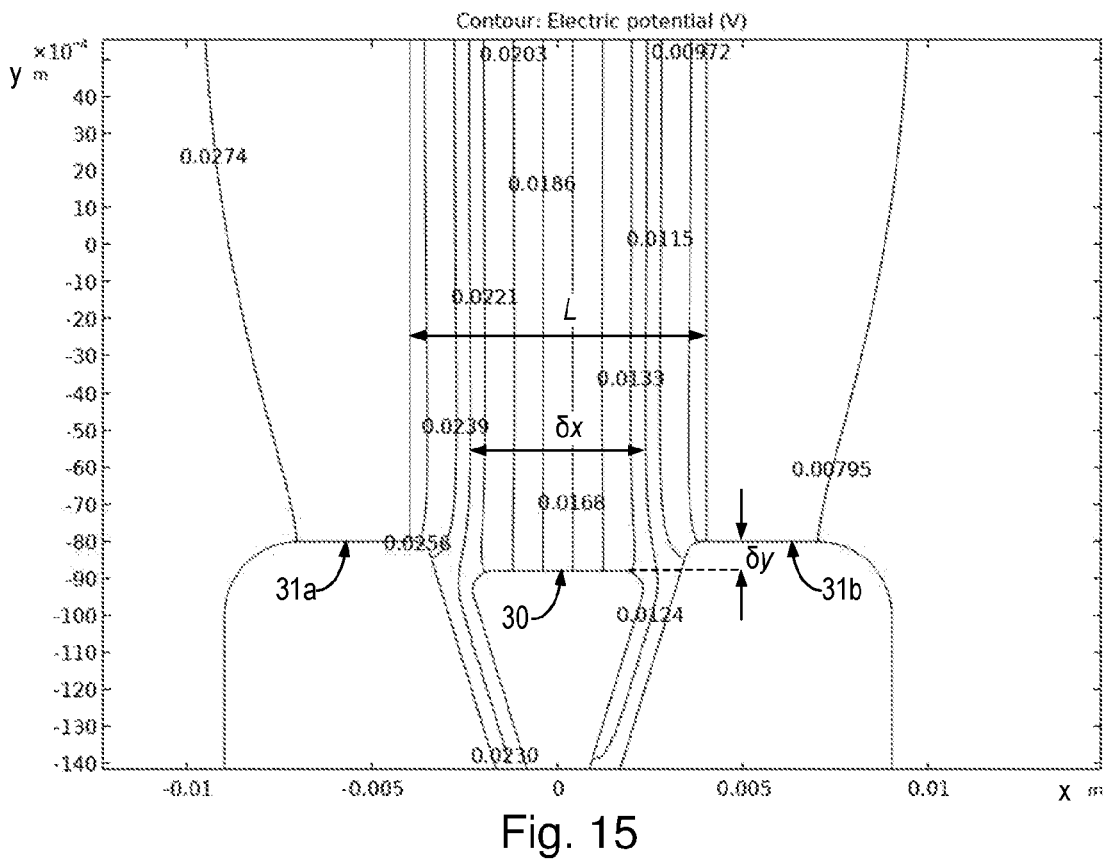
FIGS. 15 and 16 plot contours of electrical potential V calculated for examples of the second busbar connector.
Figure 16:
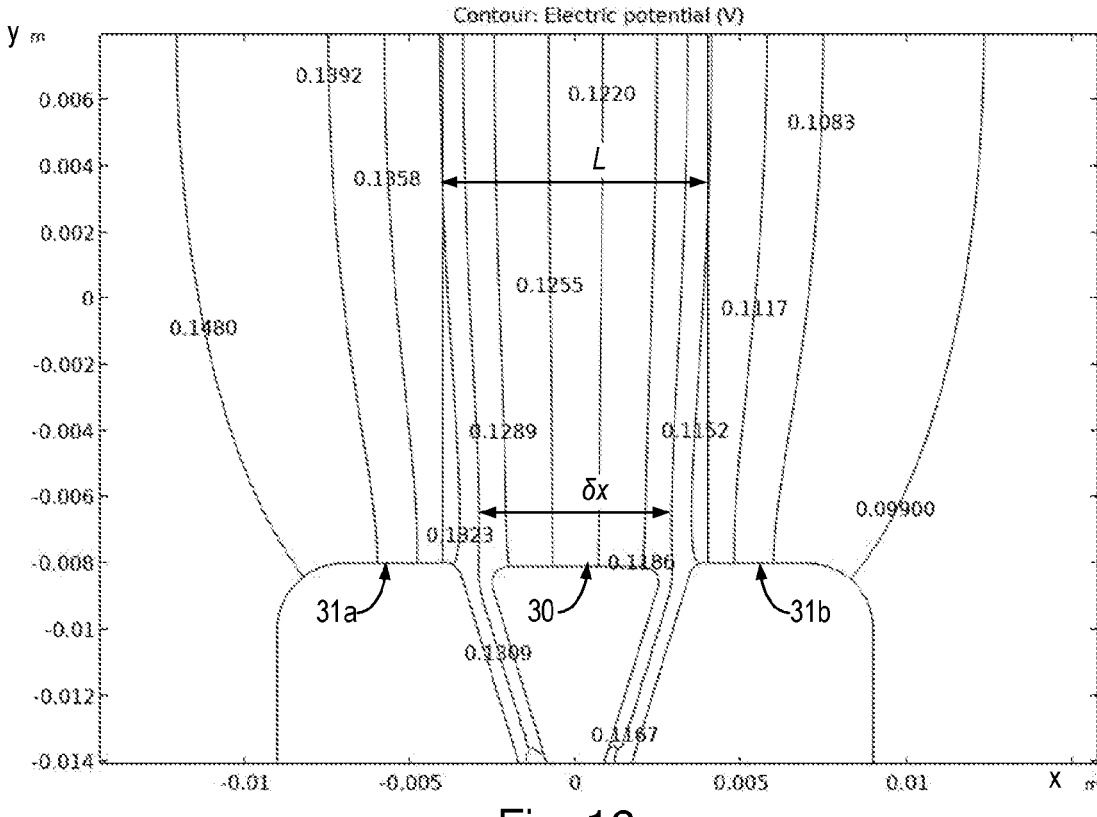

Referring also to FIGS. 15 and 16, contours of electrical potential V calculated for examples of the second busbar connector 24 are shown.

The contours of electrical potential V were calculated using Finite Element Analysis (FEA) calculations, performed using Comsol multiphysics (version 5.6.0.341). The thermal conductivity of Manganin® forming the second part 5 was assigned the value 2 W·mK$^{-1}$.

The FIG. 15 example and the FIG. 16 example are both examples of the second configuration 20, with the first 17 and third 19 sections omitted. The FIG. 15 example has an edge 30 of the main portion 6 between the connecting members 7a, 7b which is not flush with the outer edges 31a, 31b of the main portion. The offset is labelled $\delta_y$ in FIG. 15. By contrast, the FIG. 16 example has the interior edge 30 flush with the outer edges 31a, 31b of the main portion 6.

In each of FIGS. 15 and 16, the voltage contours extending into the connecting members 7a, 7b are used as endpoints for the distance $\delta x$. A first observation, which is applicable to both the busbar connector 2 and the second busbar connector 24, is that having the edge 30 offset from the edges 31a, 31b (i.e. not flush), distorts the voltage contours so as to reduce the relative fraction $\delta x/L$. In the FIG. 15 example, $\delta x/L \approx 0.59$, whereas for the FIG. 16 example $\delta x/L \approx 0.72$. Therefore, the edge 30 of the main portion 6 between the connecting members 7a, 7b should preferably (though not essentially) be flush with the outer edges 31a, 31b. This does not affect accuracy directly but may help to increase the size of the signal $\delta V$ being measured.

A second observation is specific to the second busbar connector 24 (FIG. 14). In the busbar connector 2 (FIG. 7), the consistent width W all along the busbar connector 2 means that current density j will be substantially uniform into, and out of, the second part 5. However, it may be observed from FIGS. 15 and 16 that the transition between full width 25a, 25b sections and reduced width sections 26a, 26b leads to concentration of voltage contours (and hence current density j), so that current density j into, and out of, the second part 5 are no longer uniform.

While the material of the second part 5 (typically Manganin®) does not exhibit significant changes in resistance with temperature, the materials of the first and third parts 3, 4 (typically copper) does. The result of this is that in addition to current density j into, and out of, the second part 5 being non-uniform, the precise non-uniformity is expected to exhibit a temperature dependence.

One way to mitigate such issues is to include one or more temperature sensors 29 (FIG. 42) coupled to the circuitry 12. One suitable type of temperature sensor would be thermocouples. For example, one temperature sensor 32 (FIG. 42) may be coupled to the first part 3 and another temperature sensor 32 may be coupled to the second part 4. The circuitry may then be configured to perform temperature dependent sensitivity corrections to measured currents $I_{load}$ based on temperatures measured by the temperature sensors 32 (FIG. 42).

Additionally or alternatively to implementing temperature dependent sensitivity corrections in the circuitry 12, the shapes and configurations of the first and third parts 3, 4 may be optimized in order to promote uniformity of current densities, and thereby to minimize sensitivity variations of the current sensor with temperature. In particular, by varying a relative distance $L_{con}$ over which the reduced width sections 26a, 26b have constant width $W_1$, relative to the difference in widths $W_2-W_1$. Other factors thought to affect temperature dependent sensitivity are discussed hereinafter. Sensitivity corresponds to units of potential difference (in volts V) per unit current (in amps A) passing through the busbar connector 24.

Figure 17:
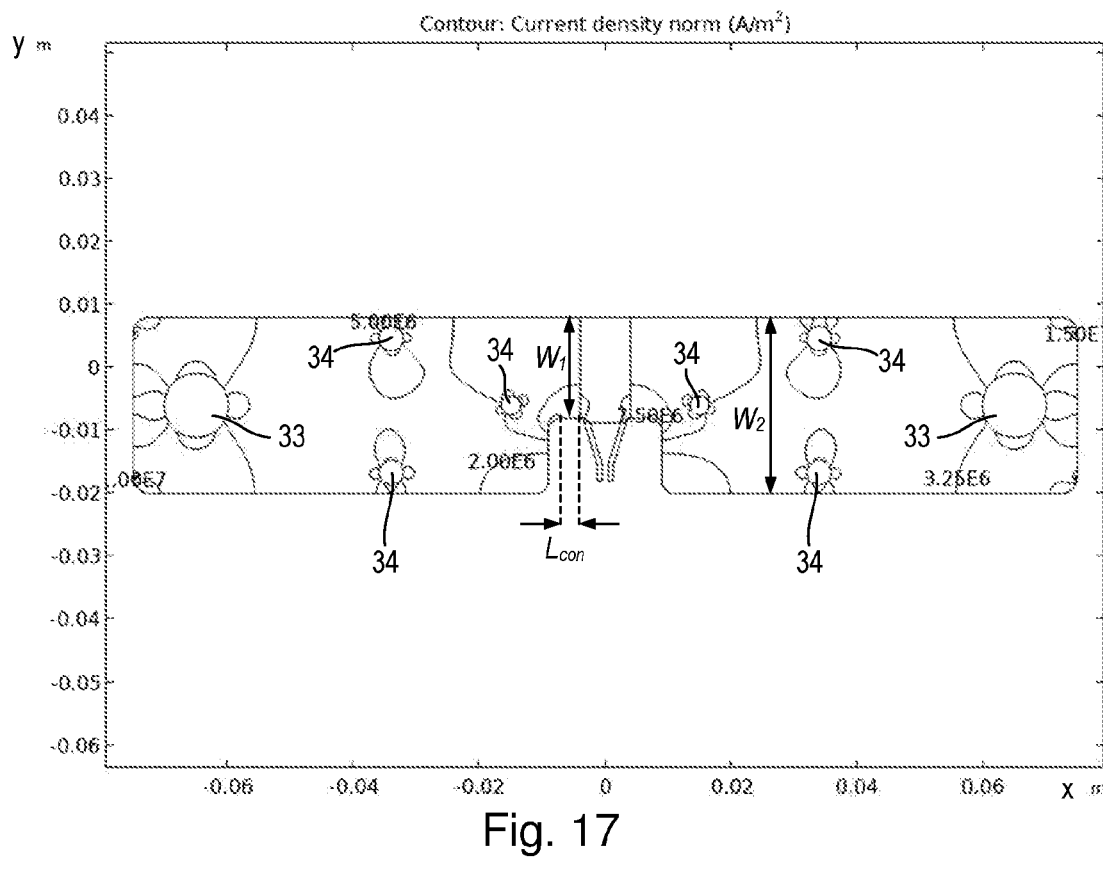
FIGS. 17 and 18 plot contours of current density, j, calculated for an example of the second busbar connector.
Figure 18:
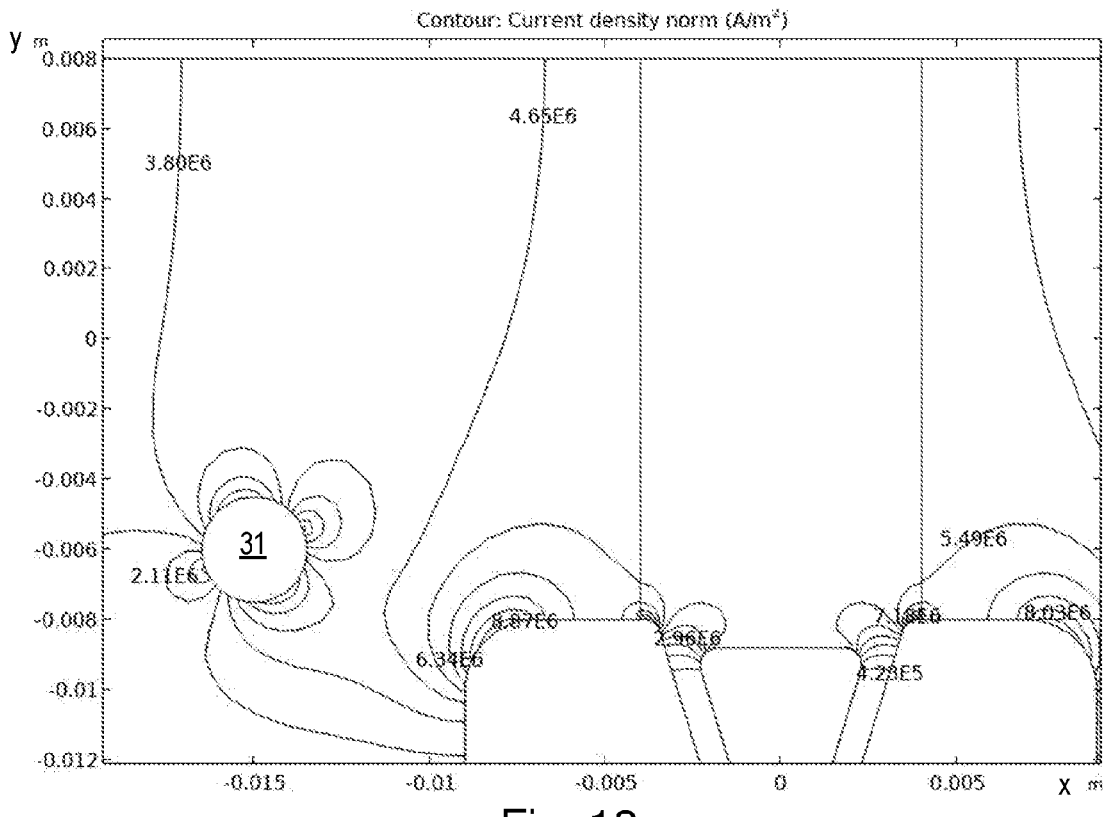

Referring also to FIGS. 17 and 18, contours of current density, j, calculated for an example of the second busbar connector 24 are shown. FIG. 18 is a zoomed in region of FIG. 17. The calculations were the same as for FIGS. 15 and 16, the only difference being the specific shapes of the parts 3, 4, 5 modelled, and the output variable being current density j instead of voltage.

The FIG. 17/18 example is an example of the second busbar connector 24 (FIG. 14), with the connecting members 7a, 7b generally in accordance with the second configuration 20 (FIG. 10) having the first sections 17a, 17b omitted.

Although not shown in the preceding examples for visual clarity, busbar connector 2, 24 may also include connection through-holes 33 used for electrical connections of the busbar connector 2, 24, and also mounting through holes 34 used for mechanically securing the busbar connector 2, 24 to the substrate 11 and/or other structures of the current sensor 1, 1b and/or an electrical meter including the current sensor 1, 1b. Through-holes 33, 34 also influence current densities, and hence have been included in the simulations informing discussion of temperature dependent sensitivity optimizations.

In the FIG. 17/18 example, the ratio $L_{con}/(W_2-W_1)$ is approximately 0.24. This represents a relatively short distance for current densities to recover uniformity, relative to the change in width.

Figure 19:
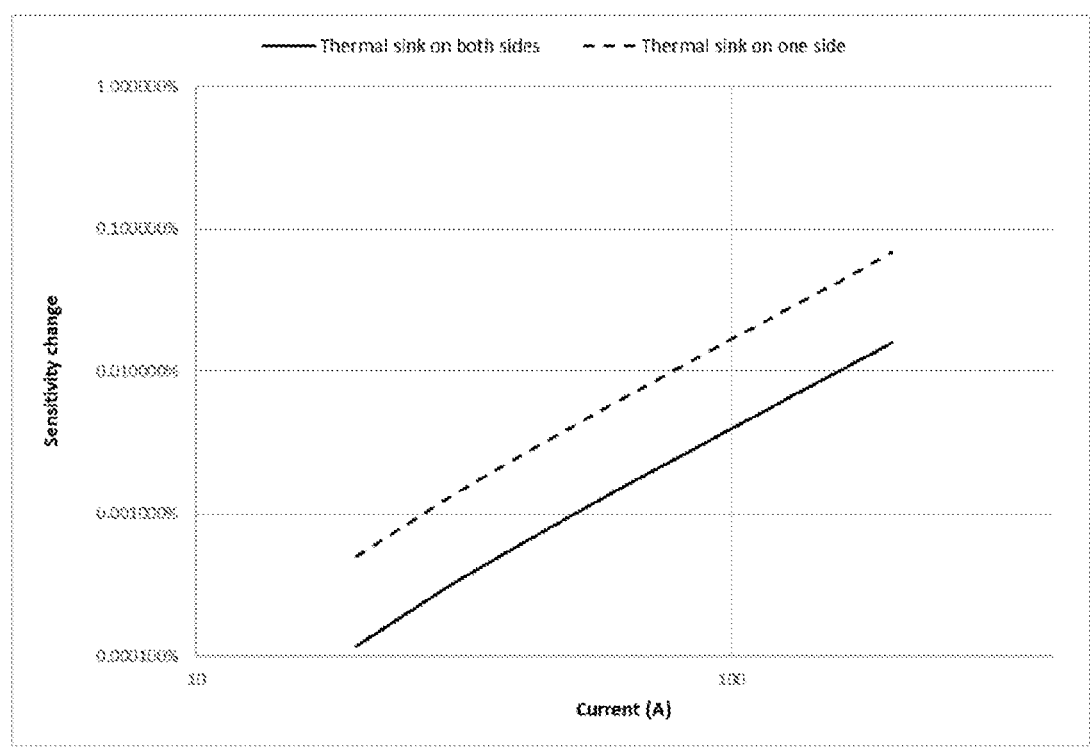
FIG. 19 plots modelled sensitivity variation of the example shown in FIGS. 17 and 18 against current.

Referring also to FIG. 19, the modelled sensitivity variation (change) of the FIG. 17/18 example is plotted against current $I_{load}$.

Figure 20:
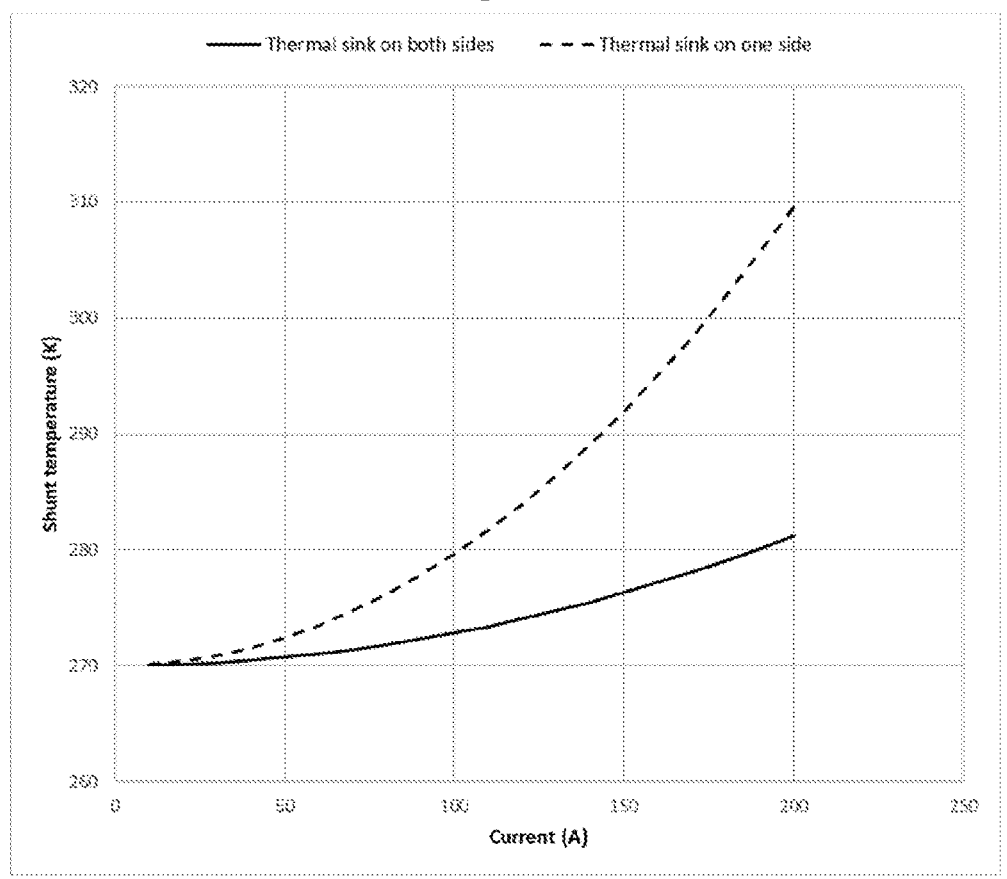
FIG. 20 plots modelled temperature of the example shown in FIGS. 17 and 18 against current.

Referring also to FIG. 20, the modelled second part 5 (shunt) temperature of the FIG. 17/18 example is plotted against current $I_{load}$.

The effect overall is a sensitivity variation of the order of 0.15% between 270K and 350K. Two cases are plotted in FIGS. 19 and 20, a first case (solid line) with a symmetric thermal configuration having a thermal sink coupled to both first and third parts 3, 4. The second case (dashed line) corresponds to an asymmetric thermal configuration having a thermal sink coupled to only one of the first and third parts 3, 4. It may be observed that the effects of temperature are more pronounced for the asymmetric case. The asymmetric case is also more reflective of real world deployments of DC electrical meters 62 (FIG. 42) and current sensors 1, 1b therefor.

Figure 21:
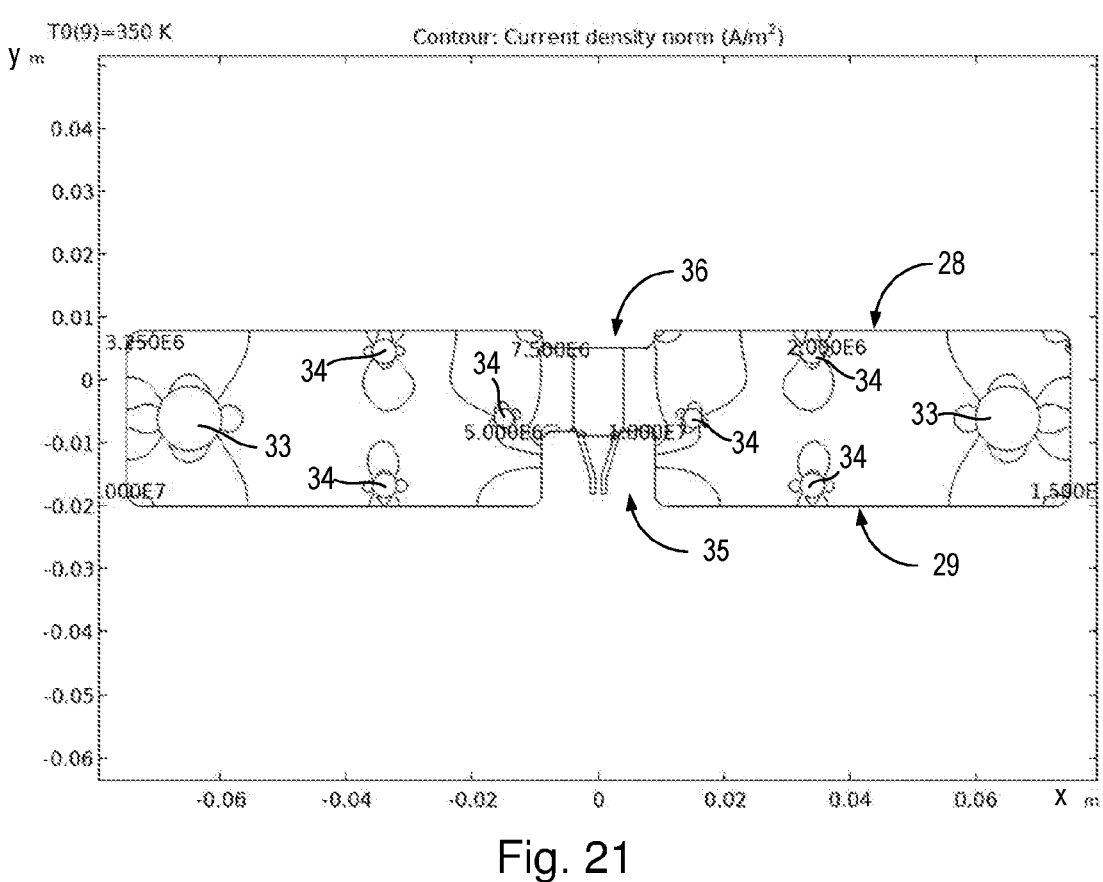
FIG. 21 plots contours of current density, j, calculated for a further example of the second busbar connector.

Referring also to FIG. 21, contours of current density, j, calculated for an example of the second busbar connector 24 are shown. The calculations were the same as for FIGS. 17 and 18, the only difference being the specific shapes of the parts 3, 4, 5 modelled.

The FIG. 21 example is the same as the FIG. 17/18 example, except that in addition to a cut-out 35 from the second side 29 around the connecting members 7a, 7b, the FIG. 21 example also has a second cut-out 36 from the first side 28, the second cut 36 having corresponding length to the first cut-out 35

Figure 22:
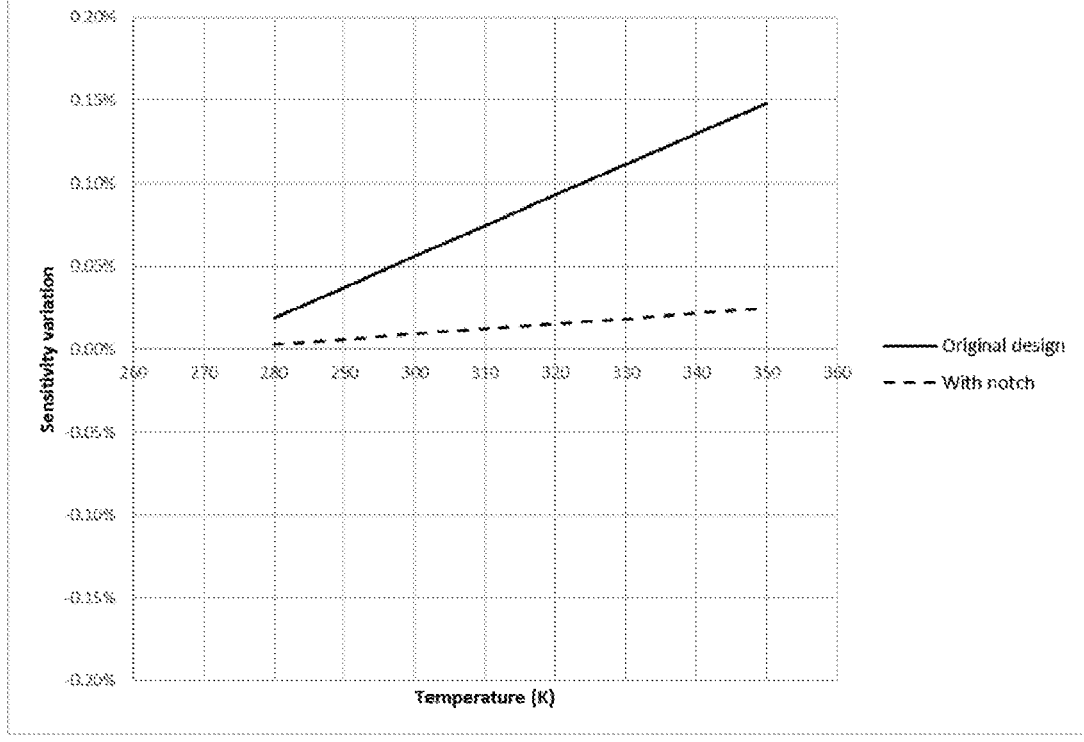
FIG. 22 is a comparative plot of sensitivity variation is plotted against temperature for the examples shown in FIGS. 17 and 21.

Referring also to FIG. 22, sensitivity variation is plotted against temperature for the FIG. 17/18 example (solid line—"Original design") and the FIG. 21 example (dashed line—"with notch"). In both cases, uniform temperature was assumed.

It may be observed that the FIG. 21 example, include the second cut-out 36, exhibited reduced sensitivity variation with temperature. Without wishing to be bound by theory, it is speculated that having cut-outs 35, 36 on both sides, provides greater symmetry of distortions about a midline of the main body 6 (parallel to the x-axis as illustration).

It appears preferable to include the second cut-out 36 when implementing examples of the second busbar connector 24.

Figure 23:
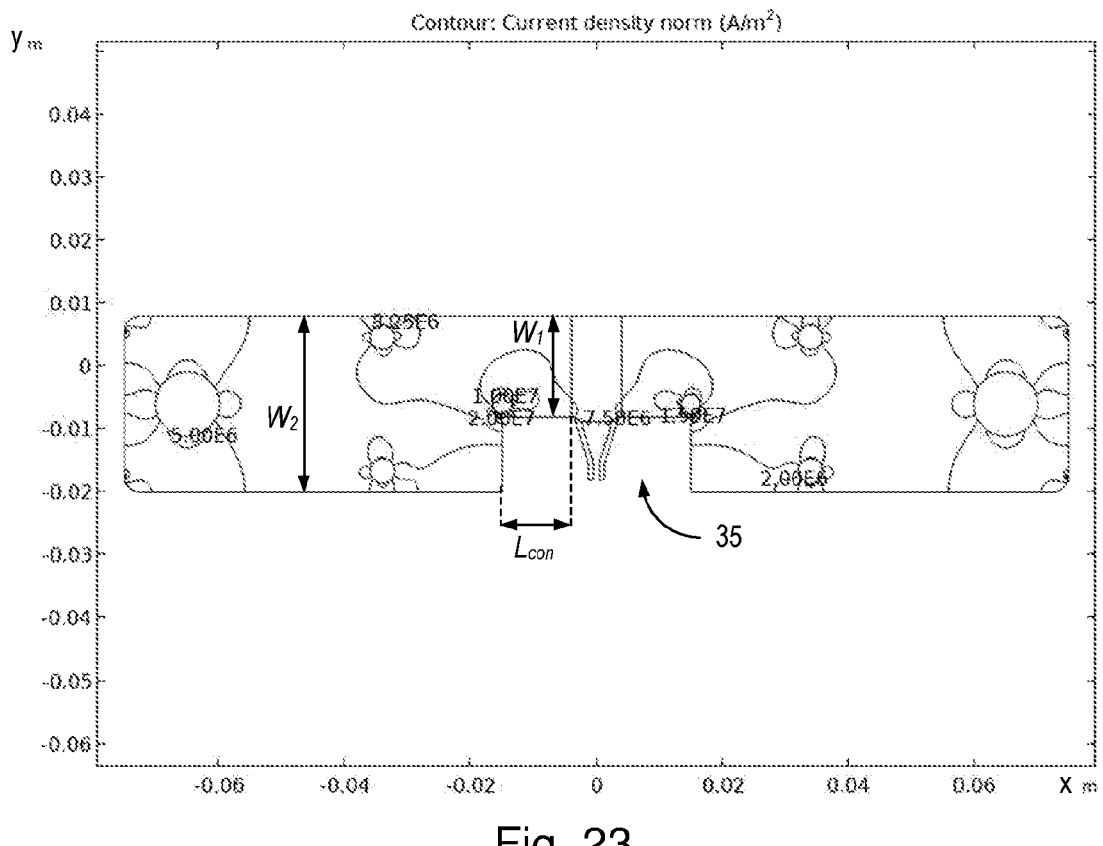
FIG. 23 plots contours of current density, j, calculated for a further example of the second busbar connector.

Referring also to FIG. 23, contours of current density, j, calculated for an example of the second busbar connector 24 are shown. The calculations were the same as for FIGS. 17 and 18, the only difference being the specific shapes of the parts 3, 4, 5 modelled.

The FIG. 23 example is the same as the FIG. 17/18 example, except that the relative length of the reduced width portions 26a, 26b has been increased to increase the ratio $L_{con}/(W_2-W_1)$, which is approximately 0.91 (compared to 0.24 for the FIG. 17/18 example). Through-holes are not relabelled for visual clarity.

Figure 24:
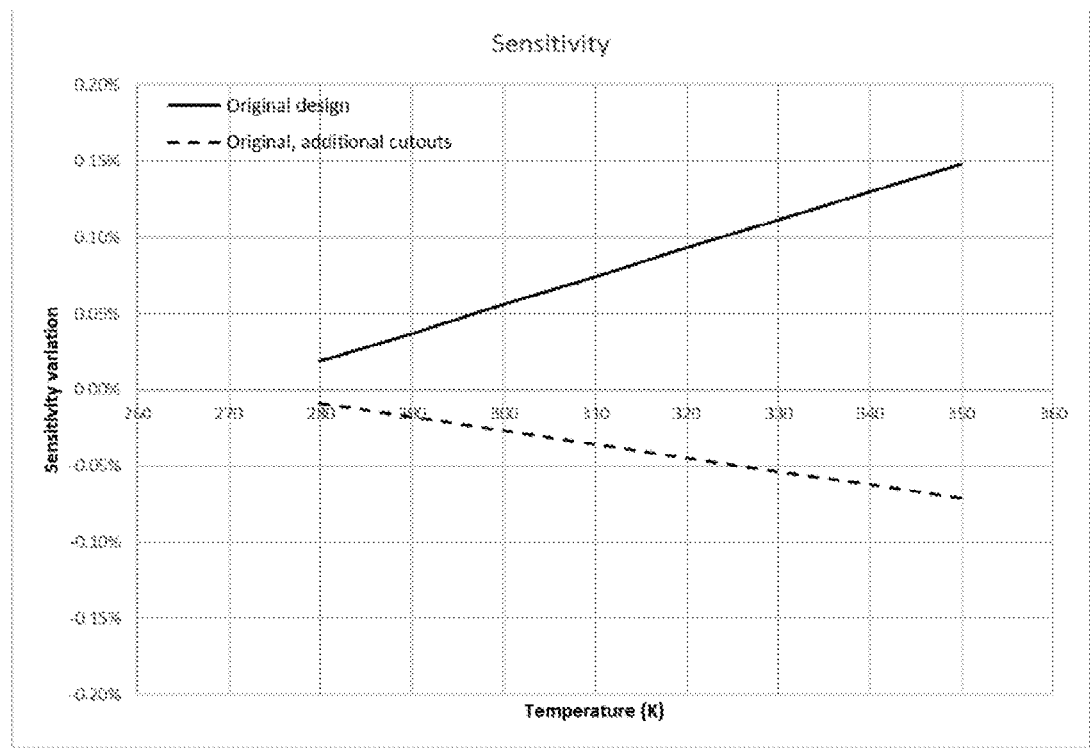
FIG. 24 is a comparative plot of sensitivity variation is plotted against temperature for the examples shown in FIGS. 17 and 23.

Referring also to FIG. 24, sensitivity variation is plotted against temperature for the FIG. 17/18 example (solid line—"Original design") and the FIG. 23 design (dashed line—"Original, additional cutouts"). In both cases, uniform temperature was assumed.

It may be observed that the sensitivity variation of the FIG. 23 example is improved relative to the FIG. 17/18 example, though not by such an extent as might be expected. Without wishing to be bound by theory, it is speculated that the close correspondence of mounting through holes-34 to the transition between full width 25a, 25b sections and reduced width sections 26a, 26b generated distortions, which counteracted the increased length $L_{con}$ for evolving the current density j towards uniformity prior to reaching the second part 5.

Figure 25:
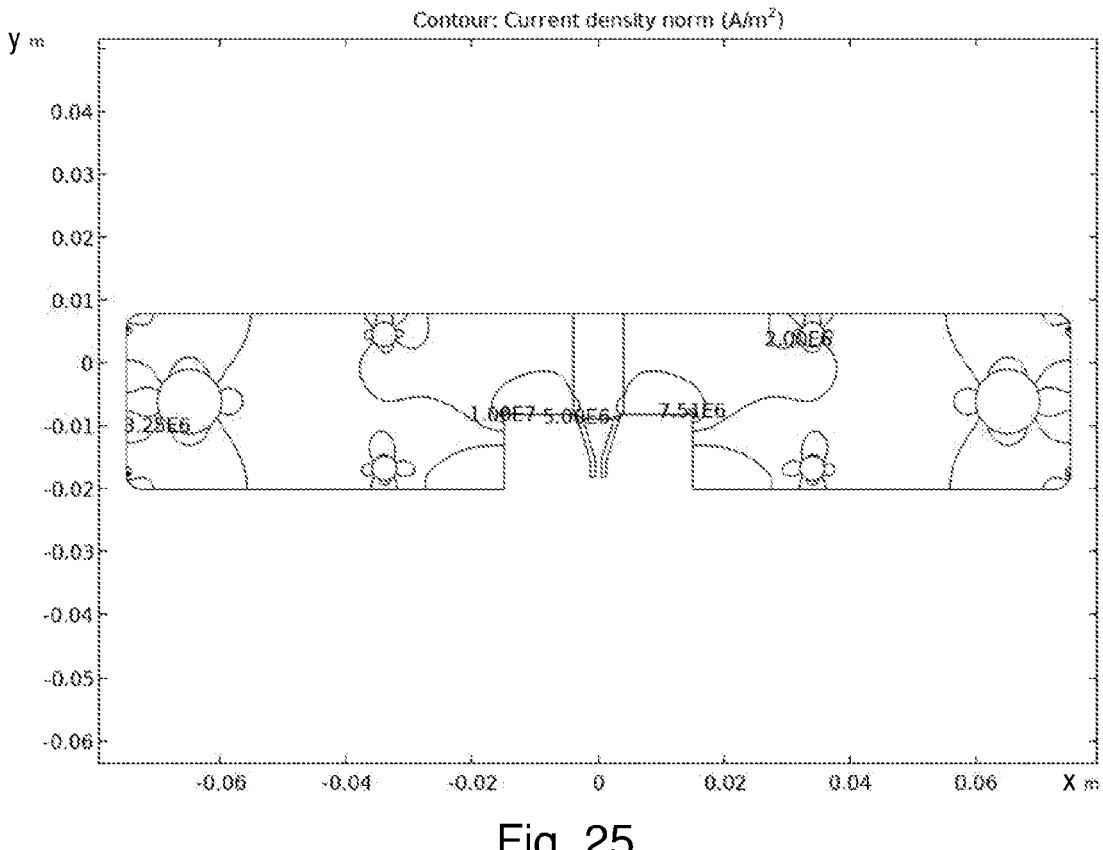
FIG. 25 plots contours of current density, j, calculated for a further example of the second busbar connector.

Referring also to FIG. 25, this idea was tested by simulating contours of current density j for an example identical to the FIG. 23 example except for omitting the mounting through holes 34 closest to the second part 25. Labels which would be identical to FIG. 23 are omitted for visual clarity, and through-holes 33, 34 are not labelled for the same reason.

Figure 26:
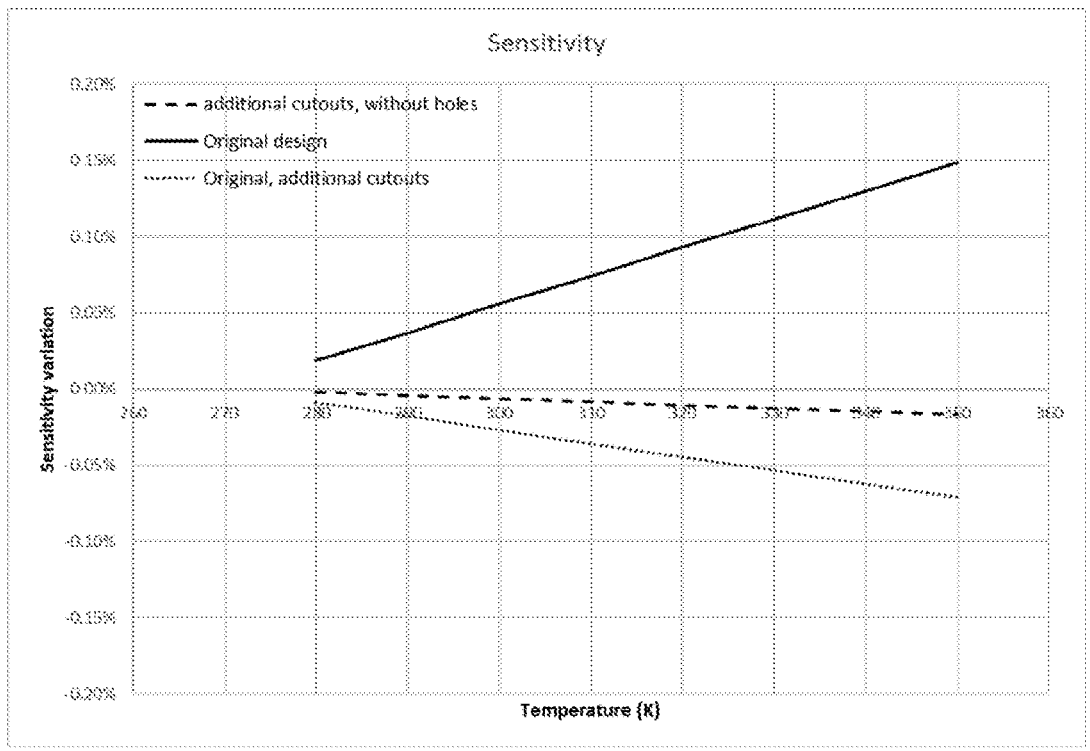
FIG. 26 is a comparative plot of sensitivity variation is plotted against temperature for the examples shown in FIGS. 17, 23 and 25.

Referring also to FIG. 26, sensitivity variation is plotted against temperature for the FIG. 17/18 example (solid line—"Original design"), the FIG. 23 design (dotted line—"Original, additional cutouts"), and for the FIG. 25 example (dashed line—"additional cutouts, without holes"). In all cases, uniform temperature was assumed.

It may be observed that the FIG. 25 example exhibited lower sensitivity variation than even the FIG. 23 example, indicating that positioning through holes 33, 34 away from the transition between transition between full width 25a, 25b sections and reduced width sections 26a, 26b of the first and third parts 3, 4 is preferable.

Figure 27A:
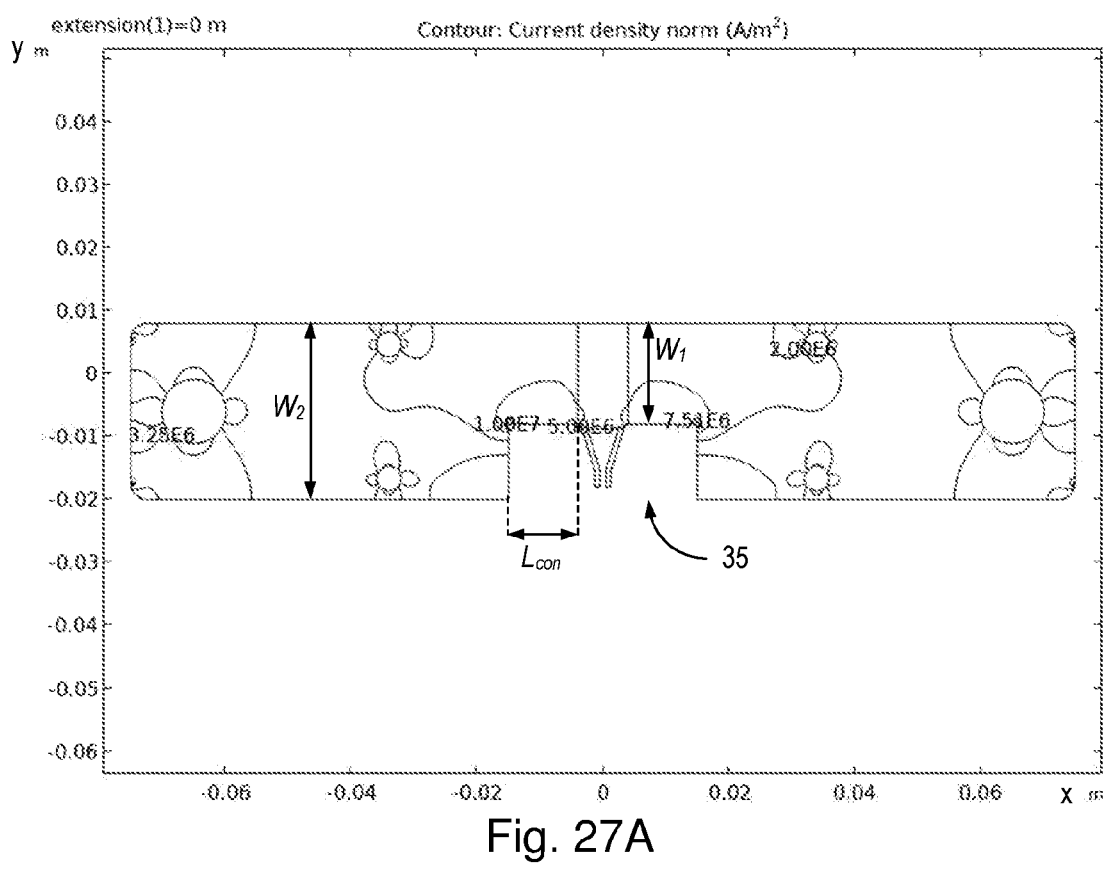
FIGS. 27A, 27B and 27C plot contours of current density, j, calculated for further examples of the second busbar connector having progressively longer cut-outs.
Figure 27B:
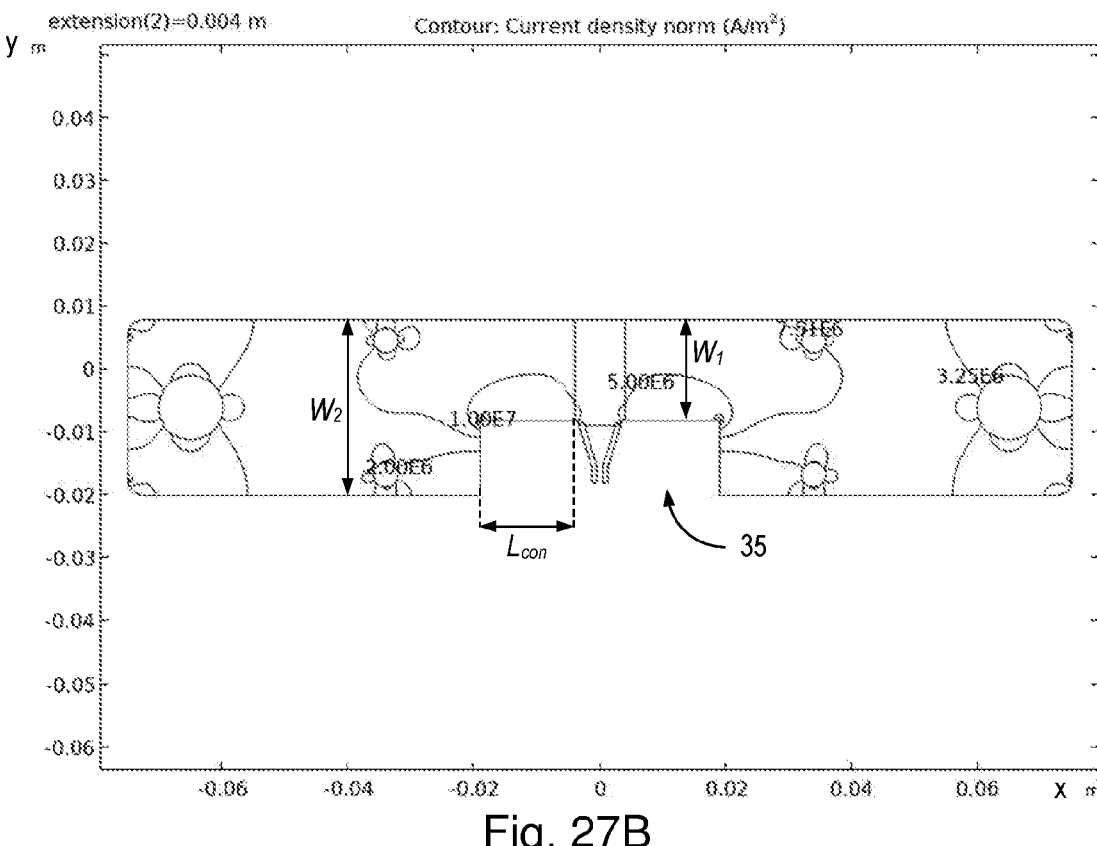
Figure 27C:
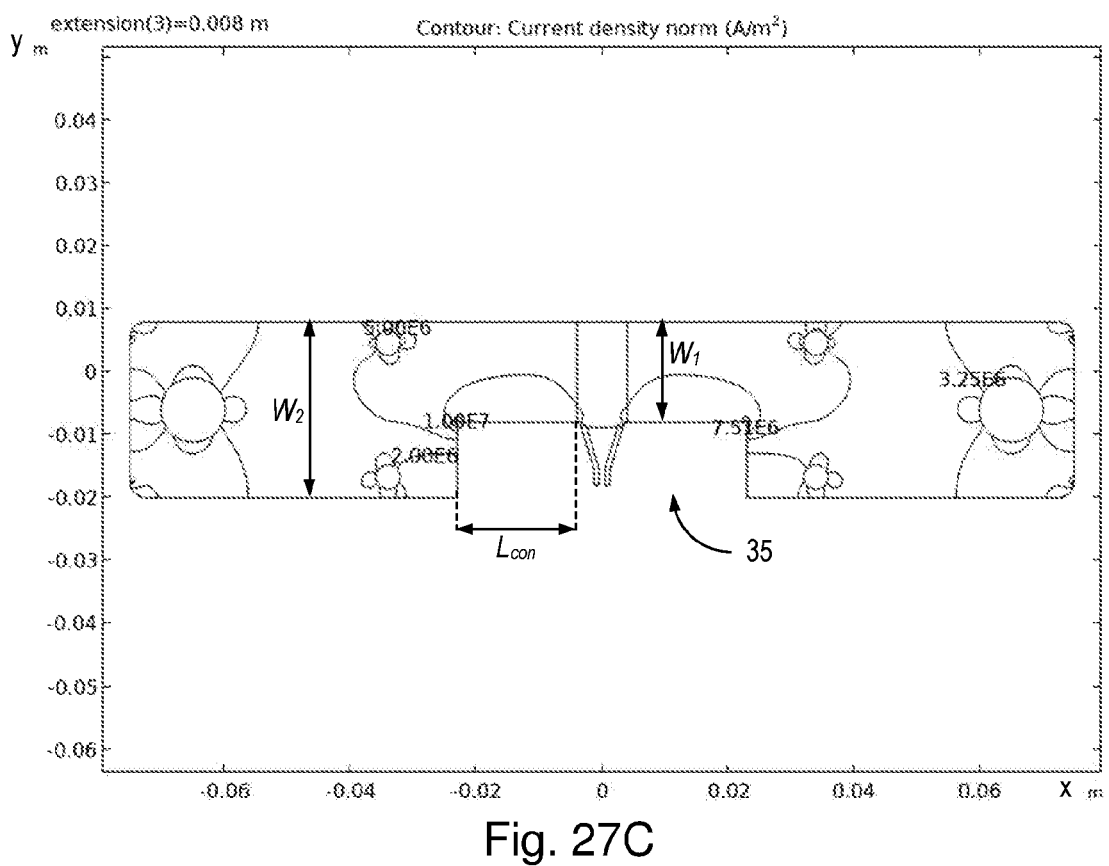

Referring also to FIGS. 27A to 27C, the effect of extension on the FIG. 25 example (omitting mounting through-holes closest to the second part 5) is explored. FIG. 27A reproduces FIG. 25 with added annotations. The FIG. 27B example corresponds to the FIG. 25 example with the cut out 35 expanded by a further 4 mm. The FIG. 27C example corresponds to the FIG. 25 example with the cut out 35 expanded by a further 8 mm. The calculations were the same as for FIGS. 17 and 18, the only difference being the specific shapes of the parts 3, 4, 5 modelled. Through-holes 33, 34 are not labelled for visual clarity.

For the examples of FIGS. 27A, 27B and 27C, the ratio $L_{con}/(W_2-W_1)$ took the approximate values 0.91, 1.23 and 1.56 respectively.

Figure 28:
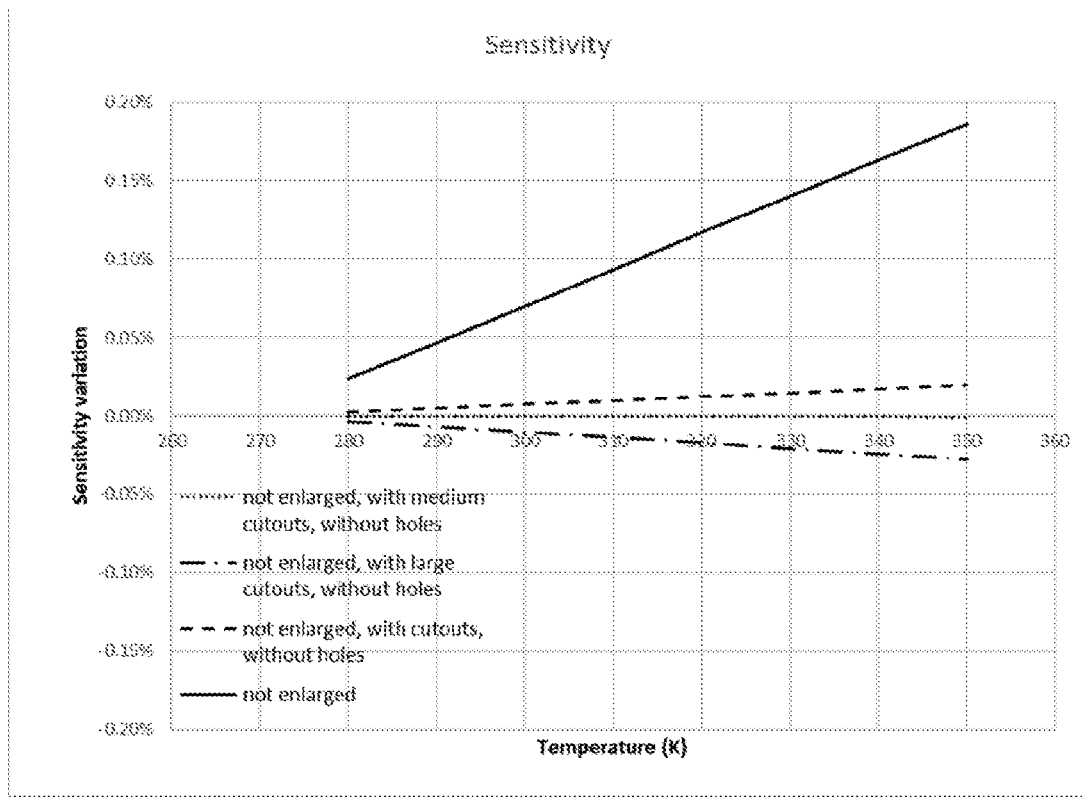
FIG. 28 is a comparative plot of sensitivity variation is plotted against temperature for the examples shown in FIGS. 17, 27A, 27B and 27C.

Referring also to FIG. 28, sensitivity variation is plotted against temperature for the FIG. 17/18 example (solid line—"not enlarged"), the FIG. 25/27A design (dashed line—"not enlarged, with cutouts, without holes"), the FIG. 27B example (dotted line—"not enlarged, with medium cutouts, without holes"), and for the FIG. 27C example (chained line—"not enlarged, with large cutouts, without holes"). In all cases, uniform temperature was assumed.

In may be observed that the increase in ratio $L_{con}/(W_2-W_1)$ decreased sensitivity variation of the FIG. 27B example still further compared to the FIG. 25/27A example. However, the further increase to the FIG. 27C example reversed the sign of sensitivity variations and increased the magnitude again. The precise reason for this behaviour is not known. It might be related to the transition between full width 25a, 25b sections and reduced width sections 26a, 26b beginning to approach the next set of through-holes 34, or another factor not presently apparent.

From a practical perspective, the simulations of FIGS. 27A through 27C illustrate that, for a given shape of busbar connector 24, a length of reduced width sections 26a, 26b which minimizes sensitivity variations of the current sensor 1, 1b with temperature may be determined by progressively increasing the length of the reduced width sections 26a, 26b (to increase ratio $L_{con}/(W_2-W_1)$) until the percentage variation in sensitivity across the temperature range from 280 K to 340 K is less than or equal to a threshold sensitivity variation. For example, the threshold sensitivity variation may be 0.05%, but as shown by the examples of FIG. 27A and 27B, lower variation is achievable.

Such optimizations may be conducted experimentally. Additionally or alternatively, optimizations may be performed using finite element analysis (FEA) modelling of current flows in the busbar connector 24, as in the present specification. Preferably, optimization will be performed using FEA modelling, then verified and/or fine-tuned with experiments.

Referring again to the examples of FIG. 27B, it may be observed that the sensitivity variations associated with the full width portions 25a, 25b may be counteracted. However, this has been done by pushing the transition between full width 25a, 25b sections and reduced width sections 26a, 26b sufficiently far from the second part 5 and connecting members 7a, 7b that some of the originally intended mechanical protection has been sacrificed.

Figure 29:
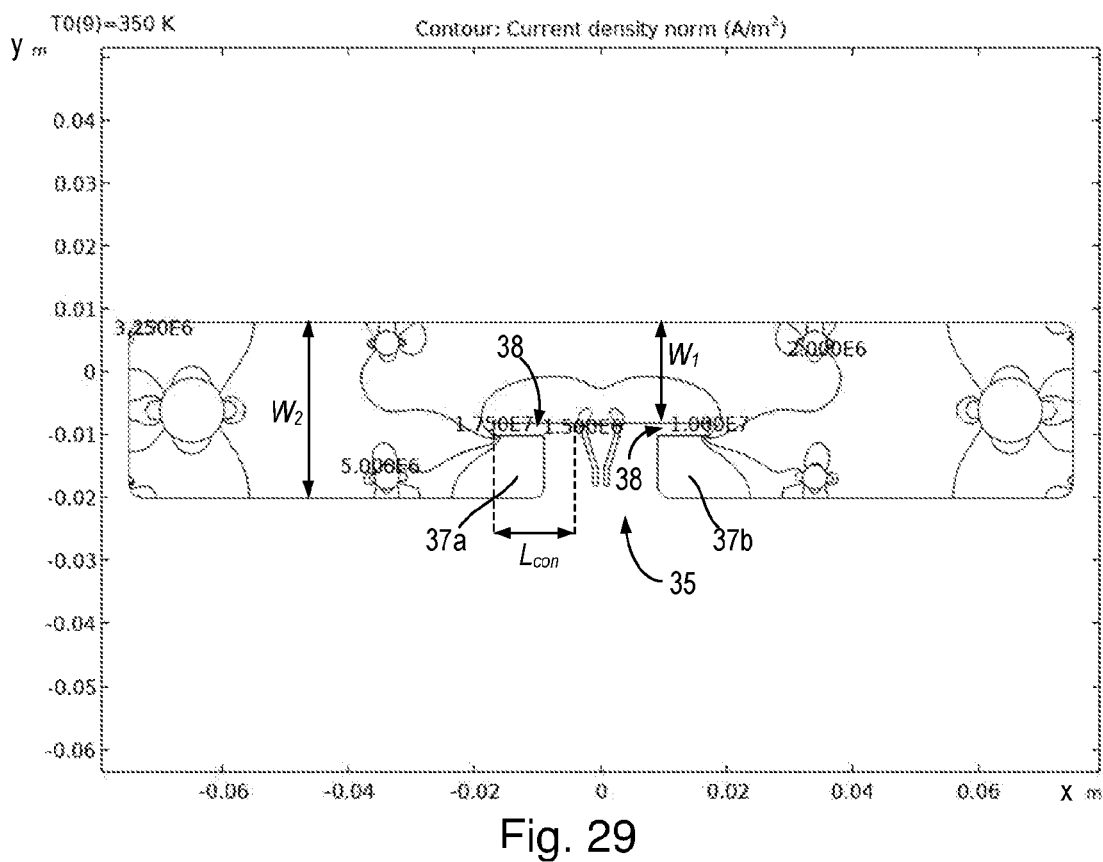
FIG. 29 plots contours of current density, j, calculated for a further example of the second busbar connector.

Referring also to FIG. 29, a modification of the FIG. 27B example is shown. The calculations of current density j were the same as for FIGS. 17 and 18, the only difference being the specific shapes of the parts 3, 4, 5 modelled. Through-holes 33, 34 are not labelled for visual clarity.

In the FIG. 29 example, the full width sections 25a, 25b of the first and second parts 3, 4 include respective protrusions 37a, 37b extending into the cut-out 35 (parallel to the x-axis as illustrated), and separated from the corresponding reduced width sections 26a, 26b by a gap 38 (in the y-direction as illustration). The protrusions 37a, 37b are not coupled to the second part 5. In effect, the gaps 38 define a slot, so that the ratio $L_{con}/(W_2-W_1)$ can be maintained, while allowing the protrusions 37a, 37b to extend closer to the connecting members 7a, 7b to provide mechanical protection against inadvertent deformation during fabrication, handling and/or assembly.

Figure 30:
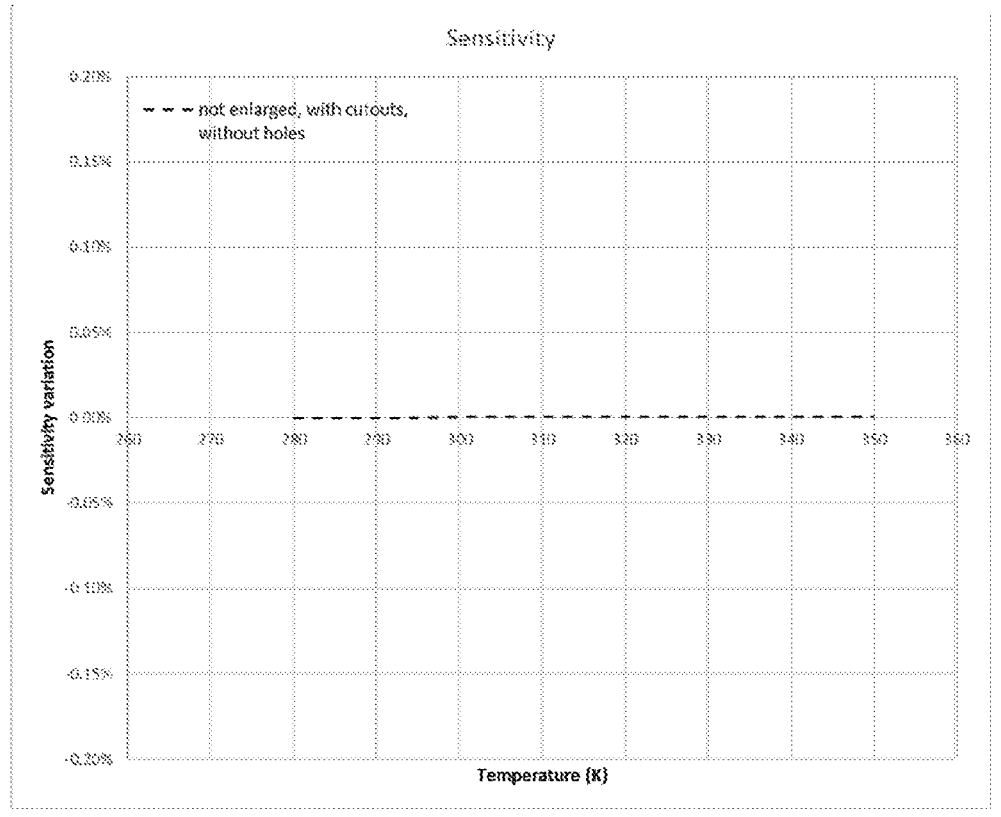
FIG. 30 plots sensitivity variation against temperature for the example shown in FIG. 29.

Referring also to FIG. 30, sensitivity variation is plotted against temperature for the FIG. 29 example (dashed line—"not enlarged, with cutouts, without holes"), It may be observed that the sensitivity variation for the FIG. 29 example closely matches that of the FIG. 27B example shown in FIG. 28.

Additionally, the arrangement of the protrusions 37a, 37b is such that minimal (or no) current density j will flow in the protrusions 37a, 37b when a current $I_{load}$ is passed between first and third parts (the protrusions 37a, 37b are effectively "dead-ends"). Consequently, the protrusions 37a, 37b may provide good locations for mounting through-holes 34 which will not have an impact on current densities j within the busbar connector 24. For example, to mechanically secure the busbar connector 24 relative to (or directly to) the substrate 11.

Reduced Thickness Connecting Members

As described herein, it is desirable to increase thermal resistance of the first and second connecting members 7a, 7b. One approach to do so is to reduce the widths w1, w2 and increase path 13a, 13b lengths s1, s2. Thermal resistance would also be increased by reducing respective thicknesses $t_1$, $t_2$ of the connecting members 7a, 7b relative to the thickness t of the main body 6. This is challenging to accomplish while also having the first and second connecting members 7a, 7b integrally formed with the main body 6. For example, welding a thinner plate to the main body 6 and then cutting, stamping and so forth the shapes of the connecting members 7a, 7b would result in the same issues as simply welding on wires of notionally the same composition. Specifically that notionally identical compositions are typically not actually identical, and even small variations in composition component fractions or impurities may give rise to unacceptable thermal EMFs.

Figure 31:
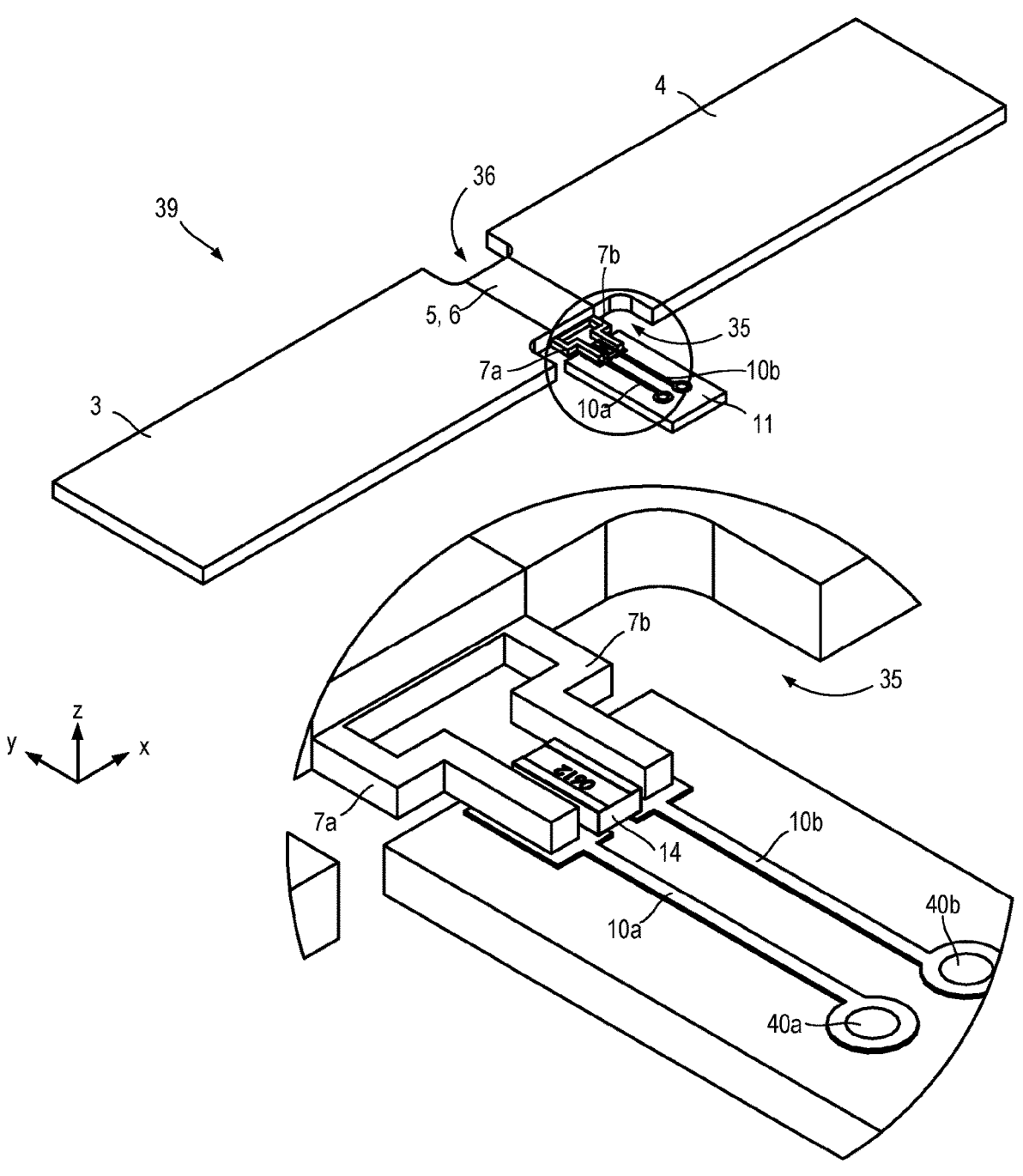
FIG. 31 is a schematic projection view of a third busbar connector.
Figures 32A, 32B, 32C:
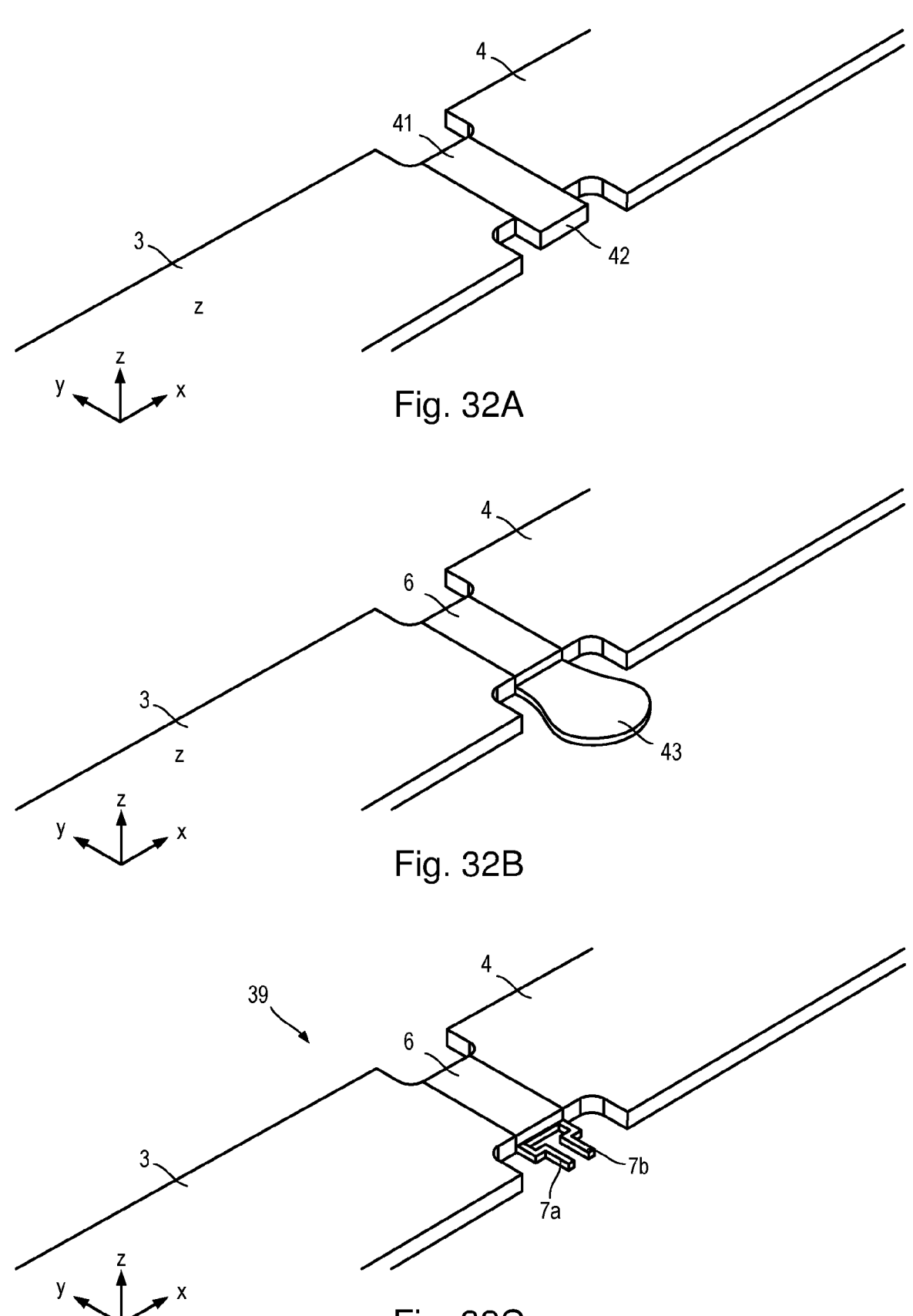
FIGS. 32A, 32B and 32C show intermediate steps in producing the third busbar connector.

Referring also to FIG. 31 an example of a third busbar connector 39 is shown. Referring also to FIGS. 32A to 32C, stages of producing the third busbar connector 39 are shown.

The third busbar connector 39 is the same as the second busbar connector 24 (and may include any features described in relation thereto), differing only in that the thicknesses t1, t2 of the connecting members 7a, 7b (parallel to the z-axis as illustrated) are relatively thinner than the thickness t of the main body 6 (parallel to the z-axis as illustrated). The third busbar connector 39 illustrated in FIGS. 31 and 32 includes cut-outs 35, 36 from first and second sides 28, 29. No through-holes 33, 34 are illustrated for visual purposes, but may be included in a real implementation for electrical/mechanical connection purposes. The third busbar connector 39 is illustrated in FIG. 31 connected to the conductive elements 10a, 10b supported on the substrate 11, with a thermal jumper 14 connected between. The conductive elements 10a, 10b take the form of conductive traces terminating in respective landing pads 40a, 40b for onward connection to circuitry 12.

Referring in particular to FIG. 32A, a single piece of material 41 which will form the main body 6 and connecting members 7a, 7b is welded (or otherwise bonded) between the first and third parts 3, 4. The single piece of material 41 has a protrusion 42 extending beyond the width $W_1$ of the reduced width sections 26a, 26b of the first and third parts 3, 4.

Referring in particular to FIG. 32B, the protrusion 42 is compressively deformed to form a reduced thickness region 43. The remaining, un-deformed portion of the single piece 41 forms the main body 6.

Referring in particular to FIG. 32C, the first and second connecting members 7a, 7b are formed by removing material from the reduced thickness region 43. Preferably a shearing process is used such as, for example, a stamping process, a die cutting process, a fine blanking process, and so forth. Alternatively, the first and second connecting members 7a, 7b may be formed by any suitable process, including but not limited to etching, laser cutting, mechanical milling, spark erosion (electrical discharge machining).

The thickness of the reduced thickness region 43, which defines the thicknesses $t_1$, $t_2$ of the connecting members 7a, 7b, may be controlled to any fraction of the main body 6 thickness t by controlling the compressive deformation process (for example stroke depth of a piston). For example, a main body 6 thickness t=2.5 mm may be reduced to $t_1 = t_2 = 0.75$ mm, a fraction of 0.3.

During the compression to form the reduced thickness region 43, the microstructure of the material will be altered. Firstly, the typical grain shapes will become compressed by a comparable fraction to the thickness t. Secondly, extensive plastic working will increase dislocation density in the reduced thickness region 43. A discontinuity in microstructure may result in unwanted thermal EMF generation. Should unwanted thermal EMF generation arise, it may be mitigated using compensation using one or more temperature sensors 32 (FIG. 42). Additionally, there may be residual stresses remaining after formation processes. Consequently, the third busbar connector 39 is preferably subjected to a heat treat following fabrication. The type of heat treatment is referred to as "artificial aging" and should be at a temperature high enough to activate dislocation movement to allow relieving residual stresses and re-absorption of excess dislocation density. However, for practical reasons of avoiding excessive oxidation, the heat treatment is unlikely to be high enough for grain boundary consolidation.

For a second part 5 formed of Manganin®, the heat treatment may take the form of one or more cycles from ambient temperature to around 100-140° C. Any thermal oxide formed during the aging may be removed by "pickling" in an acidic solution to destabilize the oxide. Additionally or alternatively, thermal oxidation may be reduced or avoided by performing heat treatments in a vacuum or inert atmosphere such as nitrogen, argon and so forth.

There are two main constraints to how thin $t_1$, $t_2$ the connecting members 7a, 7b may be made. Firstly, the connecting members 7a, 7b must remain mechanically robust enough to allow connection to the conductive elements 10a, 10b without inadvertent deformation. Secondly, for excessive deformations, the artificial aging treatment may not be enough to prevent unwanted thermal EMF generation at the proximal ends 8a, 8b.

Through-Hole Mounting to Substrate

In the preceding examples the connecting members 7a, 7b have been connected to the conductive elements 10 an 10b by one of soldering, welding, brazing or similar methods. More robust mechanical support is provided by fastening the substrate 11 relative to (or directly to) the first 3 and/or third 4 parts using mounting through holes 34.

Figures 33A, 33B:
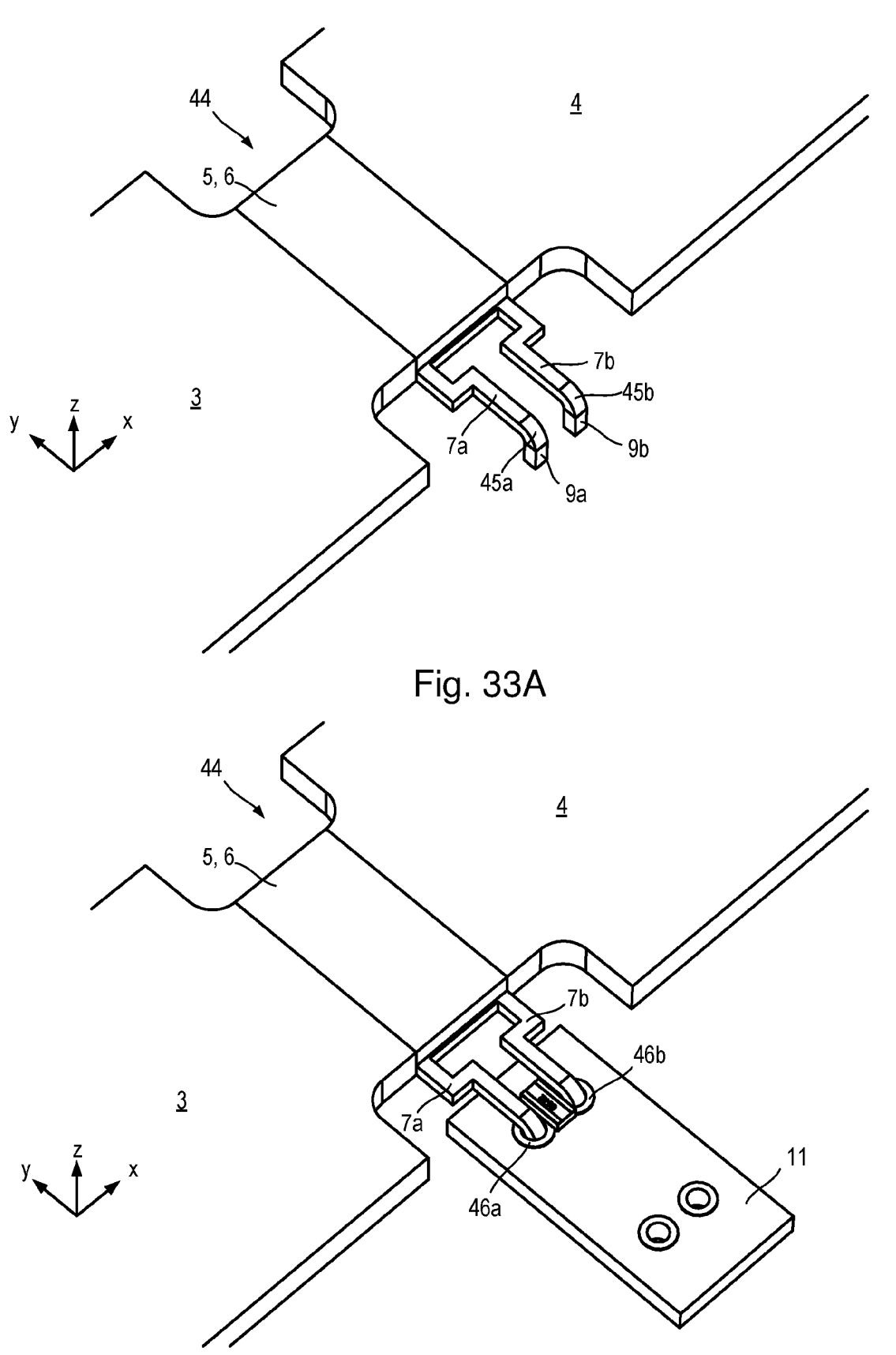
FIGS. 33A and 33B are schematic projection views of a first through-hole mounting method.

Referring also to FIGS. 33A and 33B, a first through-hole mounting method is shown, using a fourth busbar connector 44.

Referring in particular to FIG. 33A, the fourth busbar connector 44 is a modification of the third busbar connector 39 in which each of the connecting members 7a, 7b includes a 90° bend section 45a, 45b such that the corresponding distal ends 9a, 9b are pointing down relative to the z-axis as illustrated.

Referring in particular to FIG. 33B, the substrate 11 in the form of a PCB includes conductive elements 10a, 10b in the form of plated through-holes 46a, 46b which receive respective distal ends 9a, 9b of the connecting members 7a, 7b. The distal ends 9a, 9b may be retained in the plated through-holes 46a, 46b by friction fit, by are preferably soldered, brazed or similar for more secure connection. Onward connections to the circuitry 12 may be supported on either or both surfaces of the PCB substrate 11, or via internal conductive layers if the PCB is multilayer.

Referring also to FIGS. 34A to 34C, a second through-hole mounting method is shown, using the third busbar connector 39. FIG. 34A is a plan view, FIG. 34B is a side view, and FIG. 34 C is a projection view.

In the same way as the first through-hole mounting method shown in FIGS. 33A and 33B, the second through-hole mounting method also used a substrate 11 containing plated through-holes 46a, 46b which receive the distal ends 9a, 9b of the substrate 11. However, in the second through-hole mounting method, the connecting members 7a, 7b are not bent to include 90° bend sections 45a, 45b, and instead the substrate is oriented perpendicularly to the busbar connector 39. As shown in FIGS. 34A to 34C, the substrate 11 is aligned to the x-z plane, with thickness aligned with the y-axis as illustrated.

Fifth Exemplary Busbar Connector

Figure 35A:
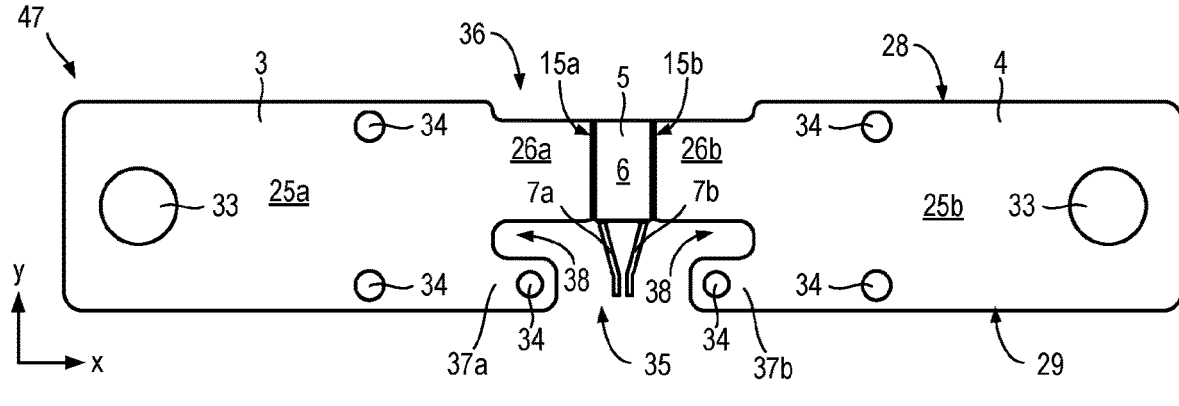
FIG. 35A is a schematic plan view of a fifth busbar connector.
Figure 35B:
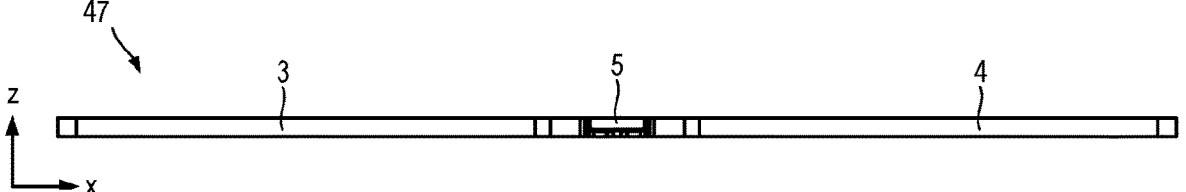
FIG. 35B is a side view.
Figure 35C:
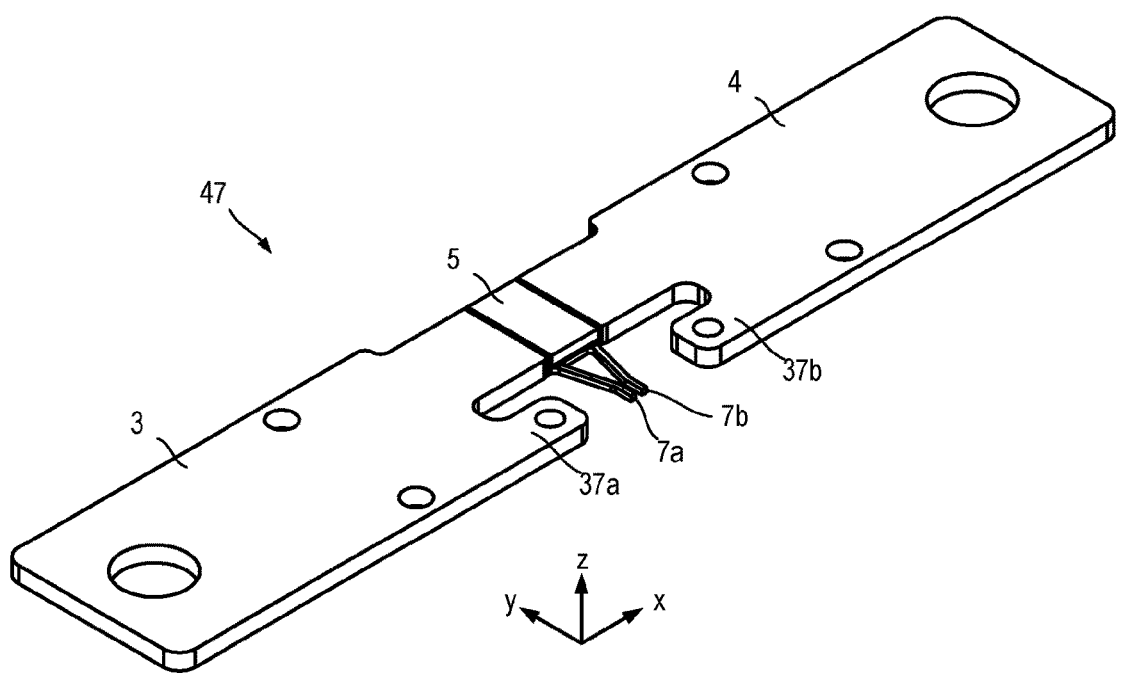
FIG. 35C is a projection view.

Referring also to FIGS. 35A to 35C, a fifth exemplary busbar connector 47 is shown (hereinafter "fifth busbar connector").

FIG. 35A is a plan view of the fifth busbar connector 47, FIG. 35B is a side view, and FIG. 35C is a projection view.

The fifth busbar connector 47 has first and third parts 3, 4 configured in accordance with the FIG. 29 example, combined with cutout 36 from the first side 28, and thinning of the connecting members 7a, 7b as described in relation to the fifth busbar connector 39. In this way, the fifth busbar connector 39 combines the previously described advantages of using long, slender connecting members 7a, 7b to reduce the second temperature difference $\delta T_2$, while mechanically protecting connecting members 7a, 7b, and also compensating for temperature dependent sensitivity variations resulting from the transition to from full width portions 25a, 25b to reduced width sections 26a, 26b.

The fifth busbar connector 47 also includes mounting through-holes 34 positioned within the protrusions 37a, 37b from the full width portions 25a, 25b. The mounting through-holes 34 are for mechanically securing the fifth busbar connector 47 relative to the substrate 11. As described hereinbefore, the locations in the protrusions 37a, 37b minimize (or even avoid) sensitivity variations of the current sensor 1, 1b with temperature originating from current density j concentrations. The remaining mounting through-holes 34 are also arranged to minimize any sensitivity variations by being positioned away from the transition between full width sections 25a, 25b and reduced width sections 26a, 26b of the first and third parts 3, 4.

Sixth Exemplary Busbar Connector

Figures 36A, 36B, 36C:
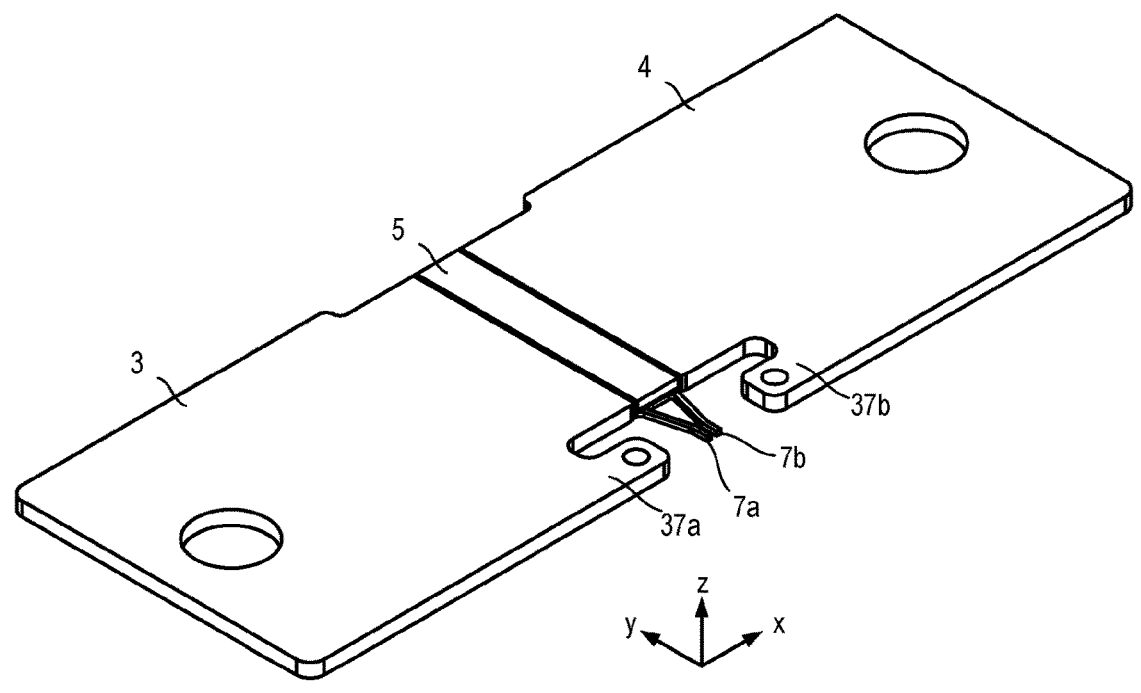
FIG. 36A is a schematic plan view of a sixth busbar connector.
FIG. 36B is a side view.
FIG. 36C is a projection view.

Referring also to FIGS. 36A to 36C, a sixth exemplary busbar connector 47 is shown (hereinafter "sixth busbar connector").

FIG. 36A is a plan view of the sixth busbar connector 47, FIG. 36B is a side view, and FIG. 36C is a projection view.

The sixth busbar connector 48 is the same as the fifth busbar connector 47, except that both widths $W_1$, $W_2$ are relatively larger, and in that mounting through-holes 34 outside of the protrusions 37a, 37b are omitted.

The sixth busbar connector 48 has increased maximum current capacity $I_{max}$ compared to the fifth busbar connector 47, as a consequence of the increased width $W_1$ of the second part 5 main body 6. In general, the maximum current capacity $I_{max}$ of a busbar connector may be configured as needed by increasing the width $W_1$ and/or thickness t of the main body 6. This can be done without sacrificing thermal isolation of the distal ends 9a, 9b of connecting members 7a, 7b by using the thinning method explained in relation to FIGS. 31 to 32C.

Stacked Busbar Connectors

Additionally or alternatively to increasing the width $W_1$, maximum current capacity $I_{max}$ may be increased by adding further busbar connectors in parallel.

In general, the current sensor 1, 1b may additionally include one or more further busbar connectors 49 (FIGS. 37A to 37E). Each further busbar connector 49 being electrically connected in parallel with the busbar connector 2, 24, 39, 44, 47, 48, and comprising a first part 3b, a second part 5b and a third part 4b (FIGS. 37A to 37E). A material forming the second part 5b of each further busbar connector 49 should be identical to that forming the second part 5 of the busbar connector 2, 24, 39, 44, 47, 48. The second part 5b of each further busbar connector 49 includes a main body 6b having the same dimensions as the main body 6 of the busbar connector 2, 24, 39, 44, 47, 48.

In this way, the total current capacity $I_{max}$ of the DC current sensor 1, 1b may be increased. Alternatively, sensitivity of a DC current sensor 1, 1b may be increased by increasing the resistance $R_{shunt}$ of the second part 5 used to measure voltage drop δV, without decreasing the total current capacity $I_{max}$ of the DC current sensor 1, 1b.

First Stacked Busbar Connector

Referring also to FIGS. 37A to 37E, a first stacked busbar connector 50 is shown.

Figures 37A, 37B, 37C, 37D, 37E:
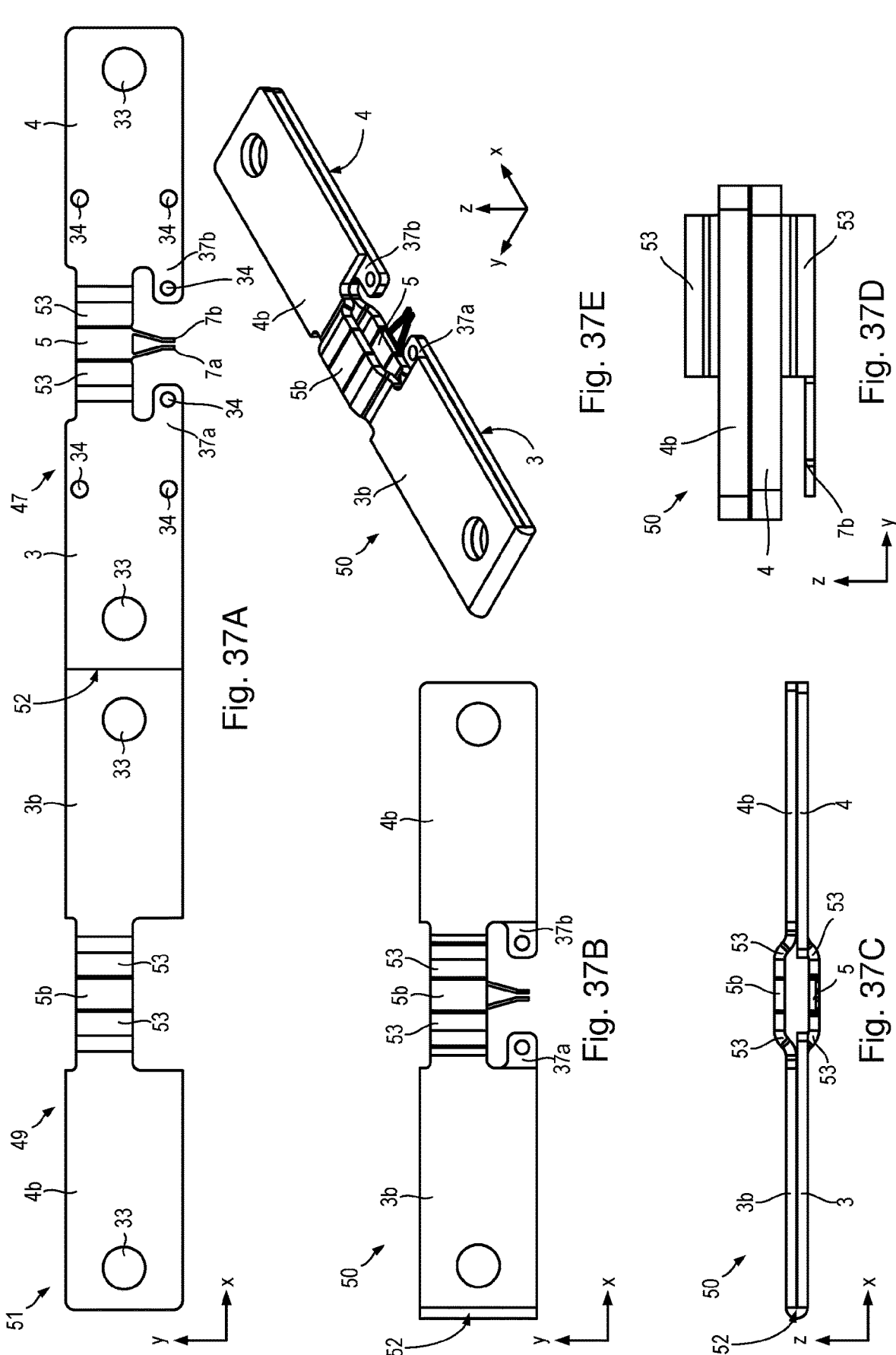
FIG. 37A is a schematic plan view of a net for a first stacked busbar connector.
FIG. 37B is a schematic plan view of the first stacked busbar connector.
FIG. 37C is a schematic side view along a width direction.
FIG. 37D is a schematic side view along a length direction.
FIG. 37E is a schematic projection view.

FIG. 37A is a plan view of a net 51 which is folded to form the first stacked busbar connector 50, FIG. 37B is a plan view of the first stacked busbar connector 50, FIG. 37C is a side view along the width direction (y-axis as illustrated), FIG. 37D is a side view along the length direction (x-axis as illustrated), and FIG. 37E is a projection view.

Herein, the "net" may alternatively be referred to as a "flat pattern". A net or flat pattern is the shape of the sheet metal part before it is formed, and may be used to create drawings for manufacturing. Nets/flat patterns preferably show bend lines, bend zones, punch locations, and the shape of the entire part with all bends flattened and bend factors considered.

The first stacked busbar connector 50 is formed by folding the net 51 back on itself around fold line 52. The net 51 includes the fifth busbar connector 47 joined along the width-wise edge of the first part 3 to the width-wise edge of the first part 3b of a further busbar connector 49 along the fold line 52. The structures of the fifth busbar connector 47 and further busbar connector 49 are mirrored about the fold line 52, with the exception that the second part 5b of the further busbar connector 49 does not include the connecting members 7a, 7b and the first and third 3b, 4b parts of the further busbar connector 49 do not include protrusions 37a, 37b.

The reduced width sections 26a, 26b of the fifth busbar connector 47, and corresponding reduced width sections (not specifically labelled) of the further busbar connector 49 are deformed into sigmoid shaped regions 53, so that the second parts 5, 5b are offset in the same direction (parallel to the z-axis as illustrated) in the net 51, and opposite directions in the folded up first stacked busbar connector 50. This may be advantageous because the higher resistance second parts 5, 5b are then held apart in the first stacked busbar connector 50, to allow for better dissipation of Joule heat generated therein. The deformation of sigmoid shaped regions 53 may be generated using a stamping process, and the specific deformed shape providing the offset is not limited, though it should be the same for both the fifth busbar connector 47 and the further busbar connector 49. The second parts 5, 5b should preferably be protected from deformation.

The net 51 which is folded to form the first stacked busbar connector 50 may instead be configured with the fifth busbar connector 47 joined along the width-wise edge of the second part 4 to the width-wise edge of the second part 4b of a further busbar connector 49 along the fold line 5.

Second Stacked Busbar Connector

Referring also to FIGS. 38A to 38E, a second stacked busbar connector 54 is shown.

Figures 38A, 38B, 38C, 38D, 38E:
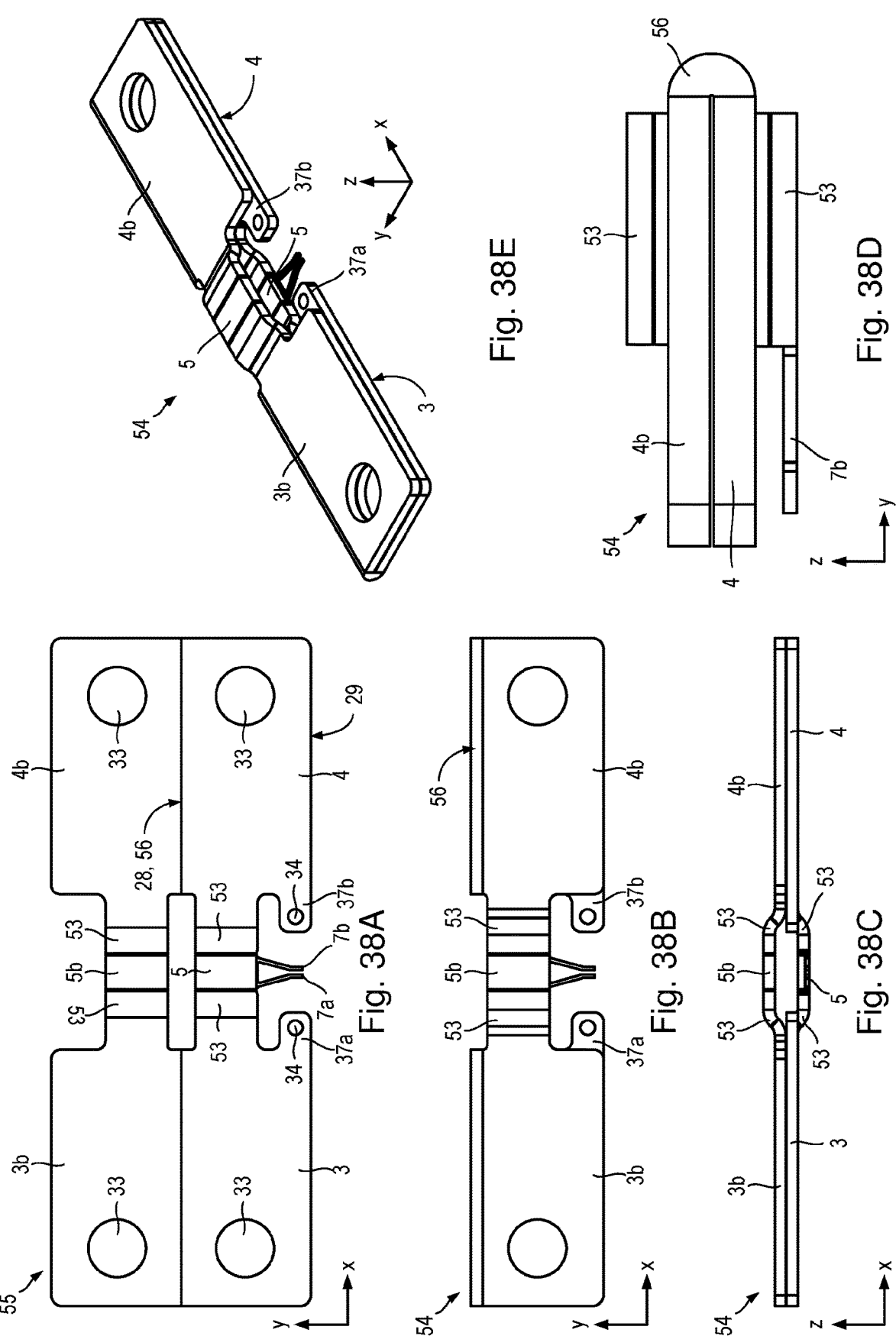
FIG. 38A is a schematic plan view of a net for a second stacked busbar connector.
FIG. 38B is a schematic plan view of the second stacked busbar connector.
FIG. 38C is a schematic side view along a width direction.
FIG. 38D is a schematic side view along a length direction.
FIG. 38E is a schematic projection view.

FIG. 38A is a plan view of a net 55 (or "flat pattern") which is folded to form the second stacked busbar connector 54, FIG. 38B is a plan view of the second stacked busbar connector 54, FIG. 38C is a side view along the width direction (y-axis as illustrated), FIG. 38D is a side view along the length direction (x-axis as illustrated), and FIG. 38E is a projection view.

The second stacked busbar connector 54 is the same as the first stacked busbar connector 50, except that the net 55 which is folded to form the second stacked busbar connector 54 is folded about a fold line 56 which joins the fifth busbar connector 47 to further busbar connector 49 along the first edge 28.

Third Stacked Busbar Connector

Referring also to FIGS. 39A to 39E, a third stacked busbar connector 57 is shown.

Figures 39A, 39B, 39C, 39D, 39E:
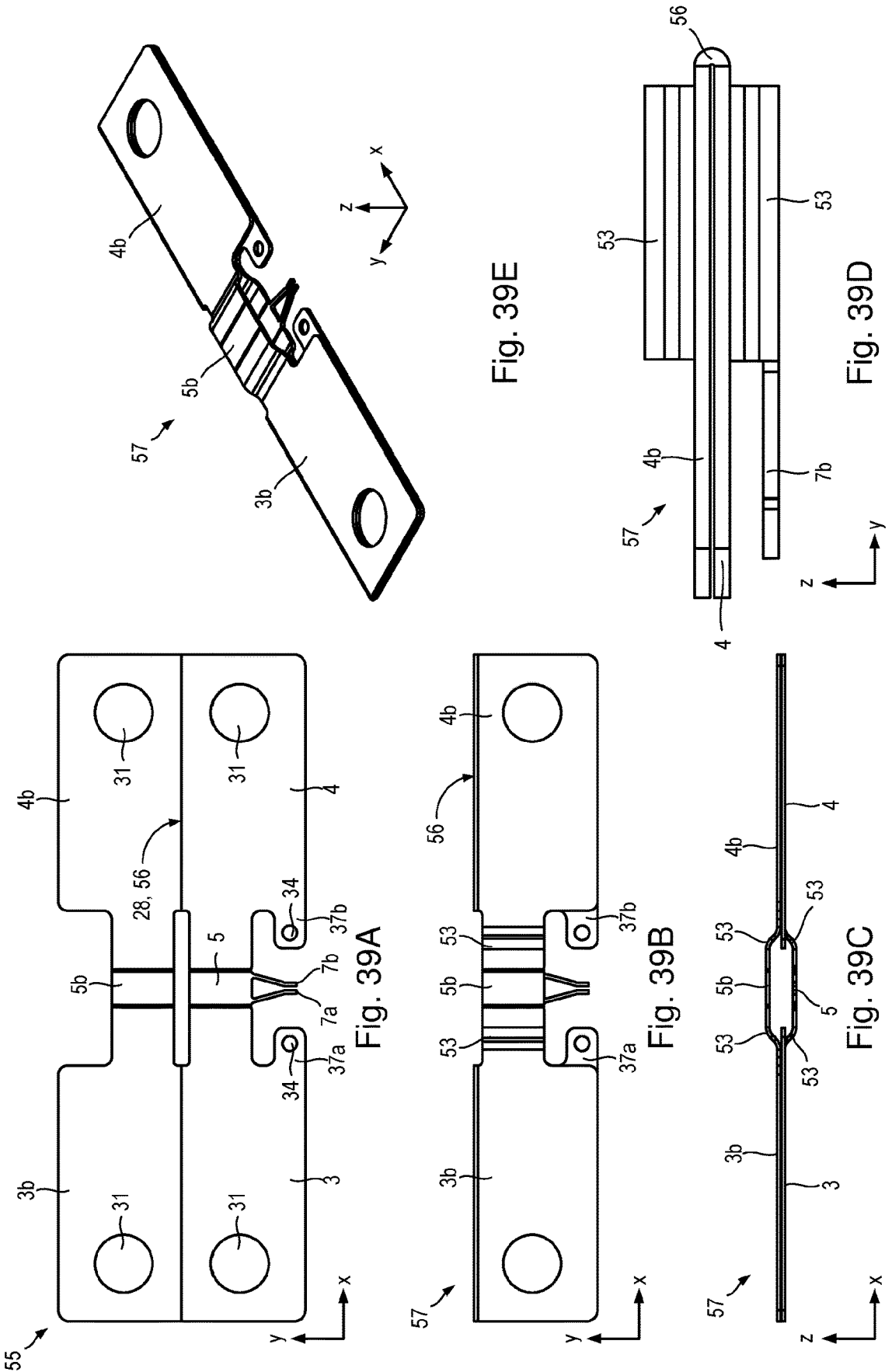
FIG. 39A is a schematic plan view of a net for a third stacked busbar connector.
FIG. 39B is a schematic plan view of the third stacked busbar connector.
FIG. 39C is a schematic side view along a width direction.
FIG. 39D is a schematic side view along a length direction.
FIG. 39E is a schematic projection view

FIG. 39A is a plan view of a net 55 (or "flat pattern") which is folded to form the third stacked busbar connector 54, FIG. 39B is a plan view of the third stacked busbar connector 54, FIG. 39C is a side view along the width direction (y-axis as illustrated), FIG. 39D is a side view along the length direction (x-axis as illustrated), and FIG. 39E is a projection view.

The third stacked busbar connector 57 is the same as the second stacked busbar connector 54, except that the thickness t of the main portions 6, 6b, first parts 3, 3b and second parts 4, 4b are all equal to the thickness $t_1 = t_2$ of the connecting members 7a, 7b. This may help to simplify manufacture, While having double the current capacity $I_{max}$ as the second part 5 alone.

Fourth Stacked Busbar Connector

Figures 40A, 40B, 40C:
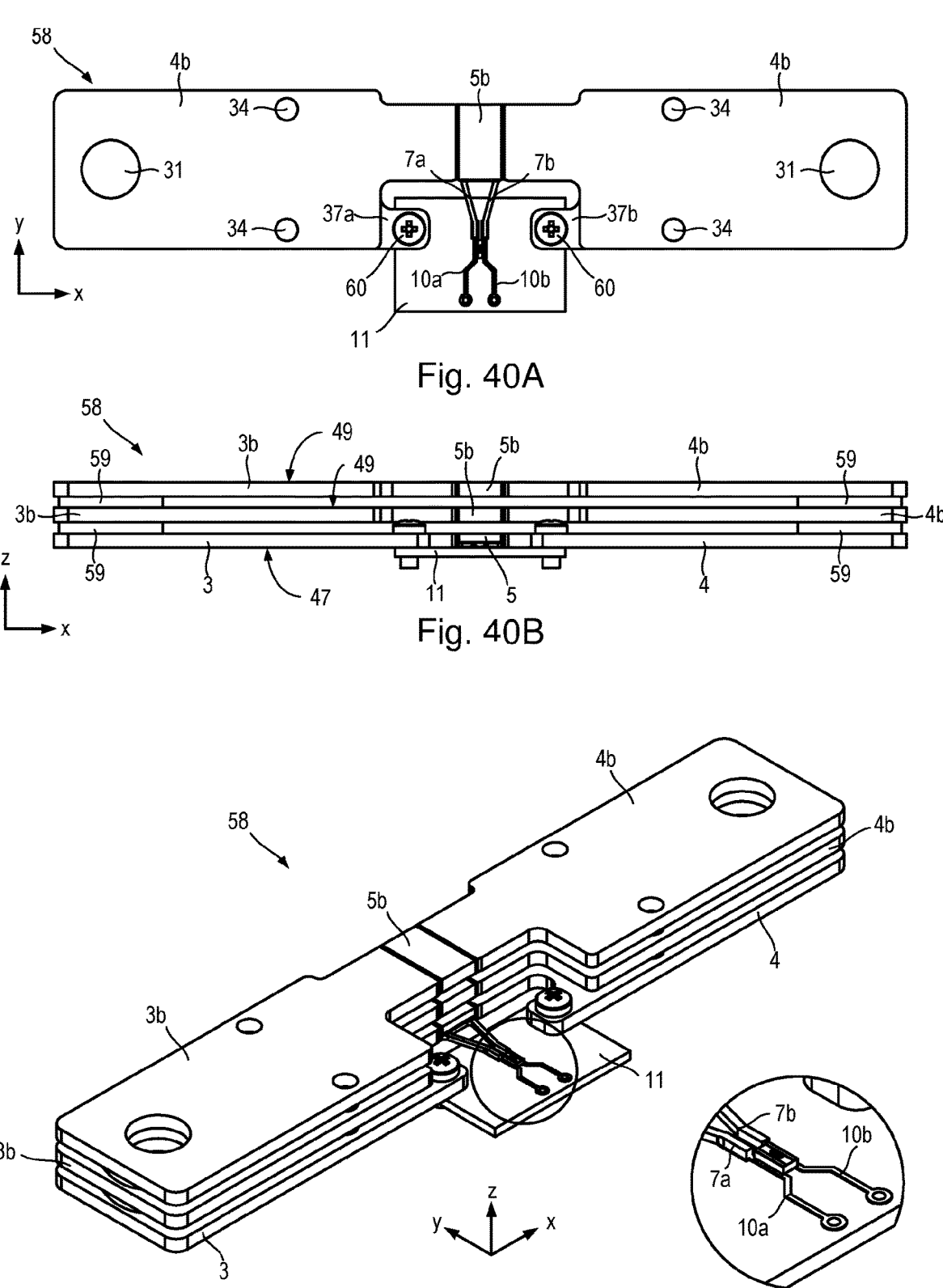
FIG. 40A is a schematic plan view of a fourth stacked busbar connector.
FIG. 40B is a schematic side view along a width direction.
FIG. 40C is a schematic projection view.

Referring also to FIGS. 40A to 40C, a fourth stacked busbar connector 58 is shown.

FIG. 40A is a plan view, FIG. 40B is a side view along the width direction (y-axis as illustrated), and FIG. 40C is a projection view.

The fourth stacked busbar connector 58 includes the fifth busbar connector 47, stacked in parallel with a pair of further busbar connectors 49. Each further busbar connector 49 is identical to the fifth busbar connector 47, except for omitting the connecting members 7a, 7b and protrusions 37a, 37b of the first and third parts 3, 4.

The busbar connectors 47, 49 are stacked along the thickness direction (z-axis as illustrated) and separated by washers 59. Washers 59 may be insulating, but are preferably conductive to facilitate even distribution of current $I_{load}$ amongst the busbar connectors 47, 49. The spacing provided by the washers 59 may help dissipate heat generated in the second parts 5, 5b. Mounting though-holes 34 on the fifth busbar connector 47 protrusions 37a, 37b are used to mount the substrate 11 using bolts 60. Other though-holes 33, 34 are aligned for all the busbar connectors 47, 49.

While not formed from a single net 51, 55 (or flat pattern), the fourth stacked busbar connector 58 may be more easily scaled to any number of further busbar connectors 49 (limited only by space constraints etc). In general, the fourth stacked busbar connector 58 may include any number of further busbar connectors 49 stacked in parallel with the busbar connector 47, as few as one and as many as can fit in available space. In this way, the maximum current capacity Imax may be expanded, while maintaining sensitivity and thermal isolation of the measurement of δV across the second part 5 of the busbar connector 47.

Fifth Stacked Busbar Connector

Figures 41A, 41B, 41C:
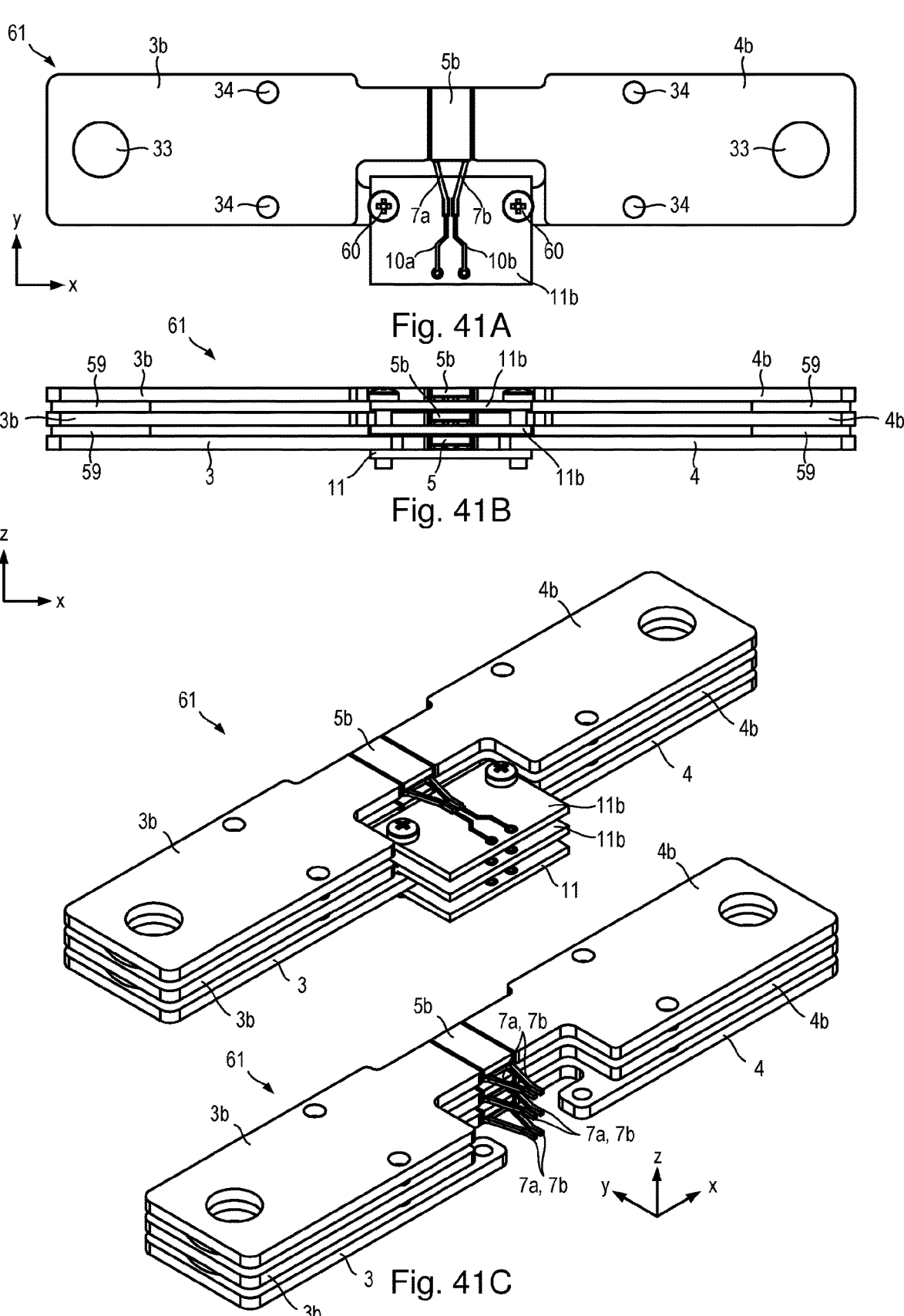
FIG. 41A is a schematic plan view of a fifth stacked busbar connector.
FIG. 41B is a schematic side view along a width direction.
FIG. 41C is a pair of schematic projection views with and without substrates.

Referring also to FIGS. 41A to 41C, a fifth stacked busbar connector 61 is shown.

FIG. 41A is a plan view, FIG. 41B is a side view along the width direction (y-axis as illustrated), and FIG. 41C shows projection views both with and without substrates 11, 11b.

The fifth stacked busbar connector 61 is the same as the fourth stacked busbar connector 58, except that each further busbar connector 49 is identical to the fifth busbar connector 47, except for omitting the protrusions 37a, 37b of the first and second parts 3, 4

The connecting members 7a, 7b of each further busbar connector 49 are coupled to respective substrates 11b supporting conductive elements 10a, 10b. In this way, the circuitry 12 may independently measure the part of current $I_{load}$ passing via each second part 5, 5b. This may be more accurate, in particular for larger numbers of further busbar connector 49, compared to assuming that the current I flowing via each second part 5, 5b is the same (as for the first to fourth stacked busbar connectors 50, 54, 57, 58). The substrates 11, 11b are preferably all identical.

In a modification, some but not all of the further busbar connectors 49 may include connecting members 7a, 7b connected to a substrate 11b for monitoring with circuitry 12. For example, in a larger stack, every other busbar connector 47, 49 may be monitored for current measurements.

In a modification, all of the further busbar connectors 49 may further include protrusions 37a, 37b.

Integrated DC Electrical Meter

Referring also to FIG. 42, a DC electrical meter 62 is shown.

The DC electrical meter 62 includes a current sensor 1, 1b and a controller 63 connected to the circuitry 12 of the current sensor 1, 1b by a link 64. Link 64 may be wired or wireless. While FIG. 42 illustrates a seventh busbar connector 65 generally in accordance with fifth busbar connector 47, any of the busbar connectors 2, 24, 39, 44, 47, 48 or stacked busbar connectors 50, 54, 57, 58, 61 (or variants thereof) may be used in the current sensor 1, 1b.

The seventh busbar connector 65 differs from the fifth busbar connector 47 in that the respective free ends 66a, 66b of the first and third parts 3, 4 are each curved around by 90° so that the seventh busbar connector 65 is generally U-shaped in a plan view. Any of the busbar connectors described herein may be modified to have the same U-shape plan as the seventh busbar connector 65.

Optionally, the DC electrical meter 62 may further include one or more further current sensors 1, 1b, each connected to the controller 63 via a respective wired or wireless link The DC electrical meter 62 may be mounted on the ground part of a monitored/metered load. For example, one end of the busbar connector 2 may be connected to ground, i.e. at 0 volts potential. Alternatively, the DC electrical meter 62 may be connected on the high voltage side of the monitored/metered load, and the voltages may be 200 VDC, 600 VDC, 1,000 VDC, 1,500 VDC, or greater. The DC electrical meter 62 will additionally measure the voltage difference which is combined with the current $I_{load}$ measurements discussed herein to calculate power.

The controller 63 is configured to record a respective energy consumption corresponding to each current sensor 1, 1b. The controller 63 may also record other information including without limitation, one or more of a total charge delivered via each current sensor 1, 1b, and/or energy charge consumption as a function of time. The controller 63 also receives, whether from the circuitry 12 or from a separate sensor, a measurement of the voltage $V_{load}$ across the monitored/metered load, which is used in calculations of power and energy. The controller 63 may take the form of a suitably programmed microcontroller, a field programmable gate array, an application specific integrated circuit, or other similar means.

The controller 63 and the one or more current sensors 1, 1b are preferably supported within a single package providing the DC electrical meter 62, for example a single casing, or similar.

Optionally, any or all of the current sensors 1, 1b may also include one or more temperature sensors 32. The circuitry 12 may then be configured to monitor temperature(s) and to perform temperature dependent sensitivity corrections to measured currents $I_{load}$ based on measured temperatures. Alternatively, the circuitry 12 may simply report temperature measurements to the controller 63, and the controller may implement the temperature dependent sensitivity corrections. The temperature sensors 32 may be located on any part of the first, second and/or third parts 3, 4, 5, though in general it is expected to be enough to include a first temperature sensor 32 arranged to measure a temperature of the first part 3 and a second temperature sensor 32 arranged to measure a temperature of the second part 4. Since the most important region is the boundary with the second part 5, temperature sensors 32 may preferably be located close to the second part 5. Temperature sensors 32 may include, or take the form of, thermistors or isolated thermocouples.

Distributed DC Electrical Meter

In a non-illustrated modification of the DC electrical meter 62, some or all of current sensors 1, 1b may be packaged separately and installed apart from the DC electrical meter (which still includes at least the controller 63). Each current sensor 1, 1b will remain coupled to the DC electrical meter 62 by a respective wired or wireless link 64.

This option may be useful for keeping the DC electrical meter 62 and the controller 63 thereof further from the seventh busbar connector 65, where there may be reduced electromagnetic interference. The distributed option may also be preferably when it is desired to monitor a large and/or widely spaced set of current sensors 1, 1b. For example, current sensors 1, 1b may monitor energy provided to a set of electric vehicle recharging points, which are necessarily spaced quite far apart.

Fabrication of Busbar Connectors

Busbar connectors described herein may be fabricated using any known methods.

One exemplary method is illustrated with reference to FIGS. 43A to 43D.

Firstly, a feedstock 67 is received which includes a first region 68 connected to a third region 69 via a second region 70. For example, the first region 68 may be welded to the second region 70, which may in turn be welded to the third region 69.

In the FIG. 43A illustration of FIG. 43A, the feedstock 67 takes the form of a roll 71, but alternatively the feedstock 67 may take the form of flat strips or plates, or even pre-cut "blanks" already having an outer perimeter corresponding to the final busbar connector shape. The first region 68 will form one or more first parts 3, 3b, the second region 70 will form one of more second parts 5, 5b, and the third region 69 will form one or more third parts 4, 4b.

The busbar connector(s) 2, 24, 39, 44, 47, 48, 49 are then formed by removing material from the feedstock 67 to form the first and third parts 3, 3b, 4, 4b, and the main body 6 and connecting members 7a, 7b of second parts 5, 5b. The material removal may take place in one or more steps, for example performed by different stations of a production line. If the feedstock 67 is used to define multiple busbar connector(s) 2, 24, 39, 44, 47, 48, 49, at least one station will involve dividing off the individual busbar connector(s) 2, 24, 39, 44, 47, 48, 49.

The same processing may also be used to produce nets 51, 55 for folding into busbar connectors 50, 54, 57, and the production line may further include stations for deforming and folding the nets 51, 55 (or flat patterns). Depending on the layout of the net 51, 55, a modified feedstock 67 may be needed. For example, net 55 for folding into the second stacked busbar connector 54 could be produced using the feedstock of FIG. 43A, whereas the net 51 for folding into the first stacked busbar connector 50 would need a modified feedstock.

Preferably, material is removed from the feedstock 67 by a shearing process such as, for example, stamping, die-cutting and fine blanking. These techniques are particularly well suited to high throughputs, and may be implemented as a roll-to-roll process using patterned rollers.

Additionally and/or alternatively, material may be removed from the feedstock 67 by one or more of a laser cutting process, a mechanical milling process, and a spark erosion (electrical discharge machining) process, or any other suitable method for selective material removal.

When the method of thinning connecting members 7a, 7b described in relation to FIGS. 31 to 32C is used, a production line will also include a station for compressing the protrusion 42 to form the reduced thickness region 43.

Intermediate steps for an example of a four station process production line shall be described with reference also to FIGS. 43B to 43D.

Referring in particular to FIG. 43B, a first stamping station receives feedstock 67 in the form of a roll 71 or plate, and punches through-holes 33, 34 and cut-outs 35, 36, generally defining shapes of first parts 3 and third parts 4 connected along edges 28, 29 (which will be formed on severing along boundary regions 72), and also defining single pieces 41 of material and corresponding protrusions 42. Although boundary regions 72 are shown as dashed lines in FIGS. 43B to 43D, in practice boundary regions 72 will have a finite width to allow for material loss during a final stage of separating off individual busbar connectors 2, 24, 39, 44, 47, 48, 49.

While not shown in FIG. 43B, the first stamping station (and/or any subsequent stations) may also impress and/or punch out one or more registration marks (not shown) for use in alignment by subsequent processing stations.

Referring in particular to FIG. 43C, a second stamping station compresses the protrusions 42 to form reduced thickness regions 43 and main bodies 6.

Referring in particular to FIG. 43D, a third stamping station punches out the excess material from the reduced thickness region 43 to leave behind the first and second connecting members 7a, 7b.

Finally, a fourth station shears, punches, saws or otherwise severs the individual busbar connectors 2, 24, 39, 44, 47, 48, 49 by removing boundary regions 72. As already mentioned, in a practical process, boundary regions 72 will have finite width.

Although a specific process is illustrated in FIGS. 43B to 43D, it shall be apparent how this may be modified and/or expanded to produce any of the busbar connectors 2, 24, 39, 44, 47, 48, 49 and/or nets 51, 54 described herein (or described variants thereof).

Modifications

It will be appreciated that various modifications may be made to the embodiments hereinbefore described. Such modifications may involve equivalent and other features which are already known in the design, manufacture and use of electricity meters and component parts thereof and which may be used instead of or in addition to features already described herein. Features of one embodiment may be replaced or supplemented by features of another embodiment.

The first and/or second connecting member 7a, 7b may additionally include one or more protrusions, for example fins, spines or other structures suitable for increasing the surface area to volume ratio. This may help to further equilibrate temperatures between the distal ends 9a, 9b by promoting surface heat losses to the surroundings. When such protrusions are included, they may make it harder to evaluate the conditions based on ratios of maximum widths max($w_1$), max($w_2$) to path lengths $s_1$, $s_2$. However, such protrusions will not interfere with the conditions expressed in terms of relative thermal resistances. Alternatively, protrusions/fins/spines/etc which will evidently have negligible effect on thermal resistance between the proximal 8a, 8b and distal ends 9a, 9b of connecting members 7a, 7b may simply be ignored for the purposes of evaluating maximum widths max ($w_1$), max ($w_2$).

Although claims have been formulated in this application to particular combinations of features, it should be understood that the scope of the disclosure of the present invention also includes any novel features or any novel combination of features disclosed herein either explicitly or implicitly or any generalization thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

The invention claimed is:

1. Apparatus comprising a DC electrical meter:

the DC electrical meter comprising a current sensor; or the DC electrical meter connected to the current sensor;

wherein the current sensor comprises:

a busbar connector comprising a first part connected to a third part via a second part, wherein a material forming the second part has a temperature coefficient of electrical resistance which is less than a temperature coefficient of electrical resistance of materials forming the first and third parts respectively;

wherein the second part comprises a main body integrally formed with first and second connecting members, each connecting member having a proximal end where it meets the main body and a distal end electrically coupled to a respective conductive element supported on a substrate and coupled to circuitry configured to measure a voltage between the first and second connecting members;

configured such that when a first temperature difference exists between the respective proximal ends of the first and second connecting members, a second temperature difference between the respective distal ends is less than or equal to 50% of the first temperature difference.

2. The apparatus of claim 1, wherein the first connecting member extends along a first path between the proximal and distal ends, the first path having a first length, wherein a first width of the first connecting member at each point along the first path is a largest dimension of the first connecting member perpendicular to the first path at that point, and wherein the first length is greater than or equal to three times a maximum of the first width along the first path;

wherein the second connecting member extends along a second path between the proximal and distal ends, the second path having a second length, wherein a second width of the second connecting member at each point along the second path is a largest dimension of the second connecting member perpendicular to the second path at that point, and wherein the second length is greater than or equal to three times a maximum of the second width along the second path.

3. The apparatus of claim 1, wherein a closest spacing between the first and second connecting members is less than a spacing of the respective proximal ends of the first and second connecting members.

4. The apparatus of claim 1, wherein:

a thermal bypass path having a bypass thermal conductance couples a region of the first connecting member to a region of the second connecting member without passing via the second part;

a first thermal path having a first thermal conductance runs via the first connecting member between the thermal bypass path and the proximal end of the first connecting member; and a second thermal path having a second thermal conductance runs via the second connecting member between the thermal bypass path and the proximal end of the second connecting member;

configured such that:

the thermal bypass path is electrically insulating;

the bypass thermal conductance is greater than the first thermal conductance; and the bypass thermal conductance is greater than the second thermal conductance.

5. The apparatus of claim 1, comprising a thermal jumper bonded to span between the distal ends of the first and second connecting members.

6. The apparatus of claim 1, wherein the first part is coupled to the second part by a first weld and the second part is coupled to the third part by a second weld;

wherein the proximal end of the first connecting member is as close as possible to the first part without overlapping a weld zone of the first weld;

wherein the proximal end of the second connecting member is as close as possible to the third part without overlapping a weld zone of the second weld.

7. The apparatus of claim 1, wherein the main body of the second part has a length along a first direction between the first and third parts, a width along a second direction, and a thickness along a third direction;

wherein the first and second connecting members have a thickness along the third direction which is less than the thickness of the main body.

8. The apparatus of claim 1, wherein the main body, the first connecting member and the second connecting member are formed from a single piece of material.

9. The apparatus of claim 1, wherein the busbar connector is U-shaped.

10. The apparatus of claim 1, wherein the busbar connector is straight.

11. The apparatus of claim 1, wherein the main body of the second part has a length along a first direction between the first and third parts, a width along a second direction, and a thickness along a third direction, and wherein the extension of the first and second connecting members away from the main body has a component parallel to the second direction;

wherein the first and third parts have a maximum width along the second direction which is large enough that neither of the first and second connecting members projects beyond the width of the first and third parts.

12. The apparatus of claim 1, further comprising one or more temperature sensors;

wherein the circuity is configured to perform temperature dependent sensitivity corrections to measured currents based on temperatures measured by the one or more temperature sensors.

13. The apparatus of claim 1, further comprising one or more further busbar connectors, each further busbar connector electrically connected in parallel with the busbar connector, and comprising a first part, a second part and a third part, wherein a material forming the second part has a temperature coefficient of electrical resistance which is less than materials forming the first and third parts respectively;
    wherein the second part of each further busbar connector comprises a main body having the same dimensions as the main body of the busbar connector.

14. The apparatus of claim 13, wherein the second part of at least one of the one or more further busbar connectors comprises first and second connecting members integrally formed with the respective main body and configured the same as the first and second connecting members of the busbar connector.

15. The apparatus of claim 1, wherein the current sensor is comprised by the DC electrical meter;
    wherein the DC electrical meter further comprises:
    one or more further current sensors, each further current sensor being the same as the current sensor; and
    a controller connected to the current sensor and each of the further current sensors and configured to record a respective energy consumption corresponding to each current sensor.

16. The apparatus of claim 1, wherein the DC electrical meter is connected to the current sensor, the apparatus further comprising:
    one or more further current sensors, each further current sensor being the same as the current sensor;
    wherein the DC electrical meter is connected to the current sensor and each of the one or more further current sensors via a respective wired or wireless link, and is configured to record a respective energy consumption corresponding to each current sensor.

17. An assembly comprising a first part, a second part and a third part, wherein a material forming the second part has a temperature coefficient of electrical resistance which is less than materials forming the first and third parts respectively;
    wherein the second part comprises a main body integrally formed with first and second connecting members, each connecting member having a proximal end where it meets the main body and a distal end, the connecting members configured such that when a first temperature difference exists between the respective proximal ends of the first and second connecting members, a second temperature difference between the respective distal ends is less than or equal to 50% of the first temperature difference.

18. The assembly according to claim 17, wherein a closest spacing between the first and second connecting members is less than a spacing of the respective proximal ends of the first and second connecting members.

19. The assembly according to claim 17, wherein the first connecting member extends along a first path between the proximal and distal ends, the first path having a first length, wherein a first width of the first connecting member at each point along the first path is a largest dimension of the first connecting member perpendicular to the first path at that point, and wherein the first length is greater than or equal to three times a maximum of the first width along the first path;
    wherein the second connecting member extends along a second path between the proximal and distal ends, the second path having a second length, wherein a second width of the second connecting member at each point along the second path is a largest dimension of the second connecting member perpendicular to the second path at that point, and wherein the second length is greater than or equal to three times a maximum of the second width along the second path.

20. A method comprising recording energy consumption corresponding to one or more loads using an apparatus that comprises a DC electrical meter, wherein the DC electrical meter comprises a current sensor, or the DC electrical meter is connected to the current sensor;
    wherein the current sensor comprises:
    a busbar connector comprising a first part connected to a third part via a second part, wherein a material forming the second part has a temperature coefficient of electrical resistance which is less than a temperature coefficient of electrical resistance of materials forming the first and third parts respectively:
    wherein the second part comprises a main body integrally formed with first and second connecting members, each connecting member having a proximal end where it meets the main body and a distal end electrically coupled to a respective conductive element supported on a substrate and coupled to circuitry configured to measure a voltage between the first and second connecting members;
    configured such that when a first temperature difference exists between the respective proximal ends of the first and second connecting members, a second temperature difference between the respective distal ends is less than or equal to 50% of the first temperature difference.

* * * * *